(12) United States Patent
Lapham

(10) Patent No.: US 12,030,396 B2
(45) Date of Patent: Jul. 9, 2024

(54) WIRELESS EQUIPMENT CONCEALMENT SYSTEM UTILIZING AN AERIAL MULTIMEDIA PLATFORM

(71) Applicant: James Troy Lapham, Pioneer, CA (US)

(72) Inventor: James Troy Lapham, Pioneer, CA (US)

(73) Assignee: PROJECT MANAGEMENT RESOURCE GROUP (PMRG) CORPORATION, Ava, MO (US)

( * ) Notice: Subject to any disclaimer, the term of this patent is extended or adjusted under 35 U.S.C. 154(b) by 59 days.

(21) Appl. No.: 17/088,444

(22) Filed: Nov. 3, 2020

(65) Prior Publication Data

US 2021/0261008 A1    Aug. 26, 2021

Related U.S. Application Data

(63) Continuation-in-part of application No. 16/436,705, filed on Jun. 10, 2019, now Pat. No. 10,821,846,
(Continued)

(51) Int. Cl.
| | |
|---|---|
| *B60L 53/14* | (2019.01) |
| *F21V 21/116* | (2006.01) |
| *H01Q 1/12* | (2006.01) |
| *H01Q 1/44* | (2006.01) |
| *H02J 7/00* | (2006.01) |

(Continued)

(52) U.S. Cl.
CPC ............. *B60L 53/14* (2019.02); *F21V 21/116* (2013.01); *H01Q 1/1242* (2013.01); *H01Q 1/44* (2013.01); *H02J 7/0042* (2013.01); *H02S 20/20* (2014.12); *H02S 99/00* (2013.01); *H04W 88/08* (2013.01); *H05K 5/0213* (2013.01); *H05K 5/0217* (2013.01)

(58) Field of Classification Search
CPC .............. H04Q 9/00; H04Q 2209/886; H04Q 2209/60; H04Q 2209/40
See application file for complete search history.

(56) References Cited

U.S. PATENT DOCUMENTS

| | | | | |
|---|---|---|---|---|
| 2,211,858 | A | * | 8/1940 | Martin ................... H01Q 1/103 74/29 |
| 2,415,103 | A | * | 2/1947 | Langstroth ............... H01Q 3/08 343/765 |

(Continued)

OTHER PUBLICATIONS

International Search Report and Written Opinion, PCT/US2014/066421, dated Feb. 12, 2015, 5 pages.

*Primary Examiner* — Timothy J Thompson
*Assistant Examiner* — Rhadames Alonzo Miller
(74) *Attorney, Agent, or Firm* — Dickinson Wright PLLC

(57) ABSTRACT

A system for providing analytics and operations on data collected from a plurality of smart poles, including a database, a smart pole agent residing on a smart pole, a REST API server, and a web portal. The database is configured to store vast amounts of data from environmental sensors installed on a plurality of smart poles. A REST API server fetches the data from the database. A web portal is provided to allow for viewing of the collected data and perform administrative operations, such as adding a smart pole, maintenance procedures, or other management functions.

5 Claims, 76 Drawing Sheets

Related U.S. Application Data which is a continuation of application No. 15/583,964, filed on May 1, 2017, now Pat. No. 10,321,591, which is a continuation-in-part of application No. PCT/US2014/066421, filed on Nov. 19, 2014.

(60) Provisional application No. 62/072,303, filed on Oct. 29, 2014.

(51) Int. Cl.
| | |
|---|---|
| *H02S 20/20* | (2014.01) |
| *H02S 99/00* | (2014.01) |
| *H04W 88/08* | (2009.01) |
| *H05K 5/02* | (2006.01) |

(56) References Cited

U.S. PATENT DOCUMENTS

| | | | | |
|---|---|---|---|---|
| 2,514,670 | A * | 7/1950 | Rabinowicz | H04B 1/08 455/170.1 |
| 2,583,210 | A * | 1/1952 | Edwards | H01Q 3/04 343/890 |
| 2,590,484 | A * | 3/1952 | Youhouse | H01Q 1/103 343/903 |
| 2,639,381 | A * | 5/1953 | Thompson | H01Q 1/08 343/890 |
| 2,695,957 | A * | 11/1954 | Cone | H01Q 1/103 343/903 |
| 2,781,668 | A * | 2/1957 | Berta | H01Q 1/103 343/903 |
| 2,838,953 | A * | 6/1958 | Cone | H01Q 1/103 343/903 |
| 2,870,973 | A * | 1/1959 | Carlson | H01Q 1/103 343/903 |
| 2,961,657 | A * | 11/1960 | Hodges | H01Q 9/30 455/92 |
| 2,989,259 | A * | 6/1961 | Youhouse | H01Q 1/103 242/397.1 |
| 3,016,206 | A * | 1/1962 | Cone | H01Q 1/103 226/93 |
| 4,041,498 | A * | 8/1977 | Freimark | H01Q 1/10 343/903 |
| 4,542,383 | A * | 9/1985 | Cusey | H01Q 1/103 343/903 |
| 4,591,868 | A * | 5/1986 | Cusey | H01Q 1/103 343/903 |
| 4,607,389 | A * | 8/1986 | Halgrimson | H04B 7/155 455/562.1 |
| 4,665,406 | A * | 5/1987 | Takizawa | H01Q 1/103 343/903 |
| 5,214,440 | A * | 5/1993 | Takahashi | H01Q 1/103 343/903 |
| 5,218,375 | A * | 6/1993 | Hillman | H01Q 1/103 343/903 |
| 5,243,355 | A * | 9/1993 | Emmert | H01Q 1/088 343/702 |
| 5,414,436 | A * | 5/1995 | Shinkawa | H01Q 1/103 343/903 |
| 5,570,103 | A * | 10/1996 | Tetsuka | H01Q 1/103 343/903 |
| 5,611,176 | A * | 3/1997 | Juengert | H01Q 1/1242 428/18 |
| 5,714,958 | A * | 2/1998 | Rudisill | H01Q 1/103 343/900 |
| 5,748,150 | A * | 5/1998 | Rudisill | H01Q 1/08 343/900 |
| 5,787,649 | A * | 8/1998 | Popowych | H01Q 1/44 52/651.07 |
| 5,859,622 | A * | 1/1999 | Phillips | H01Q 1/103 343/903 |
| 5,890,520 | A * | 4/1999 | Johnson, Jr. | G07F 7/02 705/413 |
| 6,131,349 | A * | 10/2000 | Hill | E04H 12/2261 343/890 |
| 6,222,503 | B1 * | 4/2001 | Gietema | H01Q 1/44 343/890 |
| 6,326,933 | B1 * | 12/2001 | Patachi | H01Q 1/244 343/702 |
| 6,343,440 | B1 * | 2/2002 | Ayers | H01Q 1/1242 52/651.07 |
| 6,393,341 | B1 * | 5/2002 | Lawrence | G06Q 30/04 710/72 |
| 6,446,408 | B1 * | 9/2002 | Gordin | E04H 12/182 52/745.18 |
| 6,694,698 | B2 * | 2/2004 | Ryan | H01Q 1/1242 52/741.1 |
| 7,372,428 | B1 * | 5/2008 | King | H01Q 3/08 343/912 |
| 8,410,931 | B2 * | 4/2013 | Petite | G08B 25/009 702/56 |
| 9,851,960 | B2 * | 12/2017 | Agostinacchio | G06F 8/61 |
| 2004/0080461 | A1 * | 4/2004 | Rothgeb | H01Q 1/424 343/720 |
| 2005/0045224 | A1 * | 3/2005 | Lyden | H02J 7/35 136/252 |
| 2005/0185398 | A1 * | 8/2005 | Scannell, Jr. | A01G 9/02 362/227 |
| 2006/0033674 | A1 * | 2/2006 | Essig, Jr. | F24S 23/715 343/915 |
| 2007/0095551 | A1 * | 5/2007 | Watson, III | H01Q 1/005 174/2 |
| 2008/0012784 | A1 * | 1/2008 | Renfro | H01Q 1/1242 343/890 |
| 2009/0073694 | A1 * | 3/2009 | Scannell, Jr. | F21S 6/002 362/253 |
| 2010/0127660 | A1 | 5/2010 | Cook et al. | |
| 2013/0173079 | A1 * | 7/2013 | Taira | H04L 12/2829 700/296 |
| 2018/0278091 | A1 * | 9/2018 | Fukasawa | H02J 13/00017 |
| 2019/0101411 | A1 * | 4/2019 | Davis | G01F 15/063 |
| 2020/0280771 | A1 * | 9/2020 | Hoang | G01D 4/002 |

\* cited by examiner

US 12,030,396 B2

WIRELESS EQUIPMENT CONCEALMENT SYSTEM UTILIZING AN AERIAL MULTIMEDIA PLATFORM

PRIORITY

This application is a continuation-in-part of U.S. application Ser. No. 16/436,705 filed Jun. 10, 2019, now U.S. Pat. No. 10,821,846, which is a continuation of U.S. application Ser. No. 15/583,964 filed May 1, 2017, now U.S. Pat. No. 10,321,591, which is a continuation-in-part application of Patent Cooperation Treaty application no. PCT/US2014/066421 filed Nov. 19, 2014, which claims the priority benefit of U.S. Provisional 62/072,303 filed Oct. 29, 2014, which are hereby incorporated by reference as if submitted in their entireties.

FIELD OF THE INVENTION

The present invention relates generally to wireless communication equipment casing. More specifically, the present invention is a wireless communication equipment casing that facilitates the accessibility to housed wireless communication equipment and the interchangeability of large sets of wireless communication equipment.

BACKGROUND OF THE INVENTION

The deployment of telecommunication equipment is continually increasing, and the concealment of mobile and fixed wireless devices is becoming increasingly difficult. Telecommunication devices however are a necessity as the devices generate widespread consumer need to send and receive large amounts of voice and data communication. Consequently, telecommunication carriers are continuously upgrading and installing new cellular transmission antenna sites. In order to select ideal antenna sites for the construction of high-rise antenna towers, telecommunication carriers must consult with local municipalities. The aesthetics of large antenna towers have become a difficult issue between telecommunication carriers and local municipalities given that antennas must be placed in locations close to the users of the corresponding data-demanding devices.

BRIEF DESCRIPTION OF THE DRAWINGS

The Figures described below depict various aspects of the systems and methods disclosed therein. It should be understood that each Figure depicts an embodiment of a particular aspect of the disclosed systems and methods, and that each of the Figures is intended to accord with a possible embodiment thereof. Further, wherever possible, the following description refers to the reference numerals included in the following Figures, in which features depicted in multiple Figures are designated with consistent reference numerals.

There are shown in the drawings arrangements which are presently discussed, it being understood, however, that the present embodiments are not limited to the precise arrangements and are instrumentalities shown.

The Figures depict preferred embodiments for purposes of illustration only. One skilled in the art will readily recognize from the following discussion that alternative embodiments of the systems and methods illustrated herein may be employed without departing from the principles of the invention described herein.

DETAILED DESCRIPTION OF THE INVENTION

All illustrations of the drawings are for the purpose of describing selected versions of the present invention and are not intended to limit the scope of the present invention.

The present embodiments may relate to, inter alia, systems and methods for providing an intelligent solution for providing a source to perform various analytics and operations on a vast amount of data collected from one or more sensors installed upon a smart pole. The intelligent solution, in some embodiments, may integrate many components to send, collect, and perform operations on the collected data. The solution may include a number of different and distinguishable components. For example, the components may include a smart pole agent, a REST API server, and a web portal.

It is an objective of the present invention to both effectively conceal antenna towers and maintain unencumbered transmission of radio signals. The present invention provides a multi-function solution that allows for the installation of antenna structures directly within population centers. The present invention is installable at new cellular transmission sites or in place of existing light poles and utility poles. In the preferred embodiment of the present invention, the data of the concealed communications equipment is routed underground where additional equipment is hidden while still able to transmit and receive data. Furthermore, the preferred embodiment of the present invention comprises environmentally friendly materials so that no chemicals will leach into the soil from the installation of the present invention.

Figure 1:
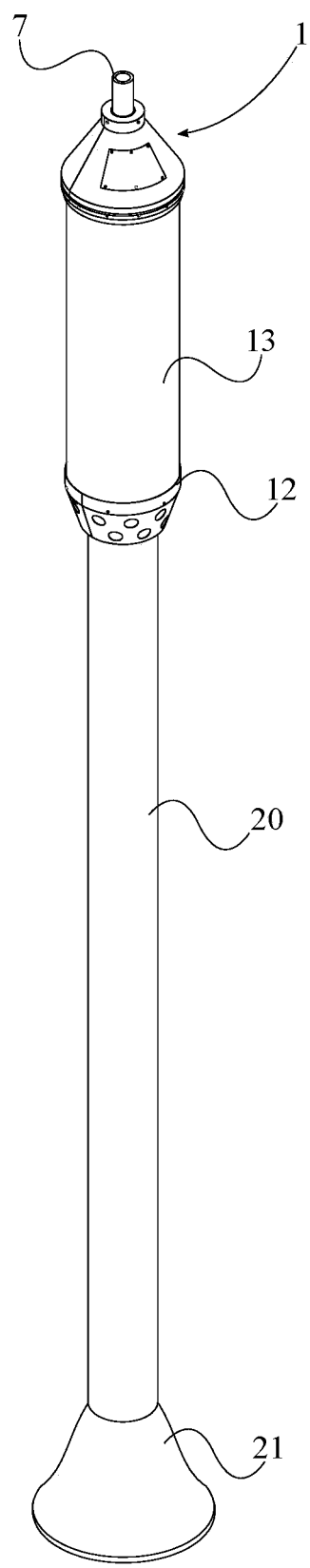
FIG. 1 is a perspective view of the present invention in a closed configuration.
Figure 3:
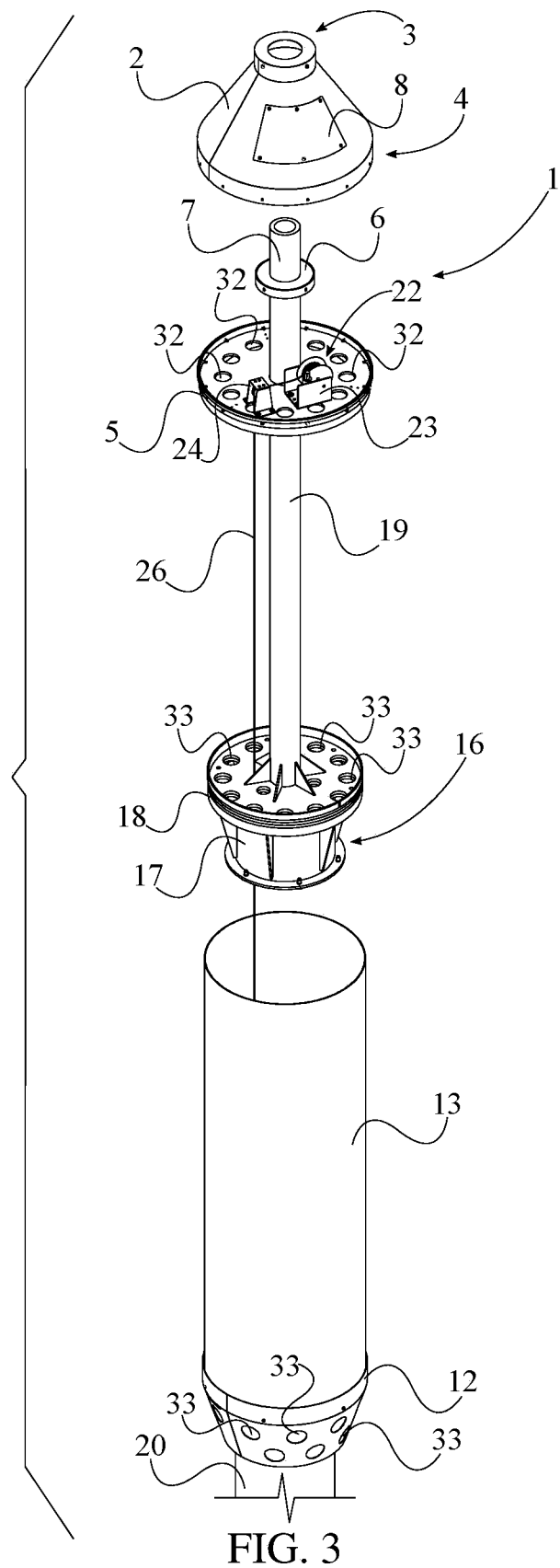
FIG. 3 is an exploded view of the upper capsule, the lower shroud, the tubular housing, the stopper, the mounting pole, and the support post of the present invention.
Figure 7:
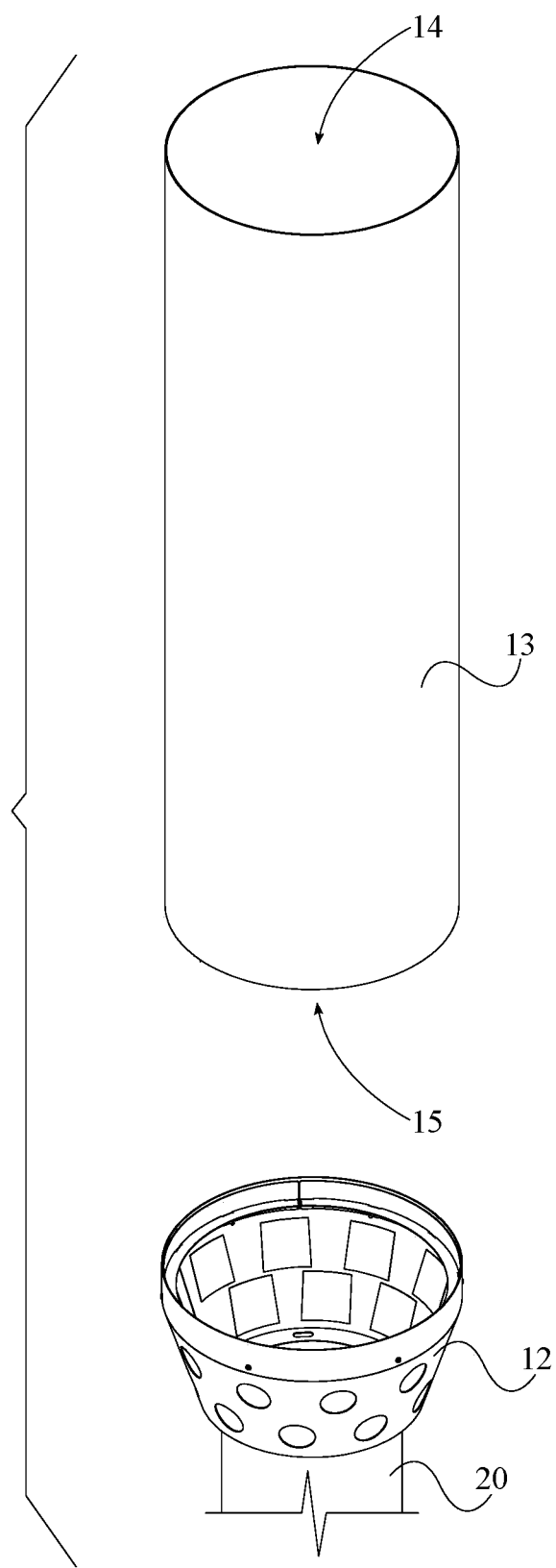
FIG. 7 is an exploded view tubular housing and the lower shroud of the present invention.

The present invention houses and protects vital wireless communication equipment, while permitting the unfettered transmission of radio signals. Wireless communication equipment no longer need to be mounted to existing streetlights, thereby preventing the unwanted visibility of the wireless communication equipment of nearby individuals. As shown in FIG. 1 and FIG. 3, the present invention comprises an upper capsule 1, a lower shroud 12, a tubular housing 13, a stopper 16, a mounting pole 19, a support post 20, and a pulley assembly 22. The upper capsule 1 houses a pulley assembly 22 and covers the tubular housing 13. The upper capsule 1 houses a microwave element that facilitates the backhaul of radio frequency (RF) data traffic. The microwave element housed within the upper capsule 1 is dependent on the data requirement of nearby users, preferably backhaul data requirements. The lower shroud 12 upholds the tubular housing 13. Both the upper capsule 1 and the lower shroud 12 provide ventilation to the wireless communication equipment concealed within the tubular housing 13. The tubular housing 13 conceals, houses, and protects wireless communication equipment from the surrounding environment of the present invention. The stopper 16 upholds the mounting pole 19 and wireless communication equipment and mounts the mounting pole 19 onto the support post 20. The mounting pole 19 serves as a platform to mount a variety of wireless communication equipment. The support post 20 elevates the mounted wireless communication equipment from the ground in order to maintain the signal transmission between the wireless communication equipment and the corresponding devices. The pulley assembly 22 lowers and raises the tubular housing 13 and the lower shroud 12 so that the wireless communication equipment within the tubular housing 13 is accessible for repair of replacement. In order for the tubular housing 13 to be both raised and lowered and allow the wireless communication equipment to be accessible, the tubular housing 13 comprises a first open end 14 and a second open end 15, as shown in FIG. 7. More specifically, the first open end 14 allows the wireless communication equipment to be accessible and the second open end 15 allows the tubular housing 13 to be raised and lowered along the support post 28.

The overall configuration of the aforementioned components allows for the concealment of wireless communication equipment while still maintaining easy accessibility of the wireless communication equipment. The support post 20 and the mounting pole 19 are positioned collinear to each other, which provides the overall structure for the present invention, as shown in FIG. 3. The stopper 16 is connected in between the support post 20 and the mounting pole 19 so that the mounting pole 19 does not slip into or fall off of the support post 20. In order to cover and protect the wireless communication equipment within the tubular housing 13, the upper capsule 1 is terminally mounted onto the mounting pole 19, opposite to the stopper 16, and is concentrically positioned around the support post 20. More specifically, the first open end 14 is oriented towards the upper capsule 1, and the lower shroud 12 is connected adjacent to the second open end 15. The lower shroud 12 is slidably mounted along the support post 20, consequently allowing the tubular housing 13 slide and both expose and conceal the wireless communication equipment mounted onto the mounting pole 19. The lower shroud 12 is able to securely slide about the support post 20 as the upper capsule 1 is tethered to the lower shroud 12 by the pulley assembly 22.

Figure 4:
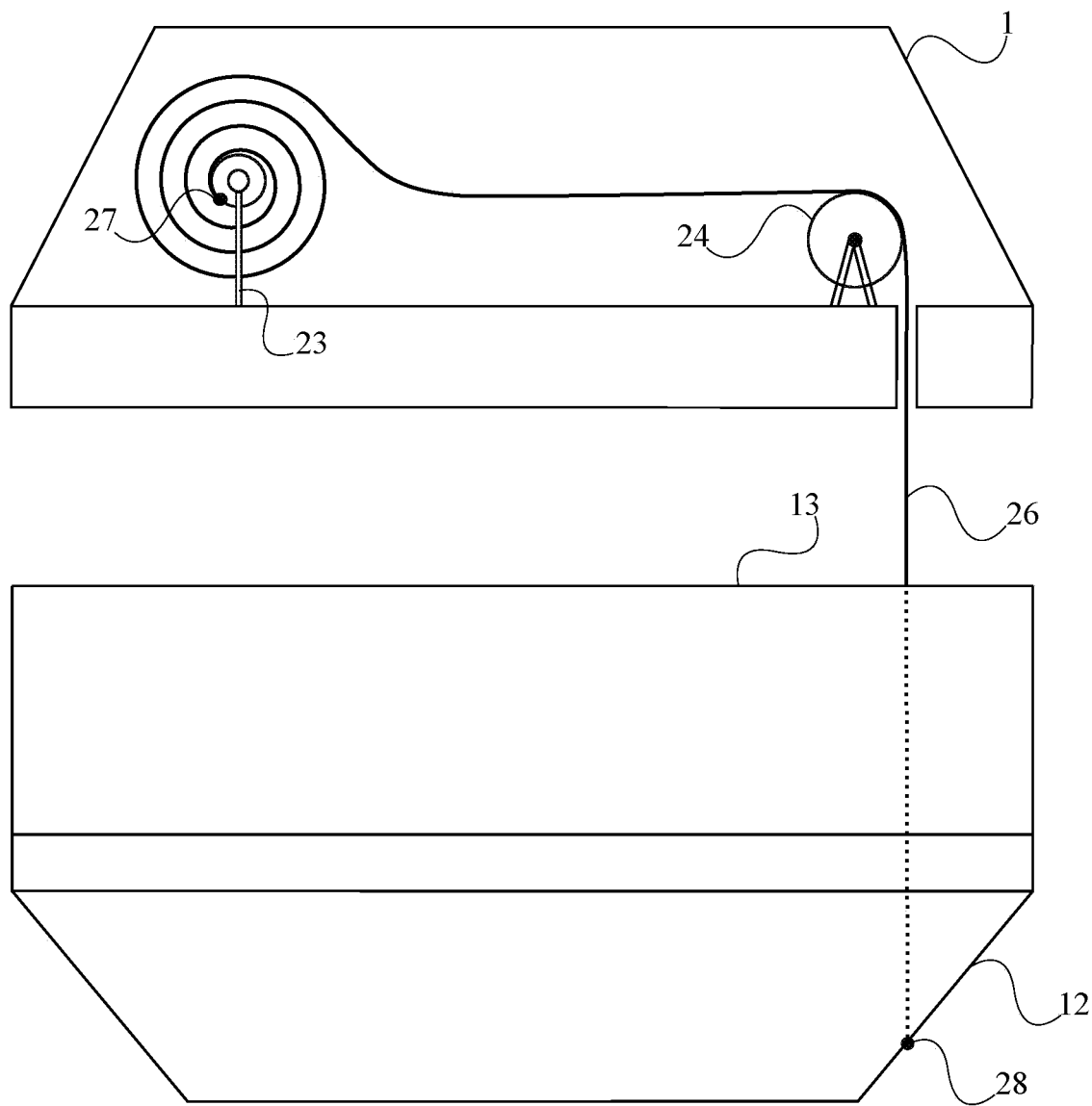
FIG. 4 is a schematic view of the upper capsule, the pulley assembly, and the lower shroud of the present invention.
Figure 6:
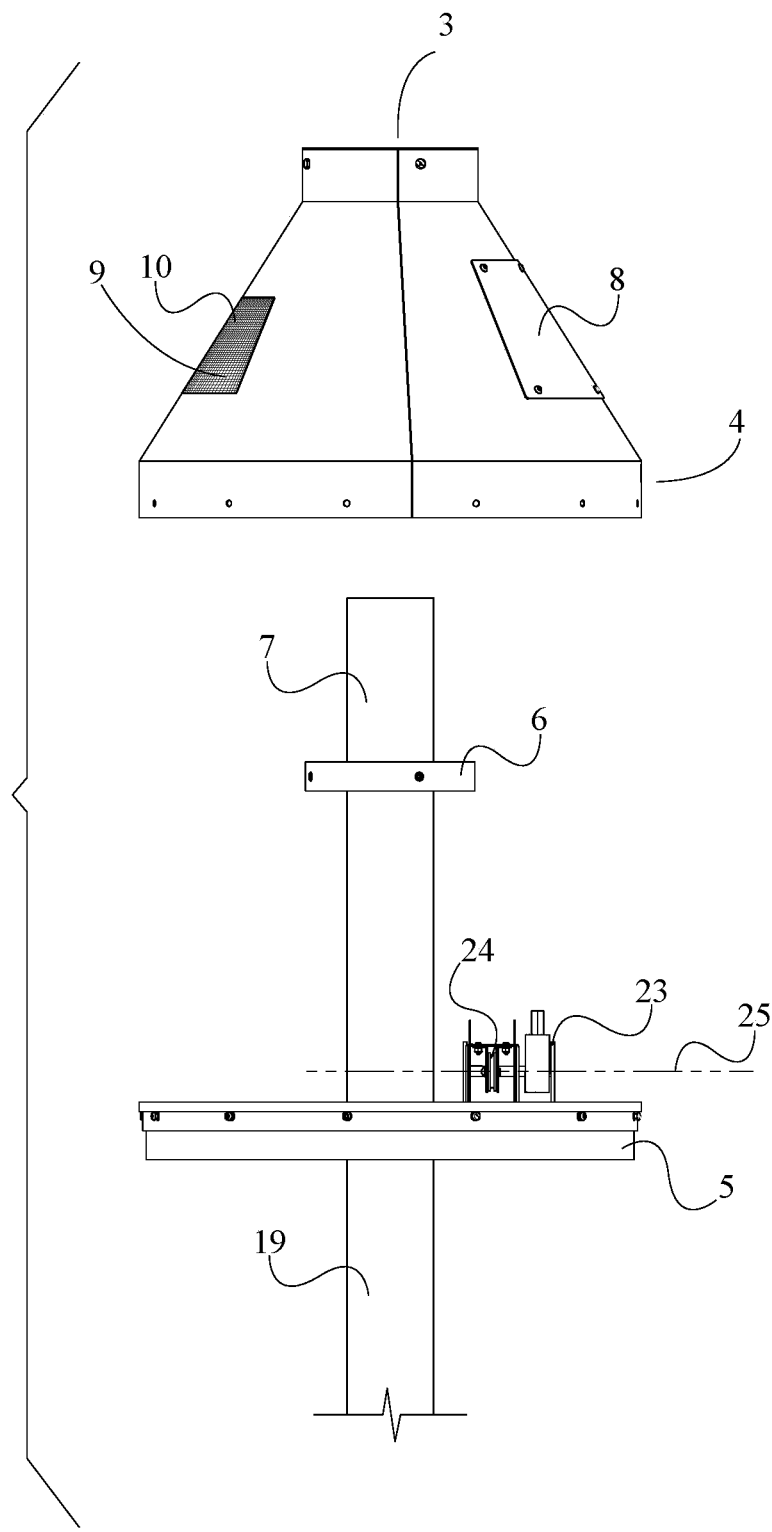
FIG. 6 is an exploded view of the upper shroud and the pulley assembly of the present invention.

In order for the pulley assembly 22 to safely raise and lower both the lower shroud 12 and the tubular housing 13, the pulley assembly 22 comprises a winch 23, a pulley 24, and a cable 26, as illustrated in FIG. 4. The winch 23 allows an individual to control the direction of movement of the lower shroud 12 about the support post 20. The pulley 24 guides the movement and the position of the cable 26. The cable 26 directly connects the upper capsule 1 to the lower shroud 12. The winch 23 and the pulley 24 are mounted within the upper capsule 1 as the upper capsule 1 remains stationary and the lower shroud 12 is slideable. The winch 23 and the pulley 24 are also positioned offset from each other to accommodate the sliding of the cable 26. As illustrated in FIG. 6, rotation axis 25 of the pulley 24 is oriented perpendicular to the mounting pole 19 as the cable 26 slides vertically into and out of the tubular housing 13. More specifically, the cable 26 is both tensionably engaged by the pulley 24 and traverses out of the upper capsule 1. In order to tether the upper capsule 1 to the lower shroud 12, a first end 27 of the cable 26 is fixed to the winch 23 and a second end 28 of the cable 26 is fixed to the lower shroud 12.

In order for the upper capsule 1 to be effectively mounted onto the mounting pole 19, the upper capsule 1 comprises a lateral wall 2, a base plate 5, a collar 6, and a support pole 7, as shown in FIG. 6. The lateral wall 2 surrounds the pulley assembly 22 and the microwave element. The lateral wall 2 comprises an apex end 3 and a base end 4 so as to deflect and precipitation, wind, and a variety of other environmental factors. In the preferred embodiment of the present invention, the lateral wall 2 is a truncated conical shape. The base plate 5 upholds the lateral wall 2, the pulley assembly 22, and the microwave element. The collar 6 provides a platform for which the lateral wall 2 may rest and covers the pulley assembly 22 and microwave element within the upper capsule 1. The support pole 7 positions the upper capsule 1 about the mounting pole 19. The support pole 7 is connected adjacent to the mounting pole 19 and is positioned collinear with the mounting pole 19 in order to structurally reinforce the upper capsule 1 onto the mounting pole 19. The base plate 5 is laterally connected around the support pole 7, adjacent to the mounting pole 19, and the collar 6 is laterally connected around the support pole 7, offset from the base plate 5. This arrangement encloses the upper capsule 1 and the components surrounded by the lateral wall 2. More specifically, the base end 4 is peripherally connected to the base plate 5 and the collar 6 is engaged by the apex end 3, which secures the positioning of the upper capsule 1 along the present invention.

Figure 5:
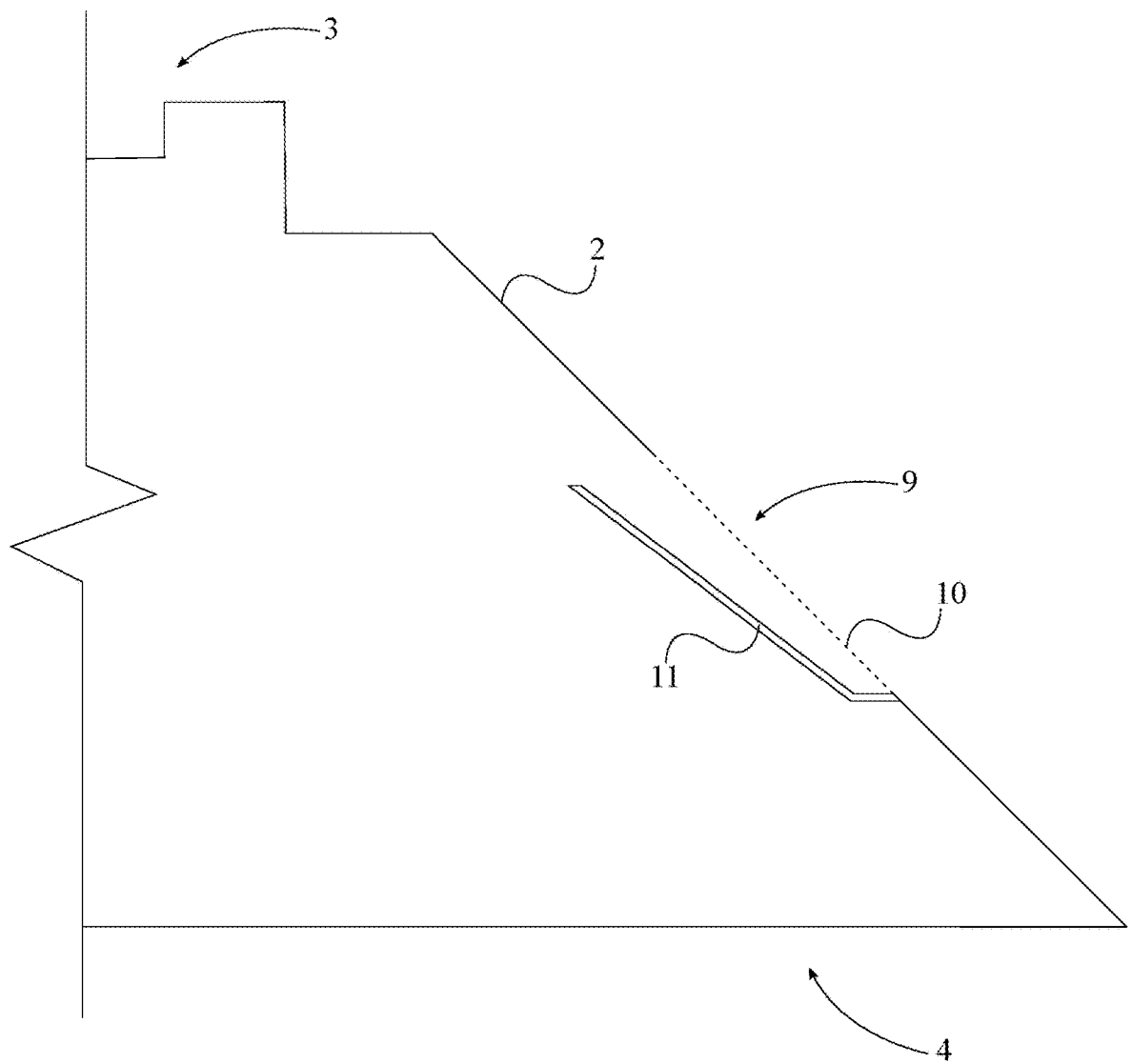
FIG. 5 is a schematic view of the ventilation hole, the air permeable cover, and the trough of the upper capsule for the present invention.

The pulley assembly 22 and the microwave element is accessible within the upper capsule 1 as the upper capsule 1 further comprises an access hatch 8. The access hatch 8 is operatively integrated into the lateral wall 2, wherein the access hatch 8 is used to access an interior of the upper capsule 1. The interior of the upper capsule 1 is sufficiently ventilated as the upper capsule 1 preferably comprises a ventilation hole 9 and an air-permeable cover 10. The ventilation hole 9 facilitates the movement of air into and out of the upper capsule 1. The air 1 permeable cover 10 limits any precipitation from entering the upper capsule 1. In order to encourage airflow within the upper capsule 1, the ventilation hole 9 traverses through the lateral wall 2. The air-permeable cover 10 is positioned onto the ventilation hole 9 and is perimetrically connected to the lateral wall 2 as to defer precipitation from entering into the upper capsule 1. In the event, precipitation passes through the air-permeable cover 10, the upper capsule 1 may further comprise a trough 11, as shown in FIG. 5. The trough 11 collects any excess precipitation that may enter through the air-permeable cover 10. The trough 11 is mounted within the lateral wall 2, adjacent to the ventilation hole 9, so that the trough 11 is able to immediately retain any liquid that leaks through the ventilation hole 9.

Figure 11:
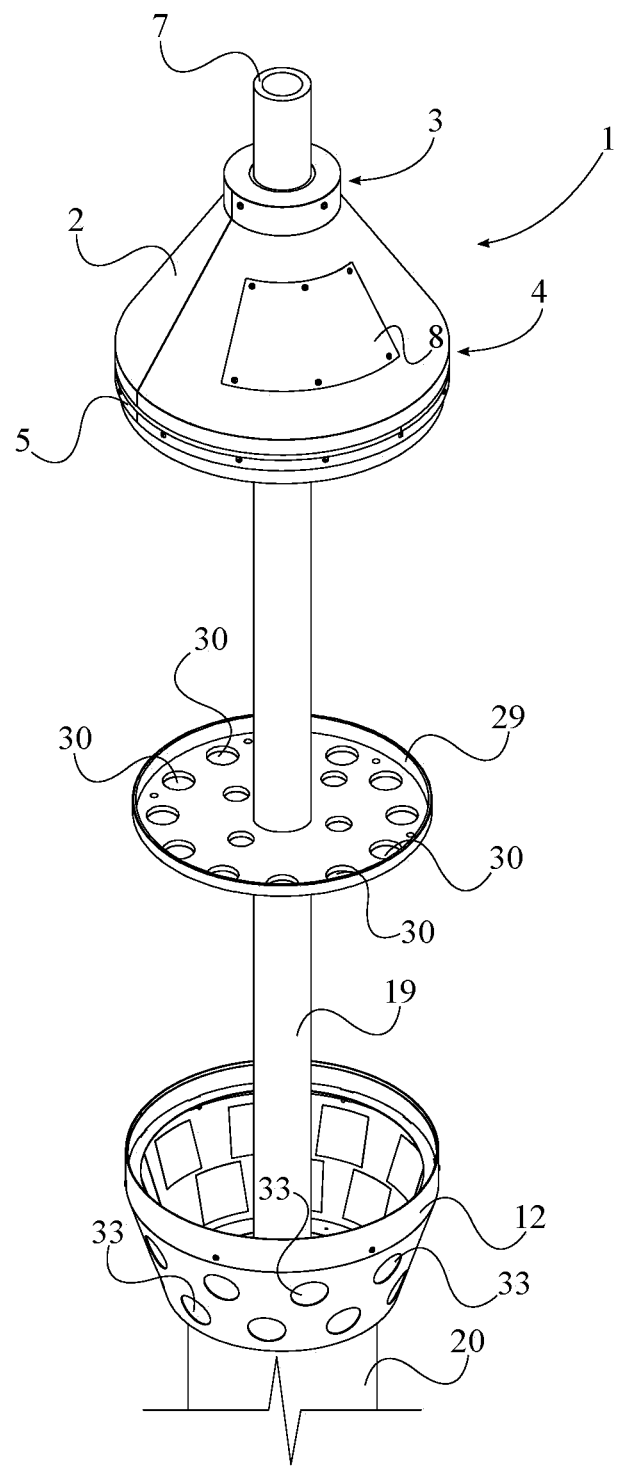
FIG. 11 is a perspective view of the present invention, wherein the mounting pole and at least one divider plate is exposed without the tubular housing.

The wireless communication equipment mounted within the tubular housing 13 may be organized by at least one divider plate 29, shown in FIG. 11. The at least one divider plate 29 separates the tubular housing 13 into at least two sections and provides more mounting surfaces for wireless communication equipment. The at least one divider plate 29 is laterally connected around the mounting pole 19. In the preferred embodiment of the present invention, a plurality of ventilation holes 30 traverses through the at least one divider plate 29. The plurality of ventilation holes 30 encourages airflow through each section of the tubular housing 13.

The upper capsule 1, the mounting pole 19, and the wireless communication equipment mounted onto the mounting pole 19 are effectively supported by the stopper 16 as the stopper 16 comprises an annular body 17 and a retention plate 18, illustrated in FIG. 3. The annular body 17 positions the retention plate 18 about the support post 20 as the annular body 17 is terminally connected around the support post 20. The retention plate 18 serves as a platform for the mounting pole 19 as the retention plate 18 is centrally positioned and adjacent to the mounting pole 19. The annular body 17 is peripherally connected to the retention plate 18 so that the support post 20 may be inserted into the annular body 17 and the stopper 16 is secured onto the support post 20.

Figure 8:
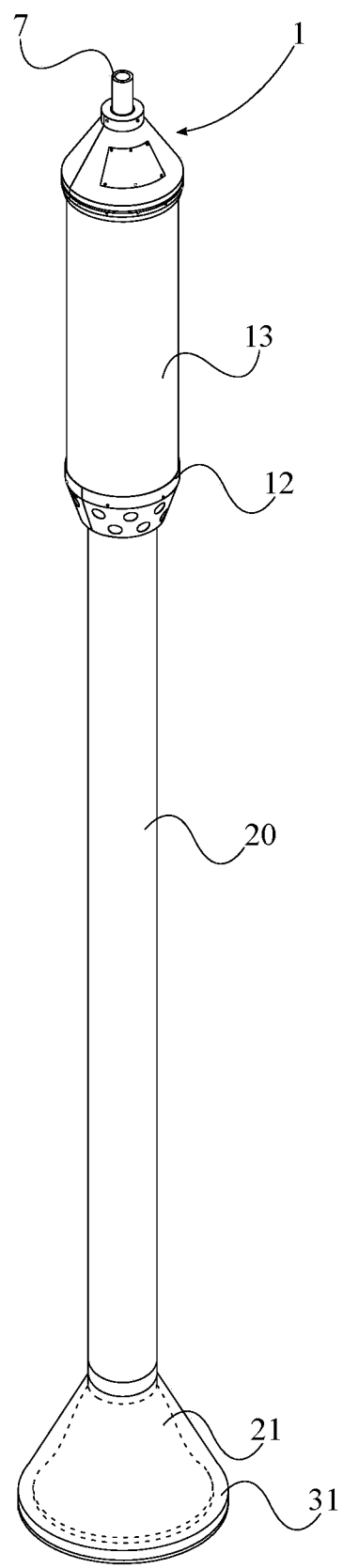
FIG. 8 is a perspective view of the present invention in a closed configuration, wherein the waterproof shroud is connected to the annular base.
Figure 10:
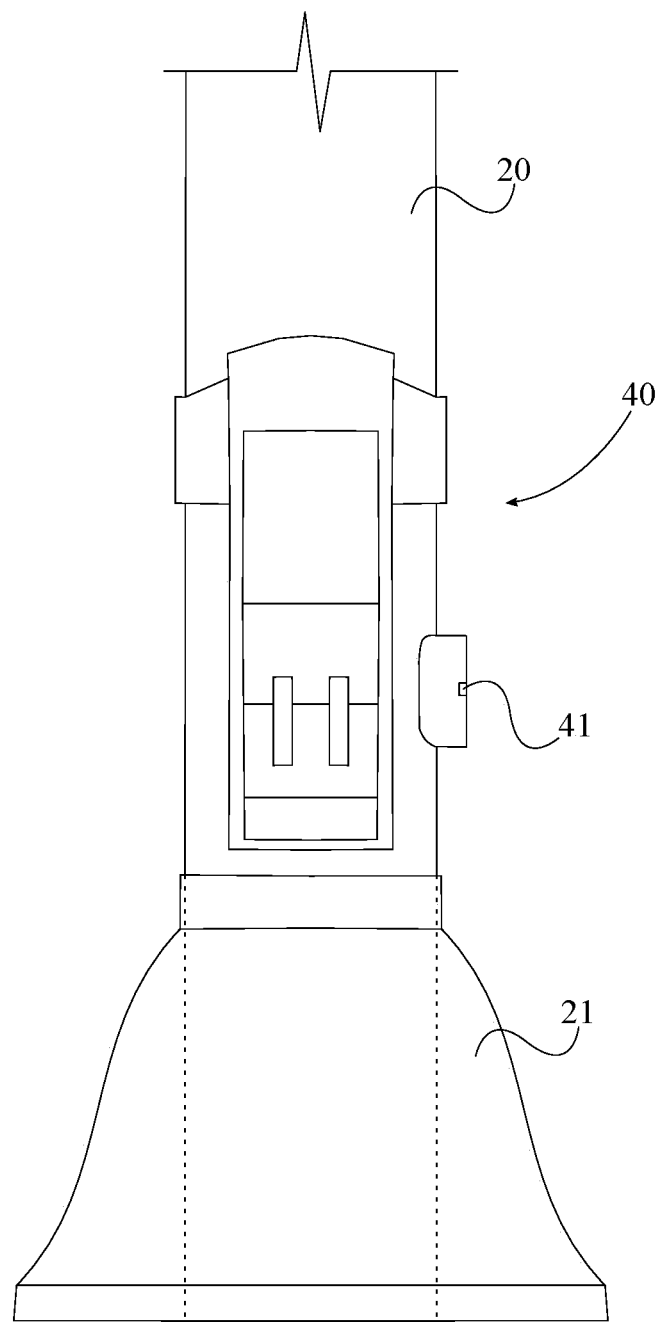
FIG. 10 is a front side view of the waterproof shroud of an embodiment of the present invention.
Figure 12:
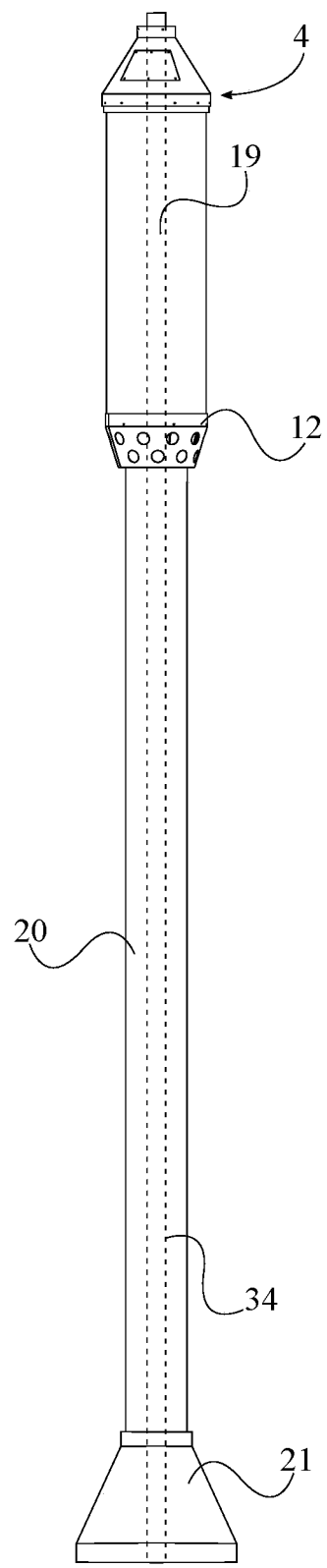
FIG. 12 is a front side view of the present invention in a closed configuration, wherein the wiring conduit traverses through the upper capsule, the mounting pole, and the support post.

In order for the support post 20 to be securely mounted into the ground, the support post 20 comprises an annular base 21, illustrated in FIG. 10. The annular base 21 reinforces the vertical alignment of the support post 20 with respect to the ground. The annular base 21 and the stopper 16 are positioned opposite to each other along the support post 20, as the stopper 16 upholds the mounting pole 19 above the ground. In order to effectively balance support post 20 and all the components above the support post 20, the annular base 21 is laterally connected around the support post 20. In the preferred embodiment of the present invention, a waterproof shroud 31 further protects the electrical connections and electrical devices housed within the ground beneath the present invention, as shown in FIG. 8. Consequently, the waterproof shroud 31 laterally connects around the annular base 21 as electrical connections from the wireless communication equipment extend into the ground and connect to a variety of electronic devices. Any additional electronic devices which may include power sources may be housed within a vault underground or a vault mounted on the ground adjacent to the support post 20. In the preferred embodiment of the present invention, a wiring conduit 34 positions and organizes the electrical connections between the wireless communication device and electronic devices. The wiring conduit 34 traverses through the upper capsule 1, the mounting pole 19, the stopper 16, and the support post 20, as shown in FIG. 12.

The wireless communication equipment and electrical connections housed within the present invention must not only be protected from the surrounding environment, but must also be properly maintained while housed within the present invention. As shown in FIG. 3, a first set of vents 32 and a second set of vents 33 ensure the proper ventilation and airflow within the upper capsule 1, the tubular housing 13, and the lower shroud 12. The first set of vents 32 traverses out of the tubular housing 13 and into the upper capsule 1. The second set of vents 33 traverses out of the tubular housing 13, through the stopper 16, and through the lower shroud 12. In an embodiment of the present invention, the first set of vents 32 and the second set of vents 33 may be covered with air-permeable covers as that of the ventilation hole 9 of the upper capsule 1. The arrangement of the first set of vents 32, the second set of vents 33, and the ventilation hole 9 of the upper capsule 1 maximizes the airflow within the present invention.

Figure 2:
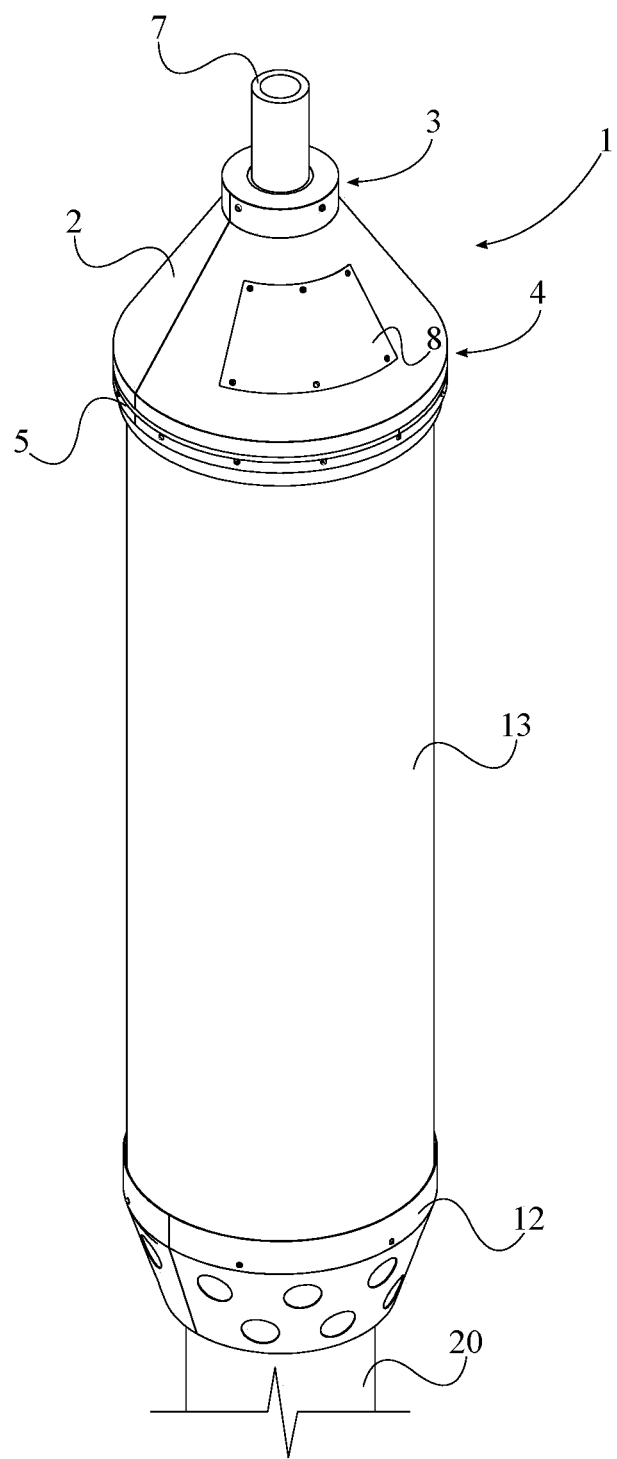
FIG. 2 is a perspective view of the upper capsule, the lower shroud, the tubular housing, and the support post of the present invention.

The present invention allows for the quick and easy access of the wireless communication equipment and the replacement of sets of communication equipment. When the upper capsule 1, the tubular housing 13, and the lower shroud 12 are in a closed configuration, as shown in FIG. 2, the tubular housing 13 is positioned against the upper capsule 1, and the lower shroud 12 is attached around the stopper 16. In the closed configuration, the wireless communication equipment within the tubular housing 13 is sealed and protected from surrounding environmental conditions. In order to access the wireless communication within the tubular housing 13, the lower shroud 12 is unfastened from the stopper 16, and the winch is engaged until the mounting pole 19 and the wireless communication equipment is exposed. When the upper capsule 1, the tubular housing 13, and the lower shroud 12 are in an open configuration, the tubular housing 13 is positioned offset from the upper capsule 1, and the lower shroud 12 is positioned offset from the stopper 16. The stopper 16 and the lower shroud 12 may be separated from the support post 20 while the upper capsule 1, the mounting pole 19, and the tubular housing 13 remain connected in the event all the wireless communication devices that are mounted onto the mounting pole 19 must be replaced. An upper capsule 1, a lower shroud 12, a tubular housing 13, a stopper 16, and a mounting pole 19 that house a new set of wireless communication devices may then be connected to the support post 20.

Figure 9:
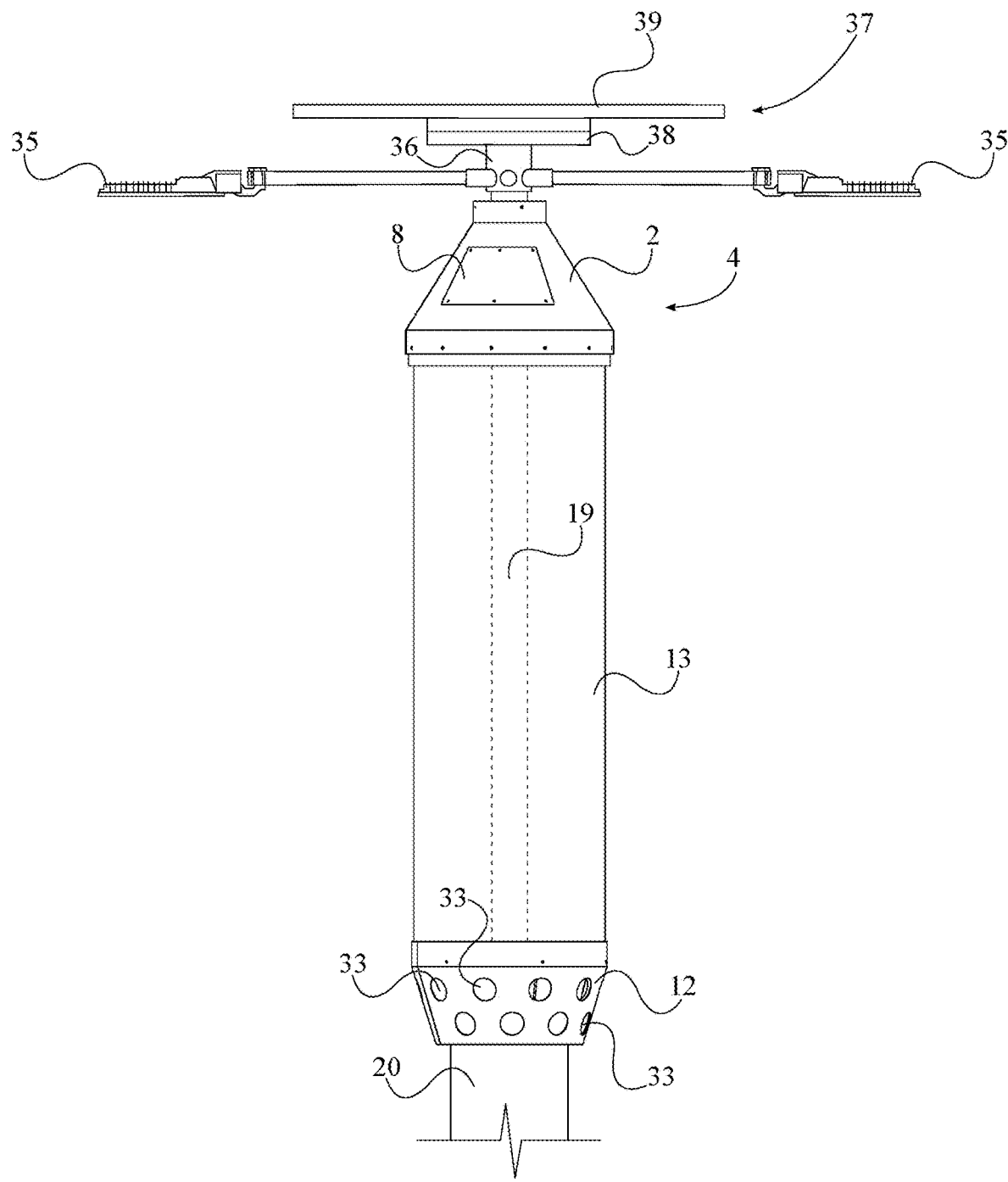
FIG. 9 is a front side view of the plurality of elongated lamps, the support hub, and the solar panel assembly in an embodiment of the present invention.

An alternate embodiment of the present invention comprises a plurality of elongated lamps 35 and a support hub 36, shown in FIG. 9. The plurality of elongated lamps 35 illuminates the surrounding area about the present invention. The support hub 36 connects the plurality of elongated lamps 35 onto the upper capsule 1. More specifically, the support hub 36 is mounted adjacent to the upper capsule 1, opposite to the mounting pole 19. In order to effectively maximize the illumination of the plurality of elongated lamps 35, the plurality of elongated lamps 35 is radially mounted around the support hub 36.

An alternate embodiment of the present invention comprises a solar panel assembly 37 in order to provide wireless communication equipment with additional power, as shown in FIG. 9. The solar panel assembly 37 comprises a support bracket 38 and at least one solar panel 39. The support bracket 38 upholds the at least one solar panel 39, and the at least one solar panel 39 captures sunlight and delivers the necessary power converted from the sunlight to the wireless communication equipment. The at least one solar panel 39 is positioned adjacent to the upper capsule 1, opposite to the mounting pole 19, so that the at least one solar panel 39 is not blocked from direct sunlight. More specifically, the at least one solar panel 39 is mounted onto the upper capsule 1 by the support bracket 38 so that the at least one solar panel 39 is secure.

An alternate embodiment of the present invention comprises an electric-vehicle charging module 40 as to provide power to connected electric vehicles, as shown in FIG. 10. The electric-vehicle charging module 40 comprises at least one outlet 41. The at least one outlet 41 allows an electric vehicle to be plugged into the electric-vehicle charging module 40 and harness the necessary power. The electric-vehicle charging module 40 is positioned along the support post 20, offset from the stopper 16, and is laterally integrated into the support post 20 so that drivers of electric cars may reach the at least one outlet 41.

In some embodiments, an intelligent solution may be provided. The intelligent solution may provide a source to perform various analytics and operations on a vast amount of data that may be collected from sensors on smart poles. The solution may integrate many components to send, collect, and perform operations on the data. The solution may include three distinguishable components: 1) a smart pole agent, 2) a REST API server, and 3) a Web portal.

In some embodiments a smart pole may include an assembly of various environment sensors and devices as set forth herein. A smart pole agent may reside on a pole and send sensor reading to a database, such as an Azure Cosmos database. The sensor readings may be sent using an Azure IoT hub, or the like. A REST API server may have a central role of fetching data from the database. Fetched data may be received through stream analytics and provided to a web portal for viewing by a user, such as an administrator. Additionally, or alternatively, the web portal may provide a smooth interface for using the data to generate various reports and deduce analytics from the data. The data may be displayed by the web portal in multiple states and organized in certain ways to make it fluid to perform operations on it. Various features may be provided, such as adding, editing, or whitelisting a pole.

Exemplary Computing Network Architecture

Figure 13:
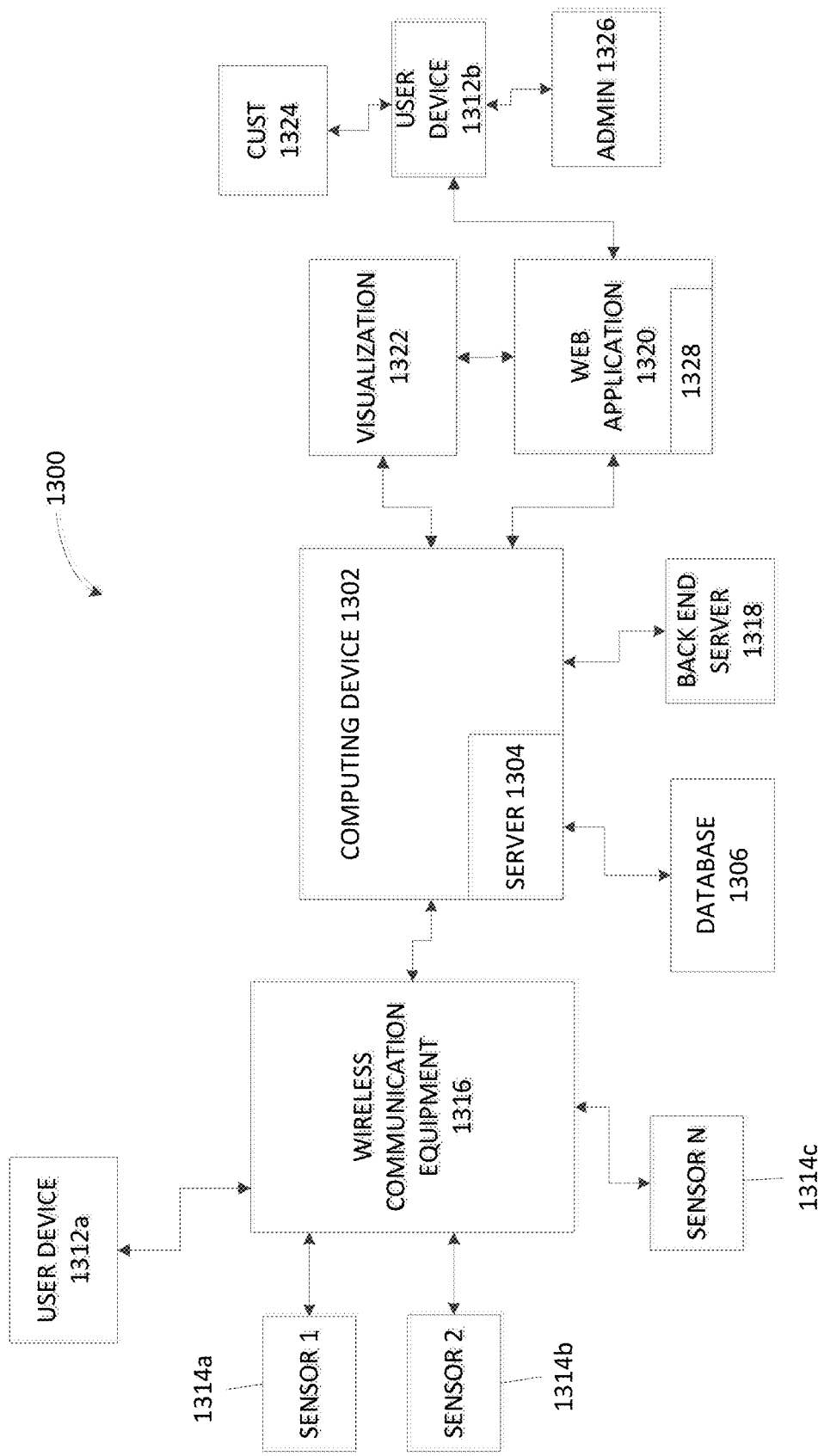
FIG. 13 illustrates an exemplary computing system in accordance with an exemplary embodiment of the present disclosure.

FIG. 13 illustrates a block diagram 1300 of an exemplary computing network architecture. In some embodiments, computing network architecture 1300 may include, for example, a cloud-computing architecture.

In one embodiment, sensor(s) 1314 communicate data to wireless communication equipment 1316. The data is then communicated to computing device 1302. Computing device 1302 then communicates data to database 1306 via database server 1304. The data may be stored in database 1306. Sensor(s) 1314 may have capability to communicate data to database 1306 via wireless communication equipment 1316, computing device 1302, and database server 1304 on regular or irregular time intervals in order to keep data stored in database 1306 up to date.

In another embodiment, customer users 1324 and/or administrator 1326 may communicate with computing device 1302 via web application 1320 from user device 1312 with a data request. Computing device 1302 receives request and searches database 1306 via database server 1304 for desired data. If found, database 1306 communicates data to computing device 1302 via database server 1304. Computing device 1302 may then communicate requested data to customer users 1324 and/or administrator 1326 via web application 1320 on user device 1312. In some embodiments, at least one visualization 1322 may be used within web application 1320 to communicate data from computing device 1302 to customer users 1324 and/or administrator 1326 on user device 1312. In any embodiment, multiple sets of wireless communication equipment 1316 may be in existence. Multiple sets of wireless communication equipment 1316 may or may not be in the vicinity of one another.

In some embodiments, after receiving data request from customer users 1324 and/or administrator 1326, computing device 1302 may be unable to locate updated data within database 1306. In such cases, computing device 1302 may communicate with wireless communication equipment 1316 to request that sensor(s) 1314 be employed to read and/or return updated data. Sensor(s) 1314 then may communicate updated data to wireless communication equipment 1316 which may then communicate the updated data to computing device 1302. Computing device 1302 may then communicate the updated data to database 1306 via database server 1304. Finally, computing device 1302 can search database 1306 via database server 1304 for requested data. Requested data may be sent to a customer 1324 via a user device 1312b, an administrator 1326 via a user device 1312b, or the like. In some embodiments, visualizations, or graphical user interfaces, may be provided via a web application 1320 to a user device 1312b. In some embodiments, as data is updated in database 1306, the updated data may be sent, or pushed, to a requesting device. For example, along with an initial request, a user 1324 may request to be updated if data changes. For example, a user may request to be updated on a periodic basis of one or more data elements that may be collected by sensors 1314a, 1314b, or 1314c. The periodic basis may be user-defined, such as daily, hourly, or the like, for example.

In other embodiments, computing device 1302 may be in constant communication with wireless communication equipment 1316 to request a steady relay of data from sensor(s) 1314. Types of data requests that may be requested in such embodiments may include, for example, a live-video stream provided by at least one of the sensors, real-weather data, or even equipment 1316 status including a series of status indicators corresponding to a series of components of the equipment as described herein.

In yet other embodiments, user device 1312 may be in direct contact with wireless communication equipment 1316. Direct contact between user device 1312 and wireless communication equipment 1316 may be established due to, for example, customer users 1324 and/or administrator 1326 being located in the vicinity of wireless communication equipment 1316 while in possession of user device 1312 such that wireless connectivity may be established between user device 1312 and wireless communication equipment 1316. Wireless connectivity may be established via wireless network. Wireless network may include, for example, a "5G" network, a near-field communications network, a short range wireless network, or the like.

Computing device 1302 may communicate with back end server 1318 to provide support to computing device 1302. Types of support may include, for example, on-boarding of wireless communication equipment 1316, maintaining and updating wireless communication equipment 1316 information and/or user device 1312 information, providing current-condition status of wireless communication equipment 1316, and serving data readings dumped by wireless communication equipment 1316, among others.

In some embodiments, back end server 1318 may provide access for computing device 1302 to other services. Other services may include, for example, "IOT Hubs", "Cosmos DB", "Stream Analytics", "AD", "Power BI", application services, or the like.

In some embodiments, web application 1320 may enable customer users 1324 and/or administrator 1326 to perform various analytics and operations on data accumulated from wireless communication equipment 1316. Additionally, or alternatively, web application 1320 may give customer users 1324 and/or administrator 1326 access to web portal 1328. Web portal 1328 may have additional capabilities which may include, for example, add on features for management of wireless communication equipment 1316, add on features for management of customer users 1324, add on features for creating customizable report(s), and add on features for dynamic camera streaming, among others. Customizable report(s) may include, for example, customizable "Power BI" report(s). Dynamic camera streaming may include, for example, streaming video on a video wall of web portal 1328. The video wall may have the capability to display different mesh views of video on the video wall.

As mentioned above, web portal 1328 may have add-on features for management of wireless communication equipment 1316. The add on management features may allow, for example, a listing of all sets of wireless communication equipment 1316 to be viewed, a new set of wireless communication equipment 1316 to be added to computing network architecture 1300, and/or modification to management data associated with one or more specific sets of wireless communication equipment 1316.

In any embodiment, sensor(s) 1314 may include weather sensors for monitoring, for example, temperature, humidity, wind speed, and/or rainfall amounts, among others, in the vicinity of wireless communication equipment 1316. Additionally, sensor(s) 1314 may include air quality sensors for monitoring, for example, the levels of CO, NO, and/or PM, among others, present in the vicinity of wireless communication equipment 1316. Further, sensor(s) 1314 may include noise sensors for monitoring, for example, minimum, maximum, and/or current noise levels, among others, in the vicinity of the wireless communication equipment 1316. Sensor(s) 1314 may also include at least one camera that may have capability to provide a live-stream video of the situation in the vicinity of wireless communication equipment 1316. Senor(s) 1314 may also include a light sensor.

Web Portal

As mentioned above, web portal 1328 may be accessible via web application 1320. Web portal 1328 may include numerous features. Such features are described in this section. Web portal 1328 may require certain technical equipment in order to be accessible. For example, web portal 1328 may only support certain internet browsers. Internet browsers that are supported by web portal 1328 may include, for example, "Google Chrome", "Microsoft Edge", "Mozilla Firefox", "Safari", "Internet Explorer", and standard mobile screen browsers.

Web portal 1328 may include authenticated and safe user sign-in. Authenticated and safe user sign-in may be implemented via a cloud computing service, for example, Microsoft® Azure® Active Directory, two-factor authentication methods, or the like.

Additionally, web portal 1328 may have support for multiple languages. Multiple-language support may be provided by, for example, Google® translator. Sections accessible within web portal 1328 may contain capability to translate displayed text into a plurality of languages.

Dashboard Interface

Web portal may also provide customer users 1324 and/or administrator 1326 access to a dashboard interface. Dashboard interface may display various types of information in various forms. Such forms of information display may include, for example, text, icon(s), map(s), picture(s), and video(s), among others.

Dashboard interface may display, for example, a map that shows that may show the location of at least one set of wireless communication equipment 1316 that may be mapped via the latitude and longitude of the at least one set of wireless communication equipment 1316. The latitude and longitude of the at least one set of wireless communication equipment 1316 may be measured via a global positioning system (GPS) sensor(s) installed on each of the at least one set of wireless communication equipment 1316. The map may mark the location(s) of the at least one set wireless communication equipment 1316 with at least one icon. The at least one icon may have unique designs and/or colors to indicate information related to the at least one set of wireless communication equipment 1316. The information related to the at least one set of wireless communication equipment 1316 may include, for example, connection status. Additionally, if customer users 1324 and/or administrator 1326 hover their cursor on any of the at least one icons pertaining to any of the at least one set of wireless communication equipment 1316, web portal 1328 may display the name of the specific set of wireless communication equipment 1316 in addition to the connection status of the specific set of wireless communication equipment, among other aspects.

Further, if customer users 1324 and/or administrator 1326 use the cursor to select any of at least one icon, data specific to the corresponding set of wireless communication equipment 1316 may be shown on the side of web portal 1328. In one embodiment, the data shown may include, for example, basic information, weather data, air quality data, noise data, and/or camera data, among others. Basic information may include, for example, the specific name, ID, type, and/or location, among others, of the set of wireless communication equipment 1316 that corresponds to the selected icon. Weather data may include, for example, temperature, humidity, wind speed, and/or rainfall, among others, in the vicinity of the set of wireless communication equipment 1316 that corresponds to the selected icon. Air quality data may include, for example, the various levels of different gases such as CO, NO, and/or PM, among others in the vicinity of the set of wireless communication equipment 1316 that corresponds to the selected icon. Noise data may include, for example, minimum, maximum, and/or current noise levels, among others, in the vicinity of the set of wireless communication equipment 1316 that corresponds to the selected icon. Camera data may include, for example, a live-stream of the situation in the vicinity of the set of wireless communication equipment 1316 that corresponds to the selected icon.

Dashboard interface may also display data pertaining to the geographic area that may be shown on the map. Such information may include, for example, the city and country being viewed on the map, the number of at least one set of wireless communication equipment 1316 that are currently connected and/or disconnected within a particular geographic area that is currently being viewed on the map, and the number of cameras that are currently connected and/or disconnected to the network of at least one set of wireless communication equipment 1316 within a particular geographic area that is currently being viewed on the map, among others. Dashboard interface 1316 may also include access to outside data source(s). Outside data source(s) may include databases that relay information related to, for example, traffic conditions. As an example, customer users 1324 and/or administrator 1326 may use a toggle switch on dashboard interface to display/hide an overlay of traffic conditions on the map. When the traffic conditions are toggled to "on", additional data such as, for example, information of public services and ambulance and police stations, among others, available within the vicinity of the geographic area shown on the map may also be displayed on the map.

Dashboard interface may also provide tools for filtering the at least one set of wireless communication equipment 1316 that may be displayed on the map. Such filtering tools may include, for example, a tool for filtering the at least one set of wireless communication equipment 1316 shown on the map by the types of sensor(s) that each of the at least one set of wireless communication equipment 1316 shown on the map has access to. For example, customer users 1326 and/or administrator 1326 could choose to have the map display only sets of wireless communication equipment 1316 that have access to a camera. In such a case, any of the at least one set of wireless communication equipment 1316 that have access to a camera would be shown on the map while any of the at least one set of wireless communication equipment 1316 that do not have access to a camera would not be shown on the map.

Dashboard interface may include selection tools to navigate to at least one other section of web portal 1328.

Pole Management

In some embodiments, web portal 1328 may include a section for managing at least one set of wireless communication equipment 1316. Equipment, or poles, to be managed may be viewed on a map on a graphical user interface display. The display may show a certain geographic area as defined by a user or via default selection, the area including a satellite photo or graphical map. The map may include indicators of equipment locations, such as via an overlay map. Additionally, or alternatively, the map may include an augmented reality overlaid on the map. Within the managing section, the at least one set of wireless communication equipment 1316 currently within the geographic area may be viewed on the map a list form. The section for managing the at least one set of wireless communication equipment 1316 may include additional capabilities. These additional capabilities may include, for example, sorting, searching, pagination, and/or filtering, among others.

The additional sorting capability may allow for the at least one set of wireless communication equipment 1316 displayed in a list form to be sorted according to at least one sorting criteria. Such sorting criteria may include, for example, the specific name, ID, type, location, connection status, and/or last time of connection, among others, of each of the at least one set of wireless communication equipment 1316 displayed in the list. Additionally, or alternatively, sorting criteria may be done in ascending/descending order. Sorting capabilities may be set by the system, an administrator, or defined by the user with respect to user preferences.

The additional searching capability may allow for searching for one or more of the at least one set of wireless communication equipment 1316 displayed in a list form based on at least one searching criteria. Such searching criteria may include, for example, the specific name, ID, type, location, connection status, and/or last time of connection, among others, of each of the at least one set of wireless communication equipment 1316 displayed in the list.

In some embodiments, additional pagination capability may allow for easier-navigation of the list of the at least one set of wireless communication equipment 1316. Such pagination capability may include, for example, displaying ten sets of wireless communication equipment 1316 per page in addition to providing tools for navigating to the next/previous page and the first/last page from any page within the list. Such pagination capability may also allow for manual entry of a page number such that any page within the list can be navigated to when starting at any other page within the list.

The additional filtering capability may allow for the at least one set of wireless communication equipment 1316 displayed in a list form to be filtered according to at least one filtering criteria. Such filtering criteria may include, for example, filtering based on what type(s) of sensor(s) that each of the at least one set of wireless communication equipment 1316 displayed in list form may contain. For example, customer users 1324 and/or administrator 1326 could choose to display on the list only sets of wireless communication equipment 1316 that have access to a camera. In such a case, any of the at least one set of wireless communication equipment 1316 included on the original list that have access to a camera would still be shown on an updated list while any of the at least one set of wireless communication equipment 1316 that do not have access to a camera would not be shown on the updated list.

The section for managing at least one set of wireless communication equipment 1316 may include additional action functions. Such actions functions may include, for example, action functions for editing, deleting, and/or activating, among others. The additional editing function may allow for details of the at least one set of wireless communication equipment 1316 displayed in a list form to be edited.

The additional deleting function may allow for at least one of the at least one set of wireless communication equipment 1316 displayed in a list form to be deleted from the list. When deleting at least one set of wireless communication equipment 1316 displayed in a list form from the list, the information corresponding to the at least one deleted set of wireless communication equipment 1316 may also be removed from the list. Upon indicating that at least one set of wireless communication equipment 1316 is desired to be deleted from the list, a warning message may be generated within web portal 1328 that may request a second indication that at least one set of wireless communication equipment 1316 should be deleted from the list. Upon successful deletion, communication may be displayed within web portal 1328 that may confirm deletion and may display the name of the at least one set of wireless communication equipment 1316 that was deleted.

The additional activation function may allow for activation of the at least one set of wireless communication equipment 1316 displayed in a list form. The at least one set of wireless communication equipment 1316 displayed in a list form may, for example, be indicated to be inactive. Such inactive indication may be seen, for example, where information pertaining to the connection status of each of the at least one set of wireless communication equipment 1316 may be displayed. Additionally, or alternatively, an inactive set of wireless communication equipment 1316 displayed in the list may be activated and/or whitelisted via selection tool(s).

In addition, if any of the at least one set of wireless communication equipment 1316 displayed in the list are selected, web portal 1328 may navigate to a details section that may display additional information that pertains to the specific set of the at least one set of wireless communication equipment 1316 that was selected.

Pole Details Section

In some embodiments, web portal 1328 may include a section that may display additional information pertaining to a selected set of wireless communication equipment 1316. This details section may include at least one subsection. The at least one subsection may include, for example, subsections for basic information, camera information, and sensor information. The details section may display the name of the selected set of wireless communication equipment 1316 in an information panel.

The basic information subsection may include, for example, information pertaining to the specific name and location of the selected set of wireless communication equipment 1316.

The camera information subsection may include, for example, information pertaining to the camera(s) that may be accessed by the selected set of wireless communication equipment 1316. Such camera information may include, for example, the name of the camera(s) in addition to the streaming URL.

The sensor information subsection may include, for example, information pertaining to the sensor(s) 1314 that the selected set of wireless communication equipment 1316 may have access to. Such sensor information may even be further sub-categorized according to, for example, sensor type. Within the sensor information subsection, there may be subsections pertaining to, for example, air quality sensor(s) information, noise sensor(s) information, and/or weather sensor(s) information, among others.

In some embodiments, the details section may include additional action capabilities such as cancelling, editing, or deleting. The additional cancelling capability may be used to navigate back to the list view of the at least one set of wireless communication equipment 1316 that are shown in list form. The additional deleting capability work may allow for the selected set of wireless communication equipment 1316 to be deleted from the list of at least one set of wireless communication equipment 1316.

The additional editing capability may be used to edit data pertaining to the selected set of wireless communication equipment 1316 and/or data pertaining to the sensor(s) 1314 that the selected set of wireless communication equipment 1316 has access to, among other uses. Some pieces of data that pertain to the selected set of wireless communication equipment 1316 and/or data pertaining to the sensor(s) 1314 that the selected set of wireless communication equipment 1316 has access to may have required fields of information. The additional editing capability may have a capability to save any, all, or no changes made to the information.

Smart Pole Addition

In some embodiments, within the section for managing at least one set of wireless communication equipment 1316, a capability may exist that allows for at least one additional set of wireless communication equipment 1316 to be added to the list of the at least one set of wireless communication equipment 1316 that are currently within the geographic area being viewed on the map. Such addition capability may allow for manual entry of information pertaining to the set of wireless communication equipment 1316 that may be added. Some information pertaining to the set of wireless communication equipment 1316 that may be added may be required.

Information pertaining to the set of wireless communication equipment 1316 that may be added may include, for example, basic information, camera information, and/or sensor information, among others.

The basic information subsection may include, for example, information pertaining to the specific name and location of the selected set of wireless communication equipment 1316.

The camera information subsection may include, for example, information pertaining to the camera(s) that may be accessed by the selected set of wireless communication equipment 1316.

The sensor information subsection may include, for example, information pertaining to the sensors that the selected set of wireless communication equipment 1316 may have access to. Such sensor information may even be further sub-categorized according to, for example, sensor type. Within the sensor information subsection, there may be subsections pertaining to, for example, air quality sensor(s) information, noise sensor(s) information, and/or weather sensor(s) information, among others.

User Management Section

In some embodiments, an "administrative" section may also exist within web portal 1328. The administrative section may display information pertaining to customer users 1324 and/or administrator, among others, who may be logged in to web application 1320. In some embodiments, a user, or administrator, may log in to the web portal via a web application. Alternatively, a user, or administrator, may access a web portal via a portable device application, such as a mobile app, or the like. Such information may include, for example, e-mail ID, address, and status for each of customer users 1324 and/or administrator 1326, among others, displayed. Such information may be displayed in a table format.

Video Section

In some embodiments, a section may exist within web portal 1328 in which viewing tools such as, for example, live video, may be accessed. Within the viewing tools section, video streams from any of the at least one set of wireless communication equipment 1316 displayed in list form may be viewed in a plurality of patterns. Some patterns may include, for example, viewing the stream of only a single camera at a time or viewing the streams of more than one camera at a time. When viewing the streams of more than one camera at a time, the separate streams may be configured in a plurality of arrangements within web portal 1328. In some embodiments, the viewing tools section may allow for video streams from a user-specified area to be displayed. For example, a user may define certain portions of an intersection to view vehicular traffic, pedestrian traffic, or the like, simultaneously. Additionally, or alternatively, a user may define one or more cameras to focus on a wider area, such as a skyline view for a sunrise or sunset.

Reports Section

In some embodiments, a section may exist within web portal 1328 in which reports may be generated based on specific information. The reports section may include a plurality of different data that can be put into a report. The data may be filtered according to, for example, date, time, identification tags, sensor devices, type of data, among others. The types of data that may be reported may include, for example, the number of sets of wireless communication equipment 1316 in a pre-defined list that may be connected and/or disconnected, the number of cameras that are connected and/or disconnected that are accessible by a number of sets of wireless communication equipment 1316 in a pre-defined list, the total number of sets of wireless communication equipment 1316 in a pre-defined list that are working, the number of hours that each set of wireless communication equipment 1316 in a pre-defined list is connected, weather data, air quality data, and/or noise data, among others. Data may be collected and/or reported as a function of time, among others.

Weather data may include, for example, temperature, humidity, wind speed, and/or rainfall, among others, in the vicinity of a set of wireless communication equipment 1316. Air quality data may include, for example, the various levels of different gases such as CO, NO, and/or PM, among others in the vicinity of a set of wireless communication equipment 1316. Noise data may include, for example, minimum, maximum, and/or current noise levels, among others, in the vicinity of a set of wireless communication equipment 1316.

The reports section may use different tools for displaying data. In some embodiments, any combination of, for example, "Doughnut chart", "Bar chart", "Shaded Bar chart", and/or line chart, among others, may be used. In any embodiment, any method of data display may also display additional information, such as, for example, a legend, chart label(s), chart title(s), and/or minimum/maximum values, among others. In some embodiments, the tools used for displaying data may have additional capabilities such as, for example, displaying chart values when hovering the cursor over an area on a bar chart or line chart and having a data toggle option that allows certain sets of data to be displayed on a chart(s) while other sets of data remain hidden, among others.

In any embodiment the report section may have tools embedded. Such tools may include, for example, a power BI component, among others.

Analysis Section

In some embodiments, a section may exist within web portal 1328 in which data processing and analysis may be conducted using virtual tools. The analysis section may include a tool for creating visual data representations. For example, customer users 1324 and/or administrator 1326 could use the analysis section, for example, to select a desired type of chart on which to display data. After selection of the chart type, certain data set(s) may be added/removed from the selected chart and/or certain data may be organized/categorized on the chart according to other parameters. Other parameters may include, for example, date, day of week, time stamp, or the like.

In some embodiments, the visual data representations may have additional capabilities such as, for example, displaying values when hovering the cursor over an area on the visual data representation. Data within the visual data representations may also be sorted according to parameters. Such sorting parameters may include, for example, date and/or data values, among others. Additionally, or alternatively, visualizations created in the analysis section may be resizable.

In some embodiments, the analysis section may also contain an assistance capability. In one embodiment, questions and/or commands may be entered directly into the assistance capability in text form using, for example, natural language. Upon entering the question and/or command, the web portal 1328 may run a task and output a result. An example result may include, for example, doughnut chart(s), bar chart(s), line chart(s), and/or other visual data representations, among others. Additionally, or alternatively, the analysis section may have tools embedded. Such tools may include, for example, a power BI component, among others.

Notification Capability

In some embodiments, a section may exist within web portal 1328 in which communication may be received. Communication may include, for example, notifications. Communication may give alert to changes made within web portal 1328. Changes may include, for example, addition, deletion, and/or activation, among others, of at least one set of wireless communication equipment 1316. In any embodiment, the communications section may include parameters to differentiate, for example new/unread communications from old/read communications.

Logout Capability

In some embodiments, a capability may exist within web portal 1328 that allows for termination of a session (e.g. logging out). Using the session-termination tool may allow for navigation to a login page.

Exemplary Client Computing Device

Figure 14:
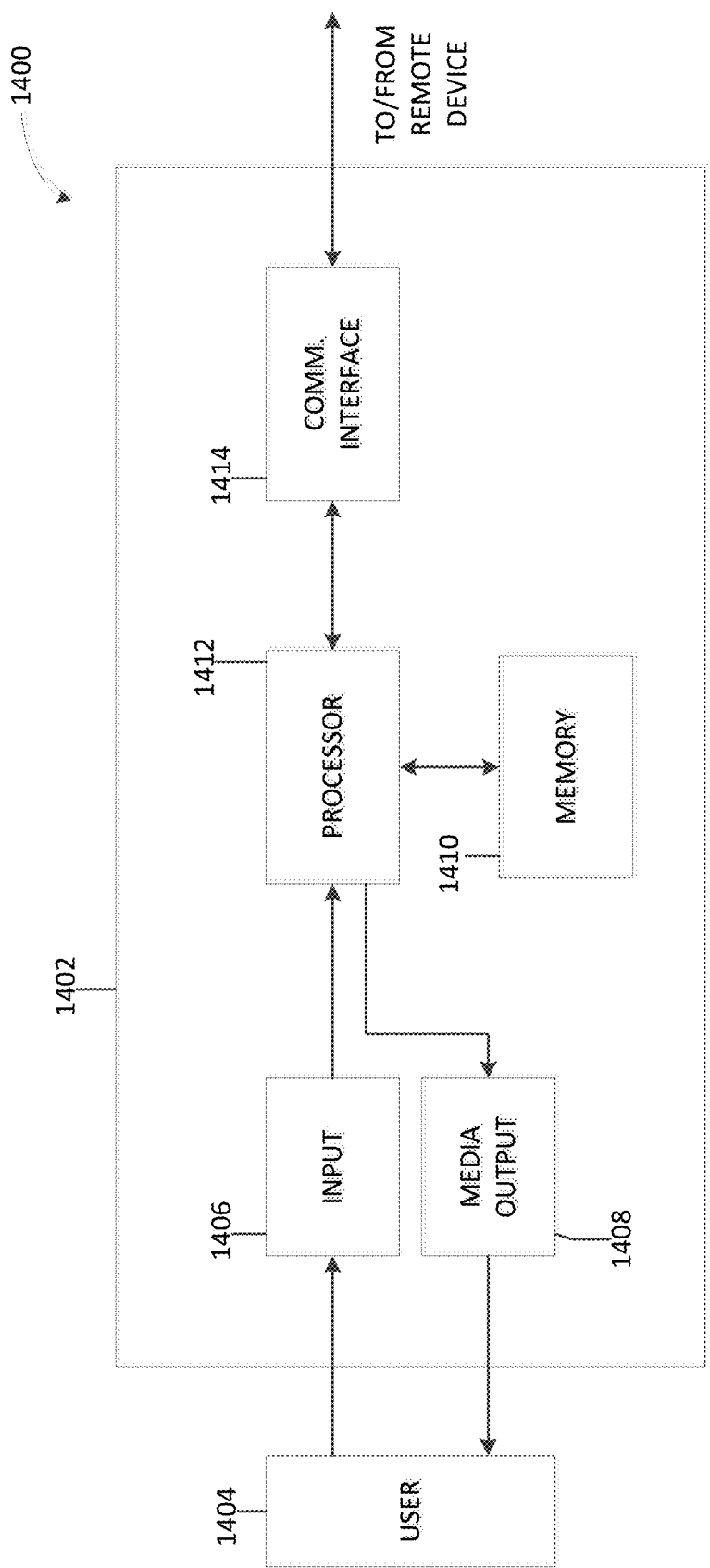
FIG. 14 illustrates an exemplary client computing device that may be used with the computing system illustrated in FIG. 13.

FIG. 14 illustrates a block diagram 1400 of an exemplary client computing device 1402 that may be used with the computing device 1302 shown in FIG. 13. Client computing device 1402 may be, for example, at least one of user device 1312*a* or user device 1312*b* (all shown in FIG. 13).

Client computing device 1402 may be accessible to a user 1404, such as customer 1324 or an administrator 1326 (all shown in FIG. 13). Device 1402 may include a processor 1412 for executing instructions. In some embodiments, executable instructions may be stored in a memory area 1410. Processor 1412 may include one or more processing units (e.g., in a multi-core configuration). Memory area 1410 may be any device allowing information such as executable instructions and/or other data to be stored and retrieved. Memory area 1410 may include one or more computer readable media.

In exemplary embodiments, processor 1412 may include and/or be communicatively coupled to one or more modules for implementing the systems and methods described herein. For example, in one exemplary embodiment, a module may be provided for receiving home telematics data and creating a risk profile based upon the received home telematics data. Processor 1412 may include or be communicatively coupled to another module for generating one or more recommendations based upon the risk profile created in view of aggregated home telematics data.

In one or more exemplary embodiments, computing device 1402 may also include at least one media output component 1408 for presenting information to a user 1401. Media output component 1408 may be any component capable of conveying information to user 1401. In some embodiments, media output component 1408 may include an output adapter such as a video adapter and/or an audio adapter. An output adapter may be operatively coupled to processor 1412 and operatively coupled to an output device such as a display device (e.g., a liquid crystal display (LCD), a light emitting diode (LED) display, an organic light emitting diode (OLED) display, a cathode ray tube (CRT) display, an "electronic ink" display, a projected display, etc.) or an audio output device (e.g., a speaker arrangement or headphones). Media output component 1408 may be configured to, for example, display a status of the model and/or display a prompt for user 1401 to input user data. In another embodiment, media output component 1408 may be configured to, for example, display a result of a liability limit prediction generated in response to receiving user data described herein and in view of the built model.

Client computing device 1402 may also include an input device 1406 for receiving input from a user 1404. Input device 1406 may include, for example, a keyboard, a pointing device, a mouse, a stylus, a touch sensitive panel (e.g., a touch pad or a touch screen), a gyroscope one or more sensors or an audio input device. A single component, such as a touch screen, may function as both an output device of media output component 1408 and an input device of input device 1406.

Client computing device 1402 may also include a communication interface 1414, which can be communicatively coupled to a remote device, such as computing device 1302, shown in FIG. 13. Communication interface 1414 may include, for example, a wired or wireless network adapter or a wireless data transceiver for use with a mobile phone network (e.g., Global System for Mobile communications (GSM), 3G, 4G, or Bluetooth) or other mobile data networks (e.g., Worldwide Interoperability for Microwave Access (WIMAX)). The systems and methods disclosed herein are not limited to any certain type of short-range or long-range networks.

Stored in memory area 1410 may be, for example, computer readable instructions for providing a user interface to user 1401 via media output component 1408 and, optionally, receiving and processing input from input device 1406. A user interface may include, among other possibilities, a web browser or a client application. Web browsers may enable users, such as user 1401, to display and interact with media and other information typically embedded on a web page or a website.

Memory area 1410 may include, but is not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAN). The above memory types are exemplary only, and are thus not limiting as to the types of memory usable for storage of a computer program.

Exemplary Server Computing Device

Figure 15:
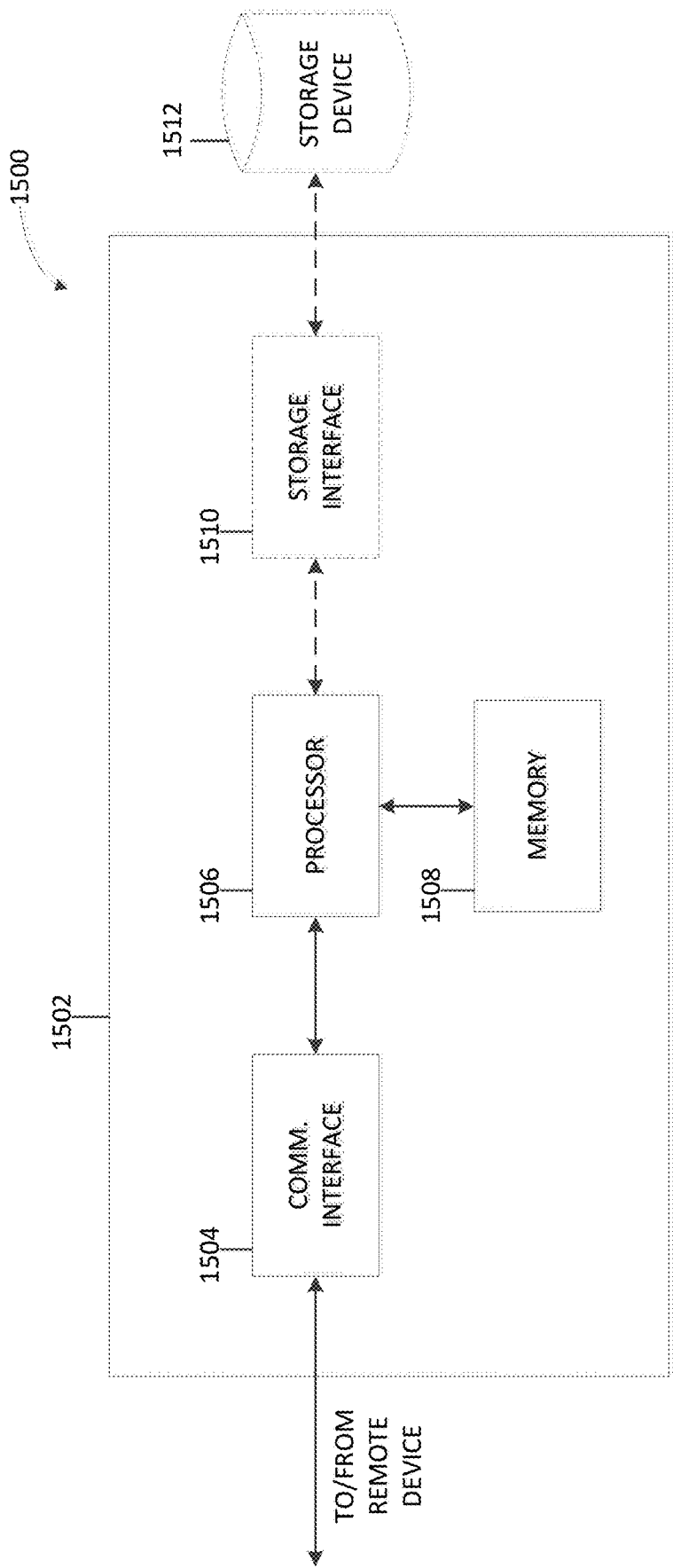
FIG. 15 illustrates an exemplary server system that may be used with the computing system illustrated in FIG. 13.

FIG. 15 depicts a block diagram 1500 showing an exemplary server system 1502. Server system 1502 may be, for example, computing device 1302, database server 1304, or back end server 1318 (shown in FIG. 13).

In exemplary embodiments, server system 1501 may include a processor 1506 for executing instructions. Instructions may be stored in a memory area 1508. Processor 1506 may include one or more processing units (e.g., in a multi-core configuration) for executing instructions. The instructions may be executed within a variety of different operating systems on server system 1501, such as UNIX, LINUX, Microsoft Windows®, etc.

It should also be appreciated that upon initiation of a computer-based method, various instructions may be executed during initialization. Some operations may be required in order to perform one or more processes described herein, while other operations may be more general and/or specific to a particular programming language (e.g., C, C #, C++, Java, or other suitable programming languages, etc.).

Processor 1506 may be operatively coupled to a communication interface 1504 such that server system 1501 is capable of communicating with computing device 1302, user devices 1310*a*, 1310*b*, and 1312 (all shown in FIG. 13), and/or another server system. For example, communication interface 1504 may receive data from user devices 1310*a* and 1310*b* via the Internet.

Processor 1506 may also be operatively coupled to a storage device 1512, such as database 1306 (shown in FIG. 13). Storage device 1512 may be any computer-operated hardware suitable for storing and/or retrieving data. In some embodiments, storage device 1512 may be integrated in server system 1501. For example, server system 1501 may include one or more hard disk drives as storage device 1512.

In other embodiments, storage device 1512 may be external to server system 1501 and may be accessed by a plurality of server systems. For example, storage device 1512 may include multiple storage units such as hard disks or solid state disks in a redundant array of inexpensive disks (RAID) configuration. Storage device 1512 may include a storage area network (SAN) and/or a network attached storage (NAS) system.

In some embodiments, processor 1506 may be operatively coupled to storage device 1512 via a storage interface 1510. Storage interface 1510 may be any component capable of providing processor 1506 with access to storage device 1512. Storage interface 1510 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 1506 with access to storage device 1512.

Memory area 1508 may include, but is not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). The above memory types are exemplary only, and are thus not limiting as to the types of memory usable for storage of a computer system.

Figure 16:
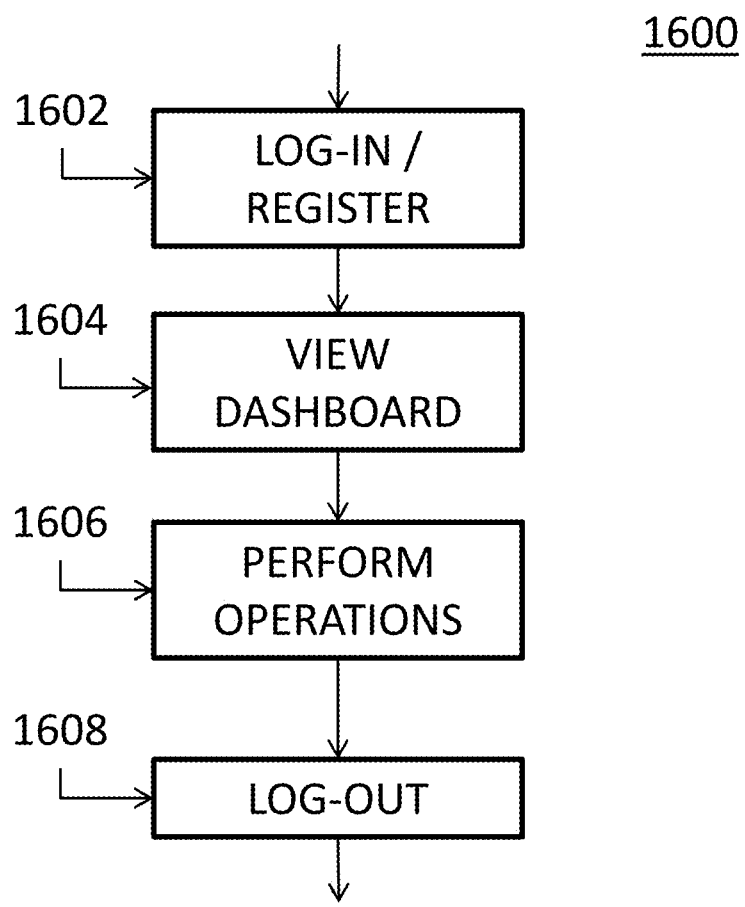
FIG. 16 illustrates an exemplary process in accordance with one or more embodiments of the present disclosure.
Figure 17:
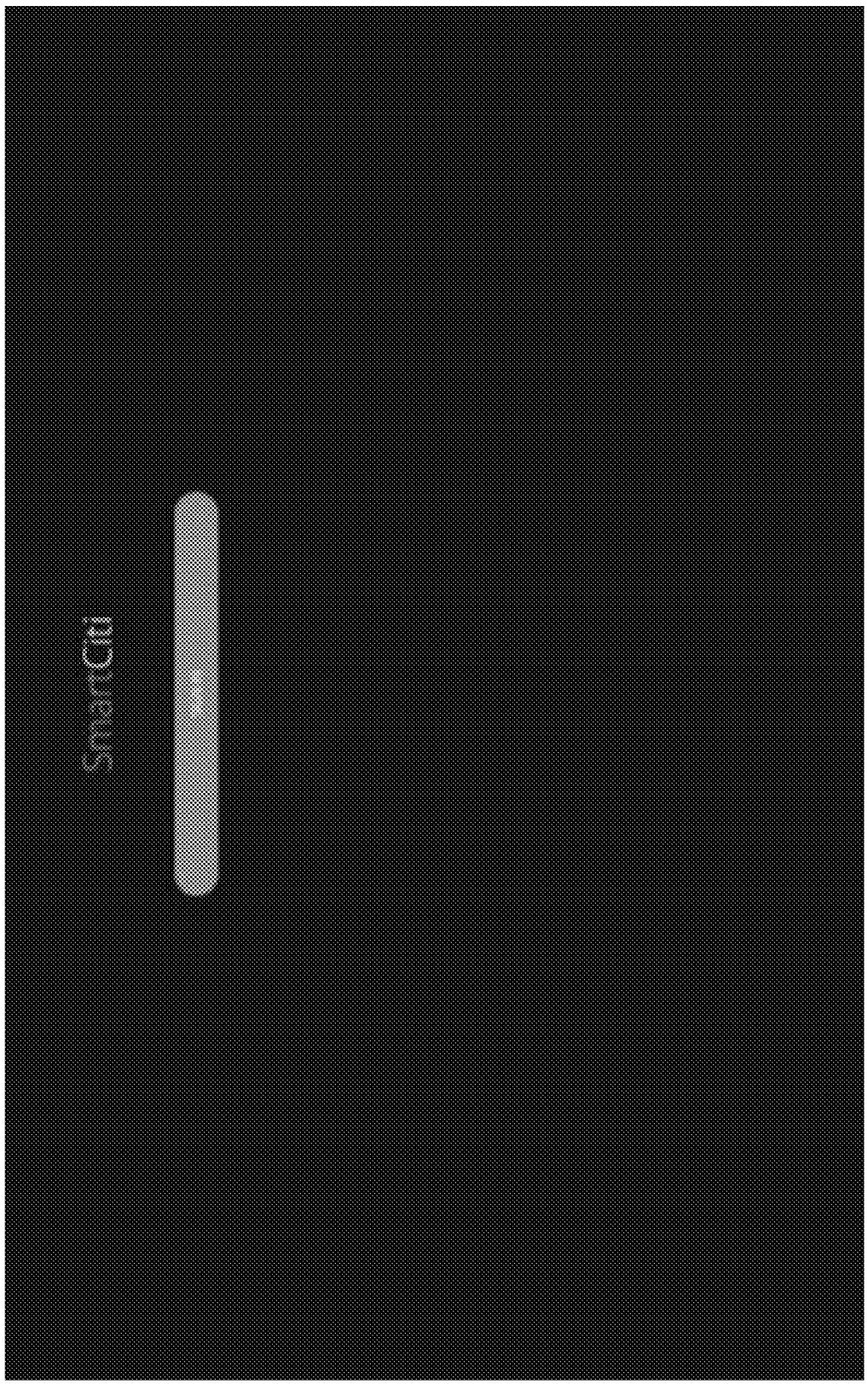
FIGS. 17-76 illustrate a series of exemplary GUI screen displays in accordance with exemplary embodiments of the present disclosure.
Figure 18:
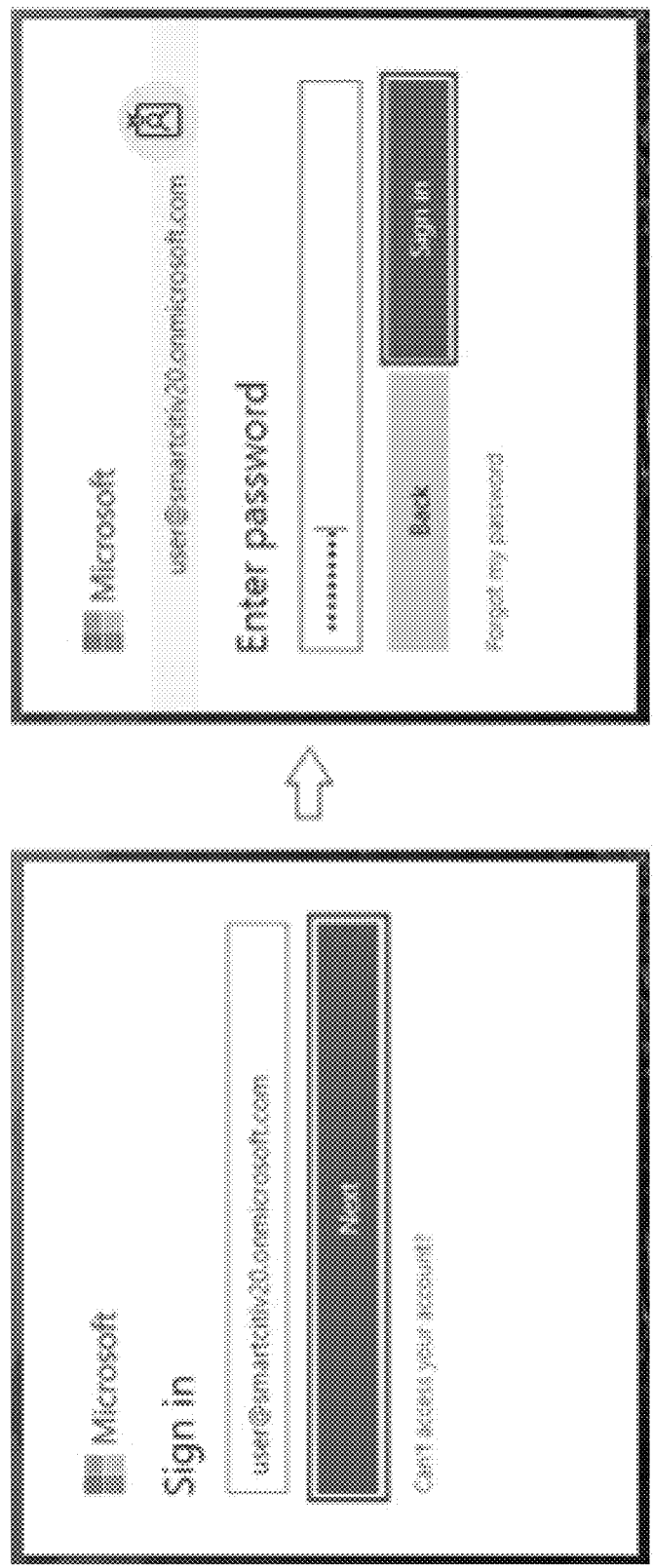
Figure 19:
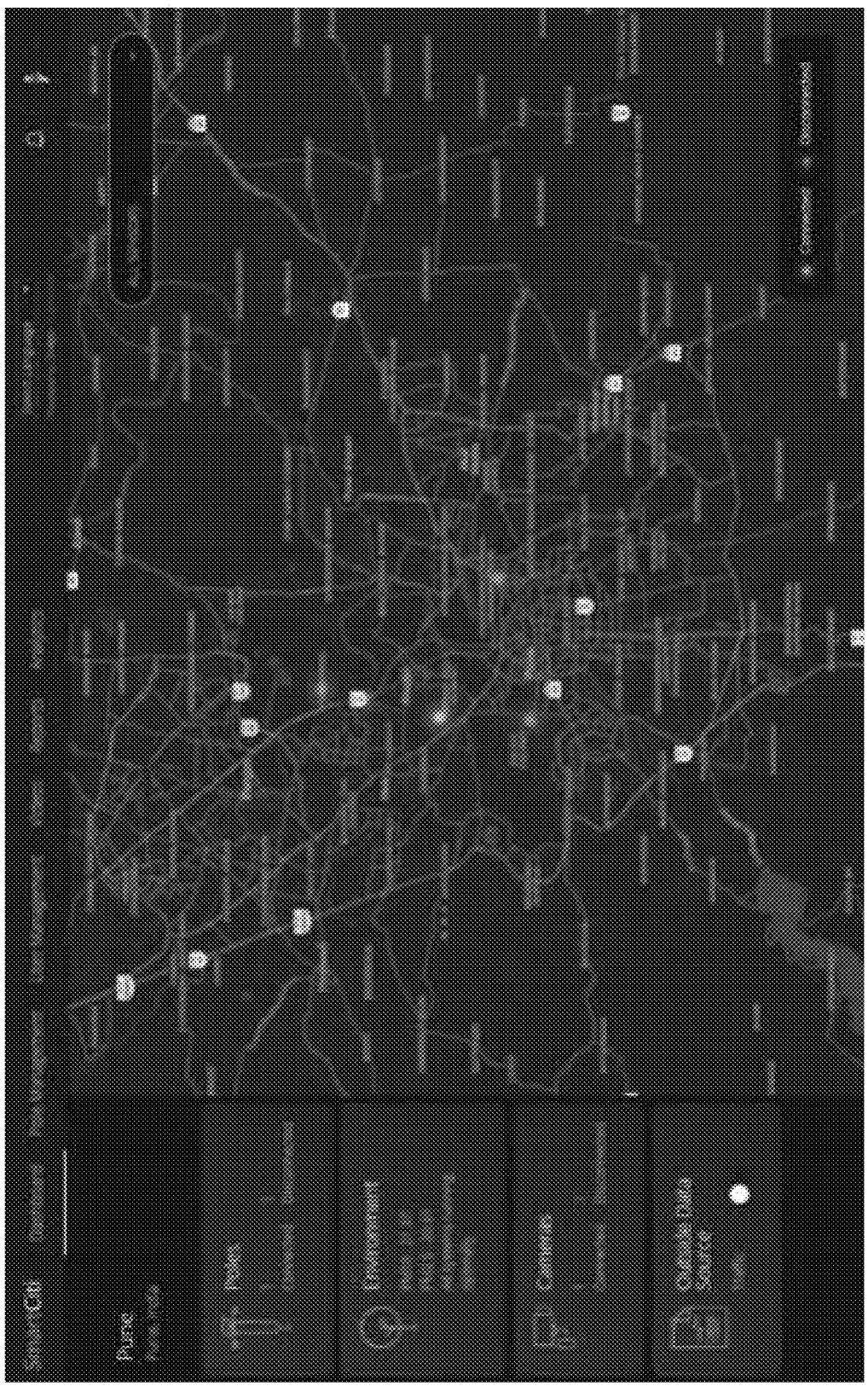
Figure 20:
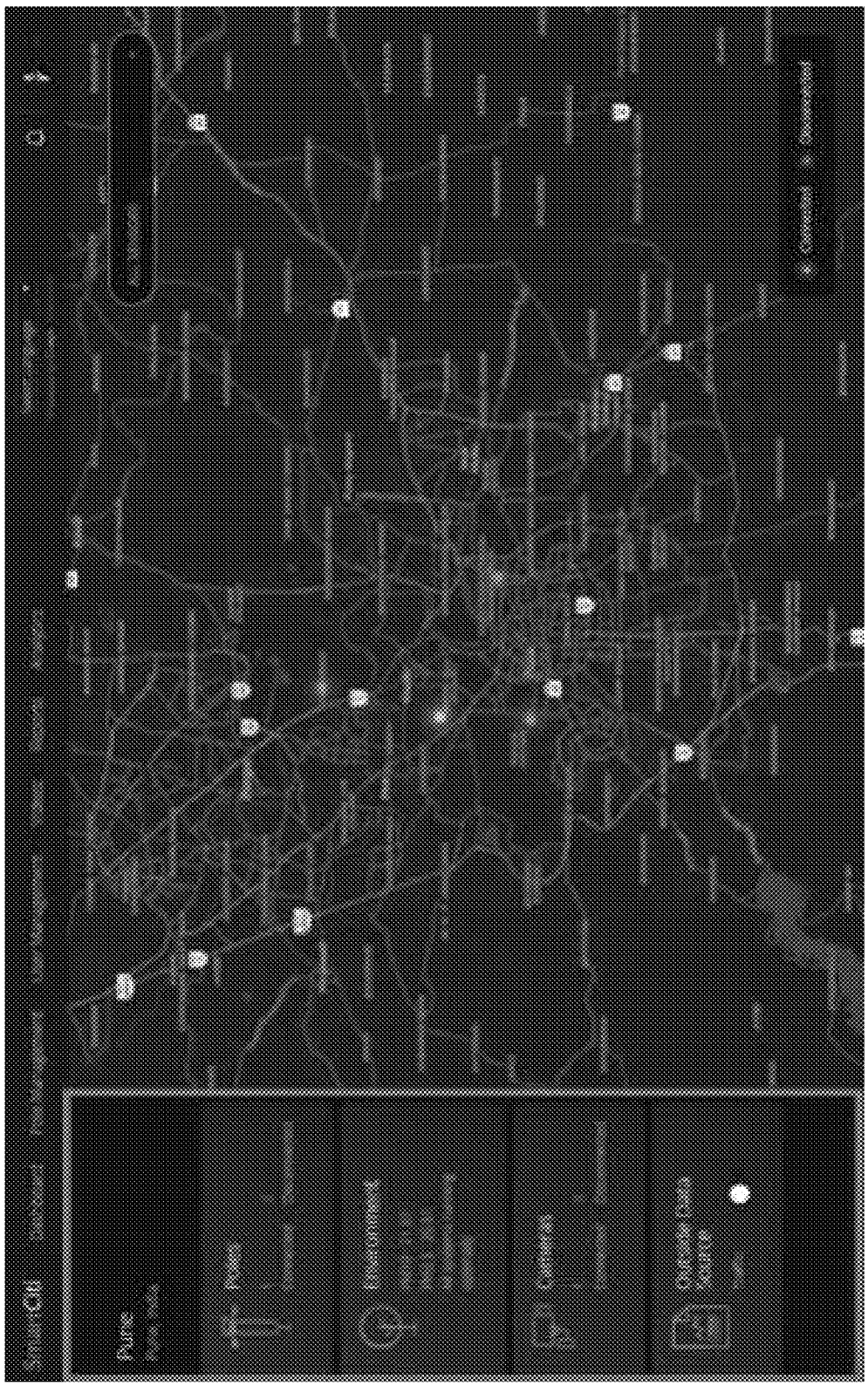
Figure 21:
Figure 22:
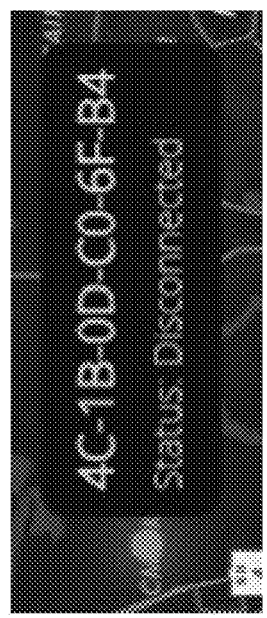
Figure 23:
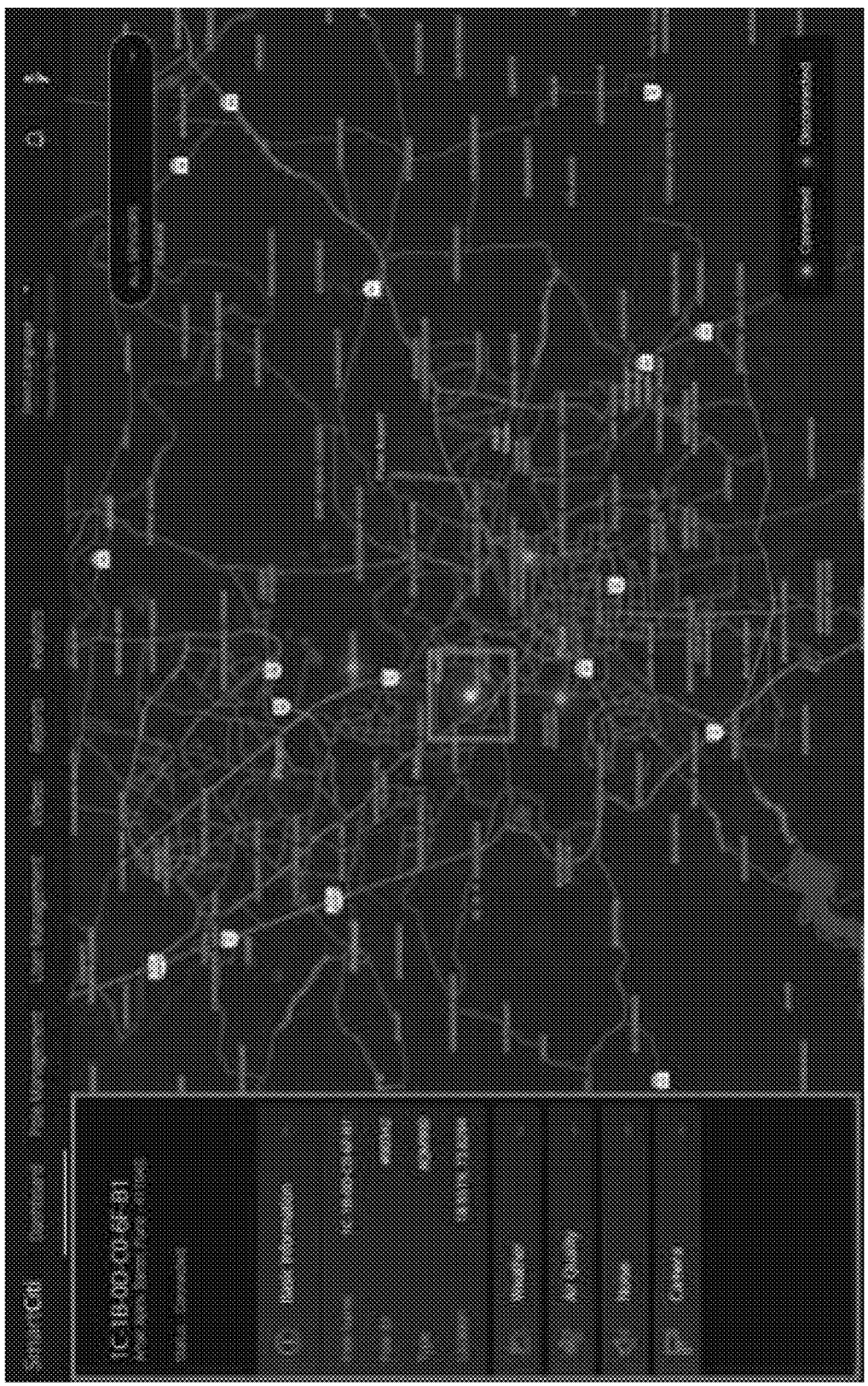
Figure 24:
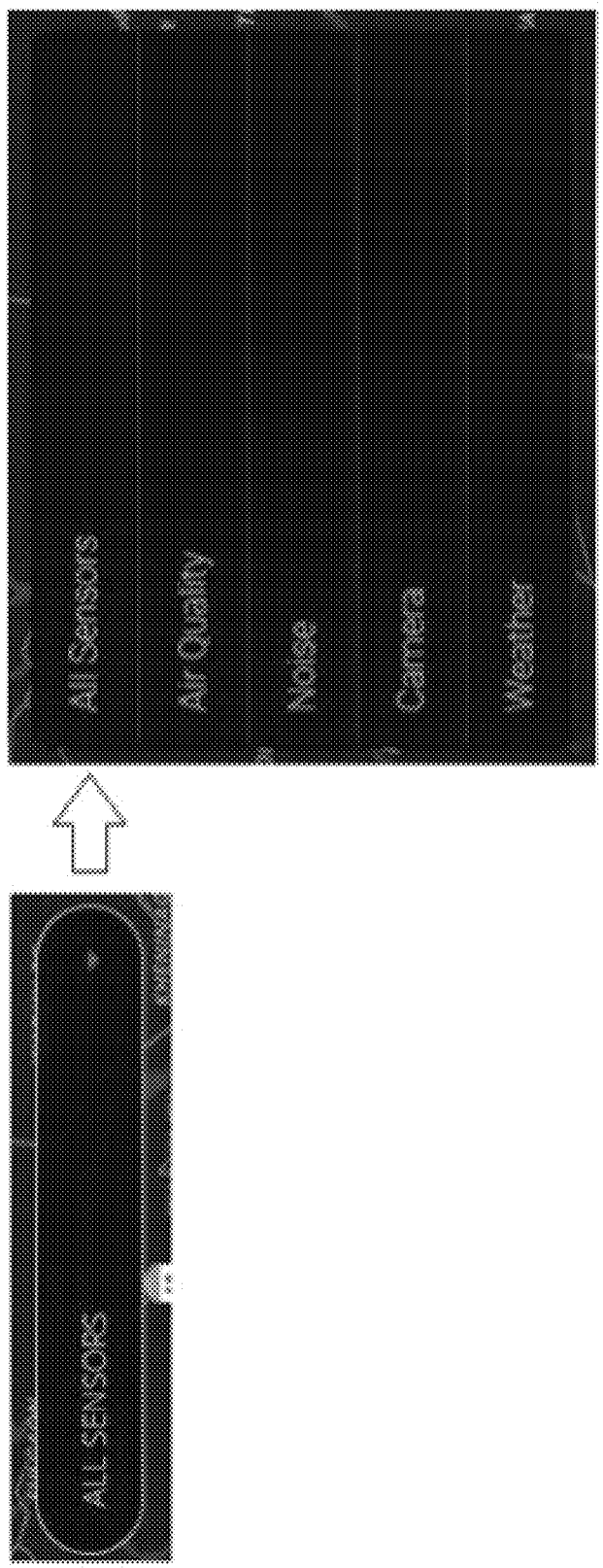
Figure 25:
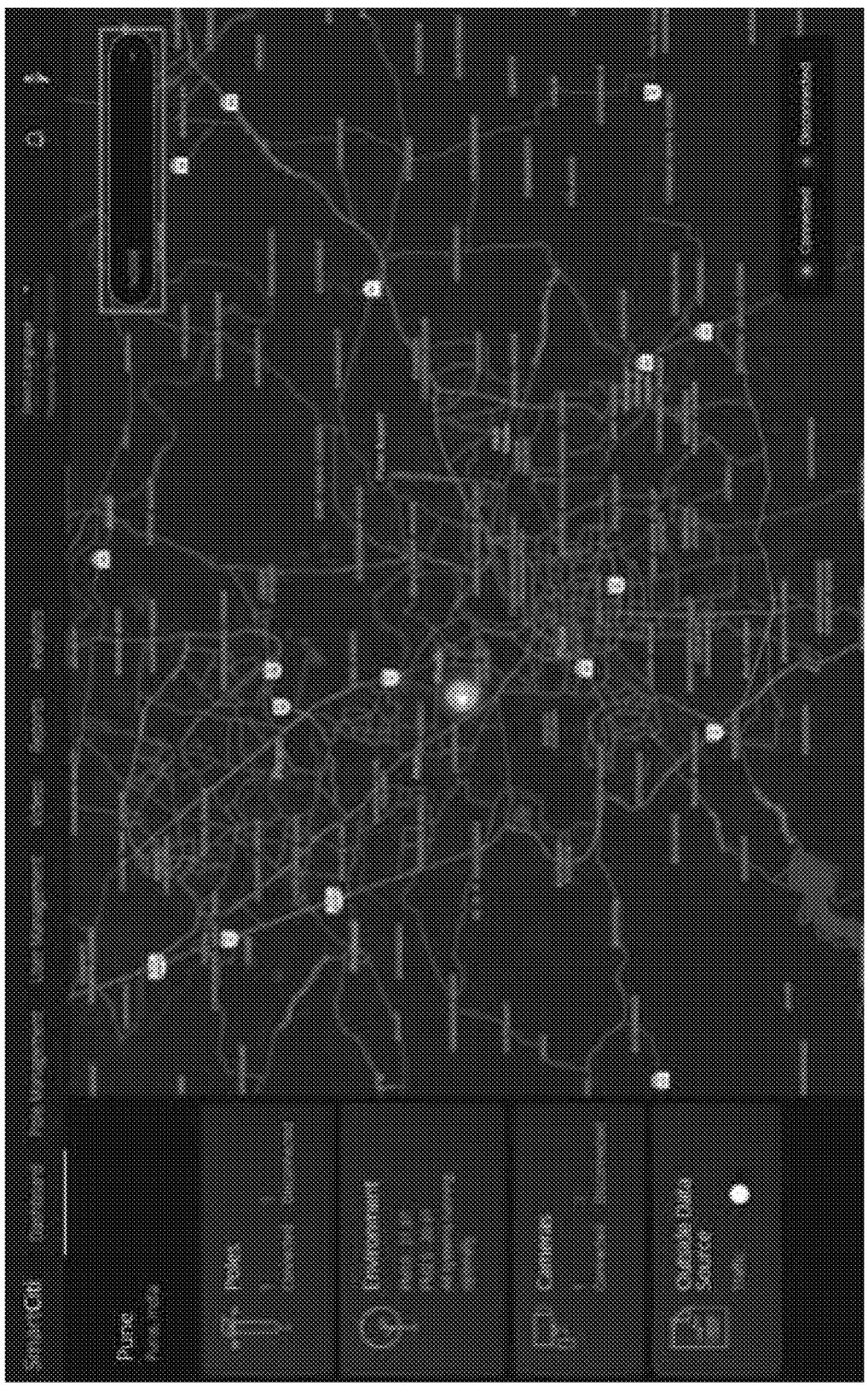
Figure 26:
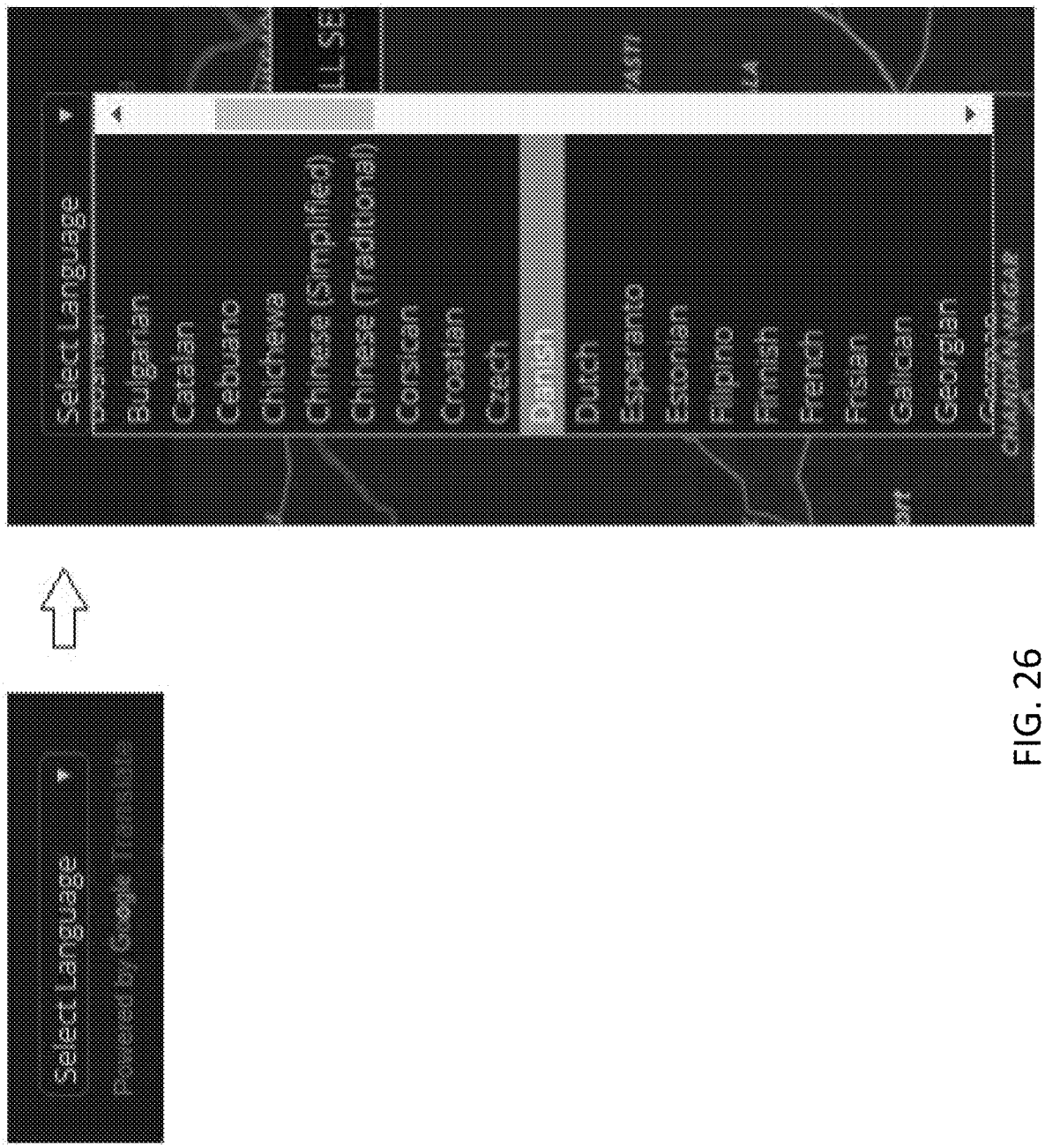
Figure 27:
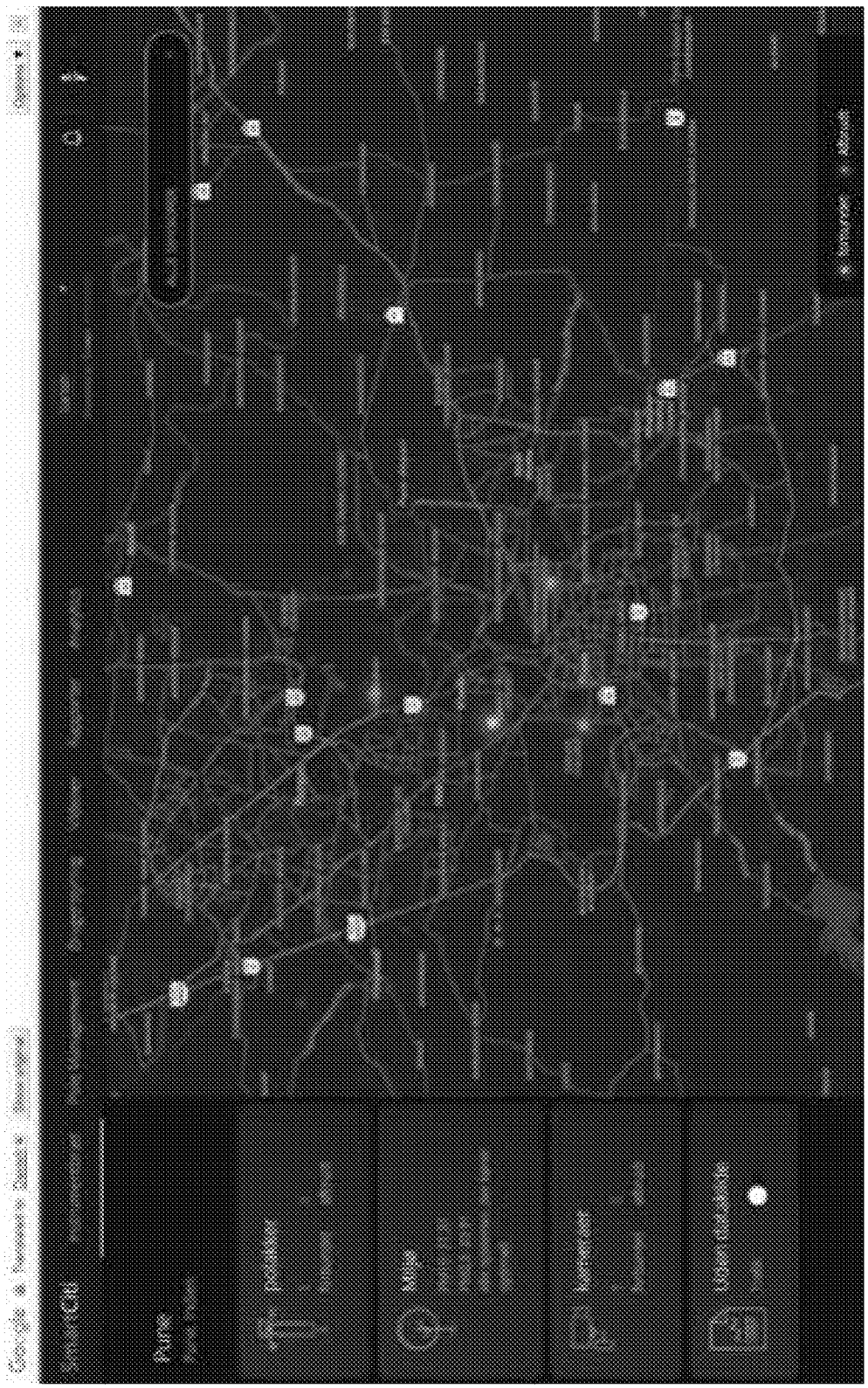
Figure 28:
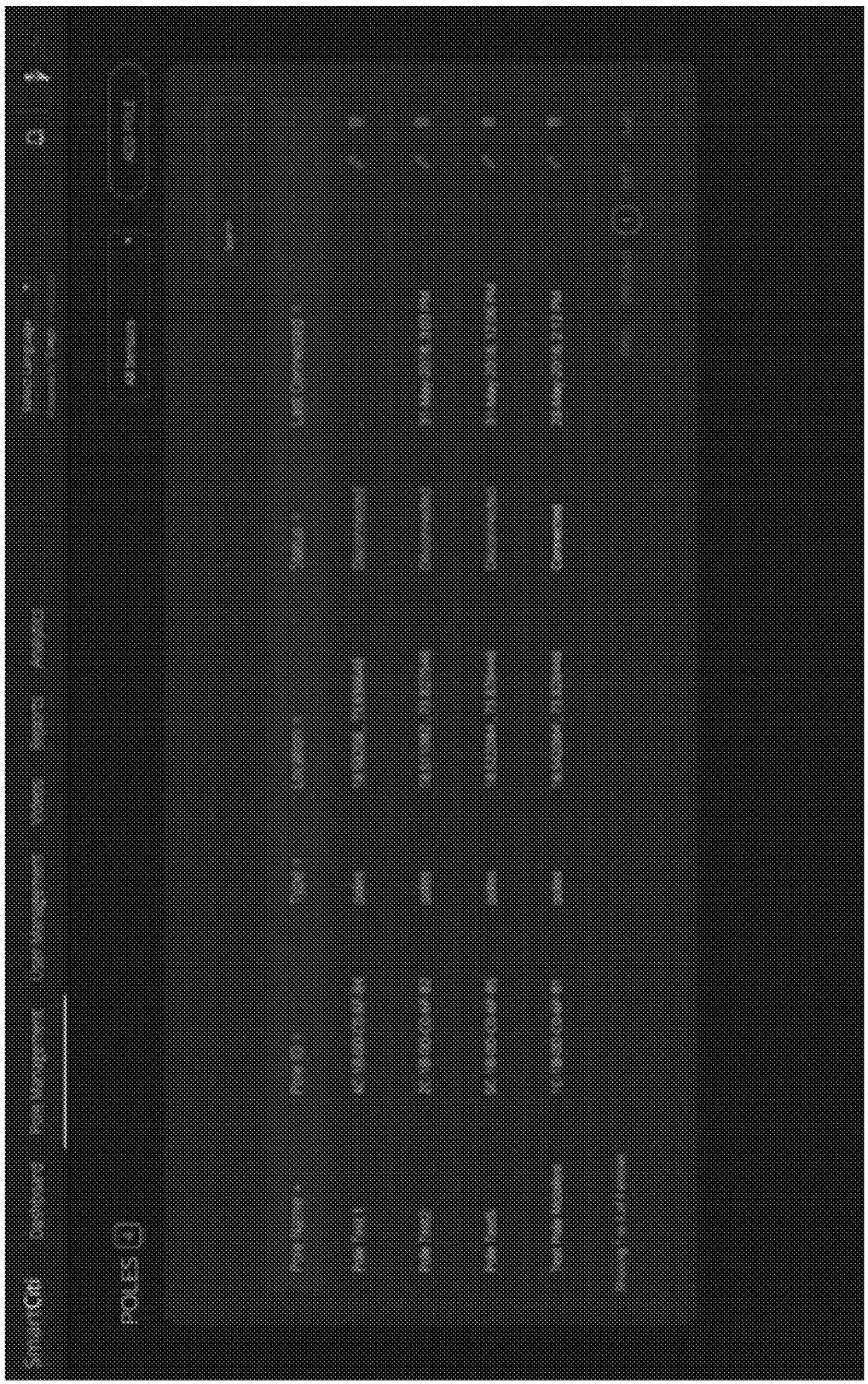
Figure 29:
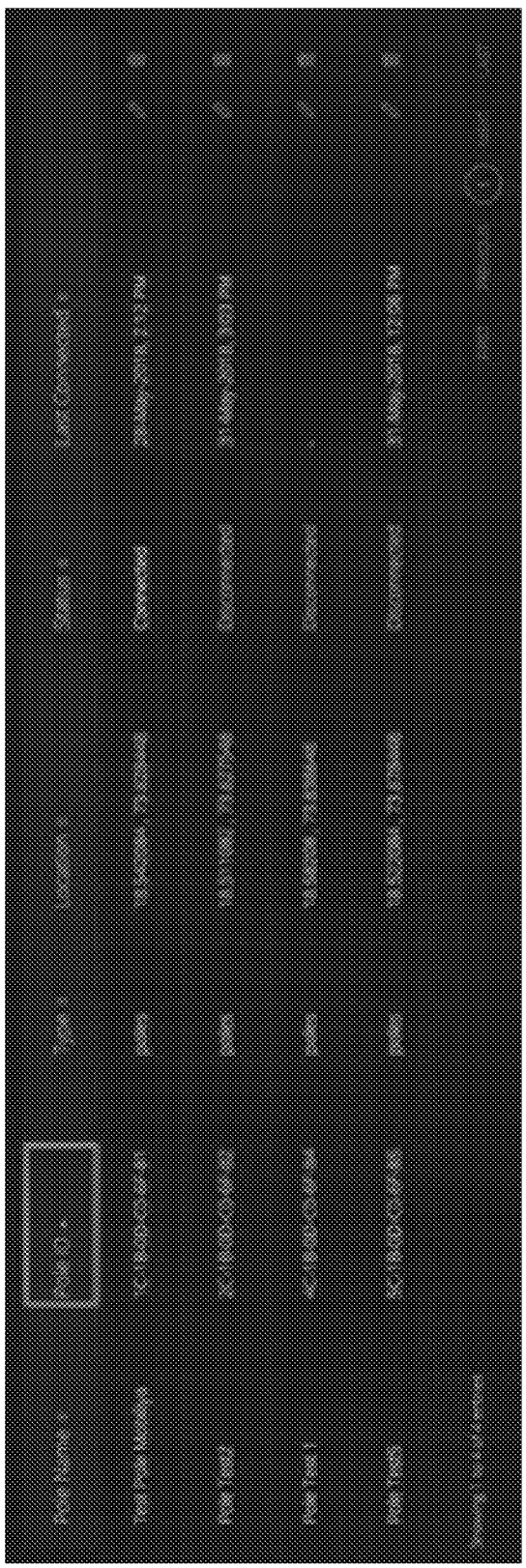
Figure 30:
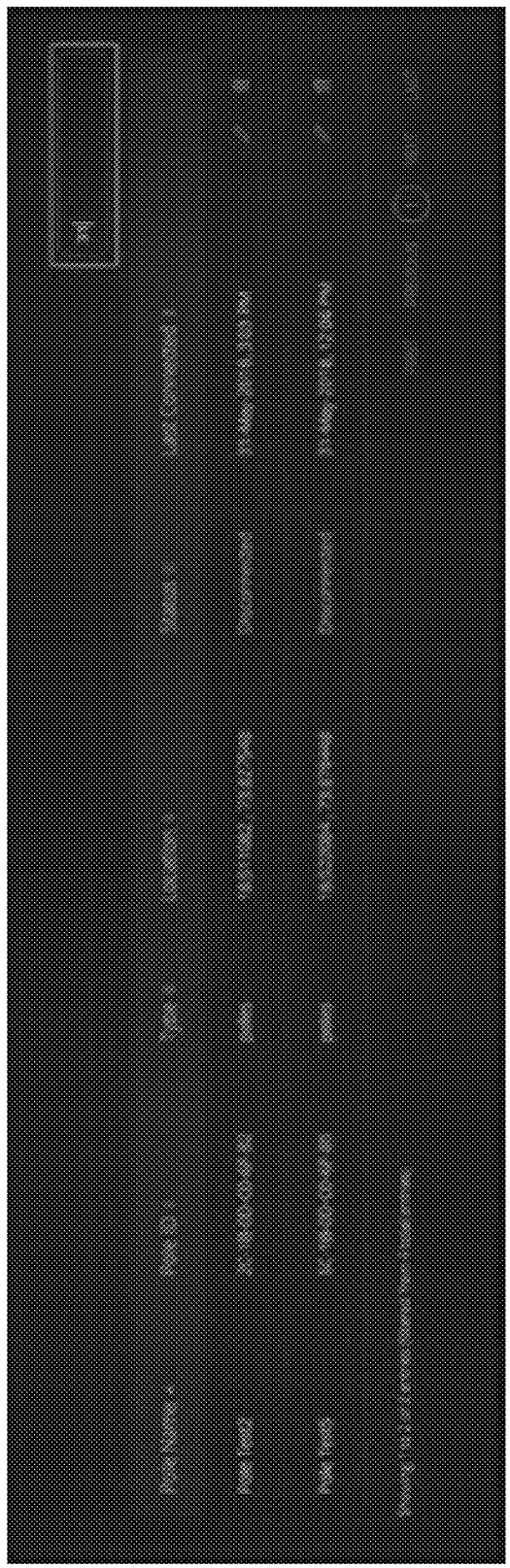
Figure 31:
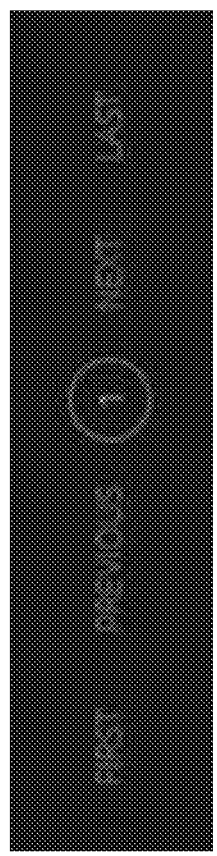
Figure 32:
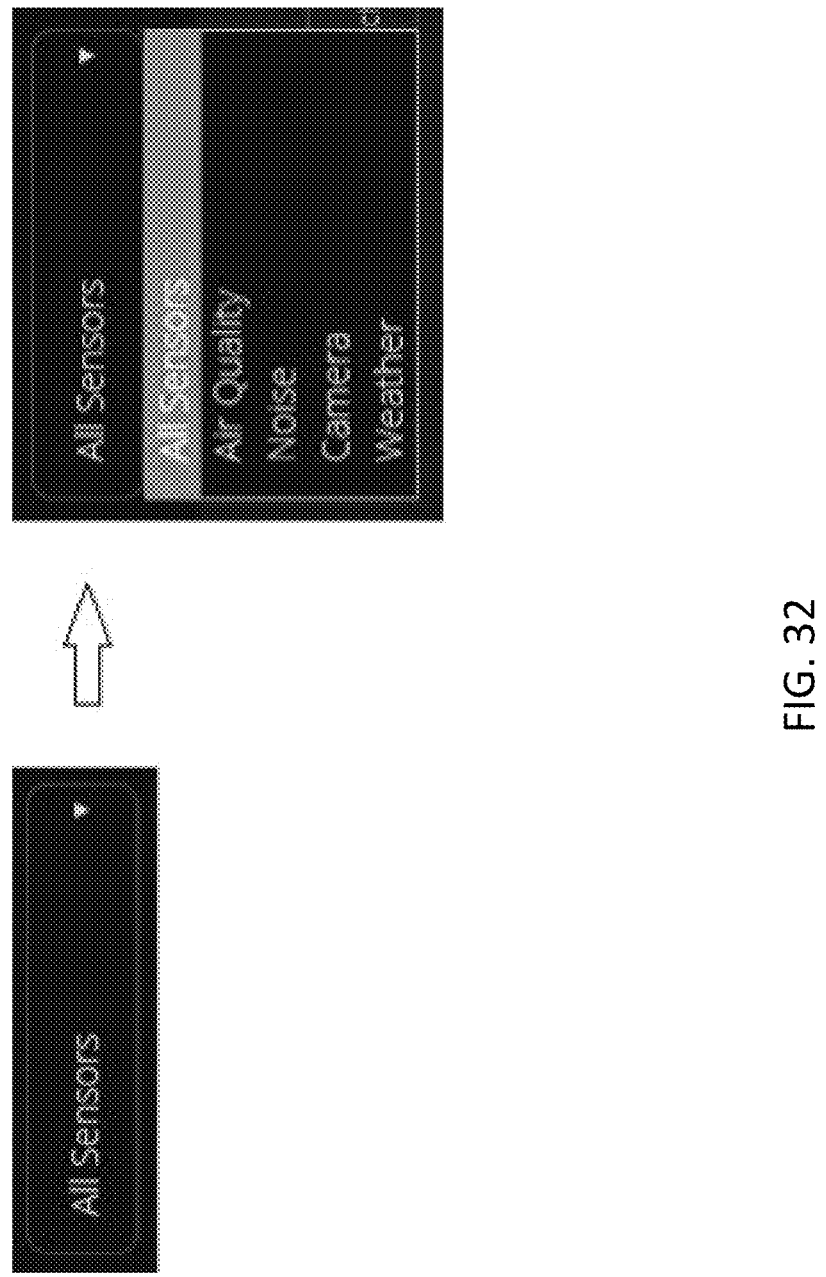
Figure 33:
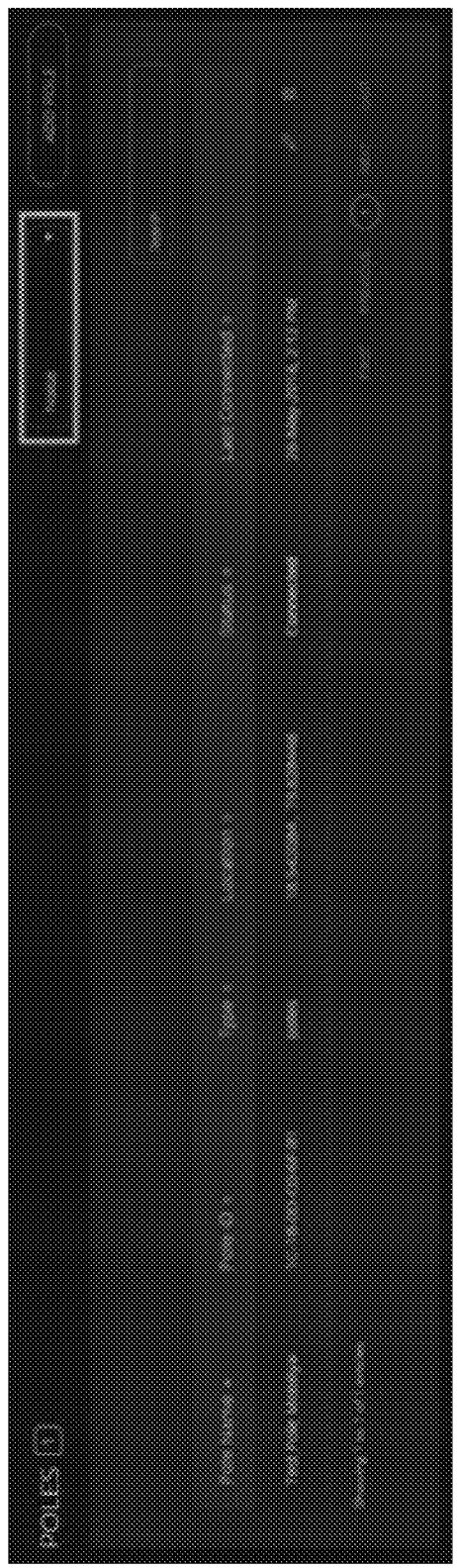
Figure 34:
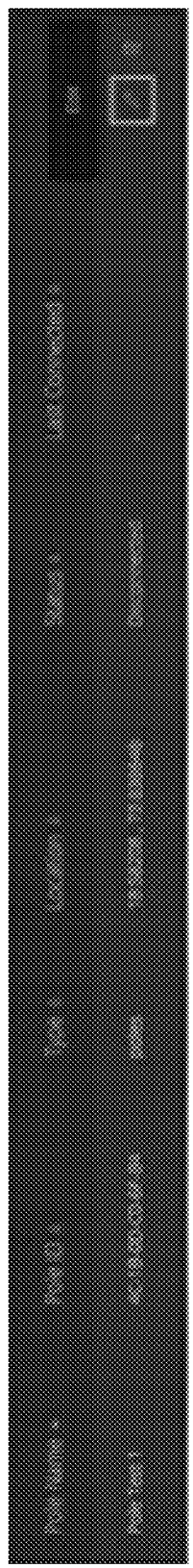
Figure 35:
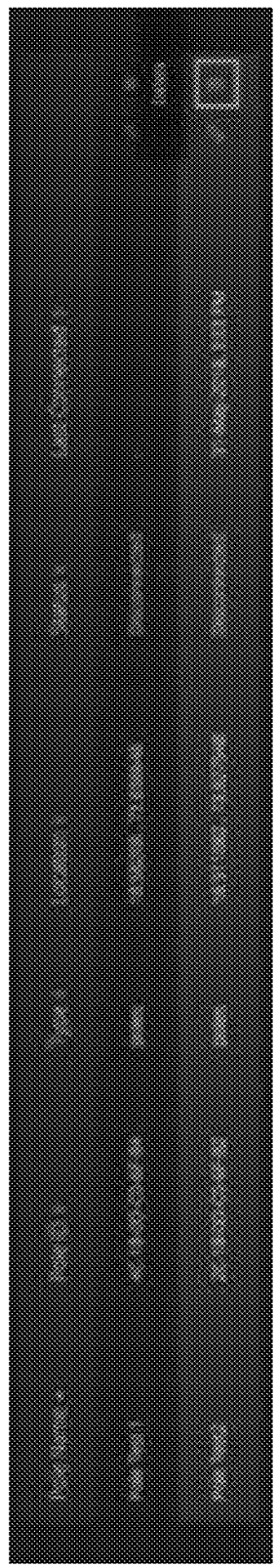
Figure 36:
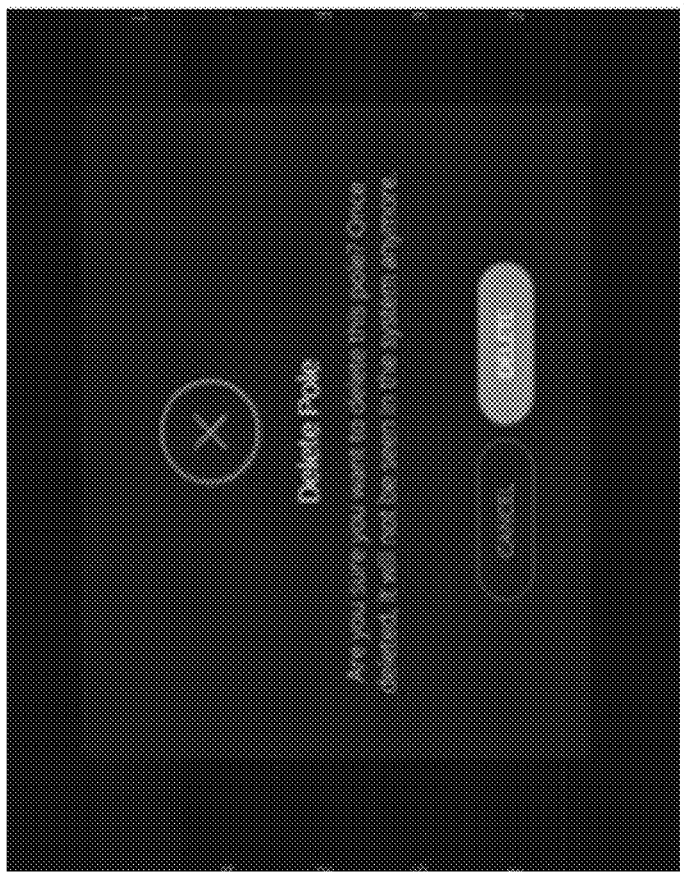
Figure 37:
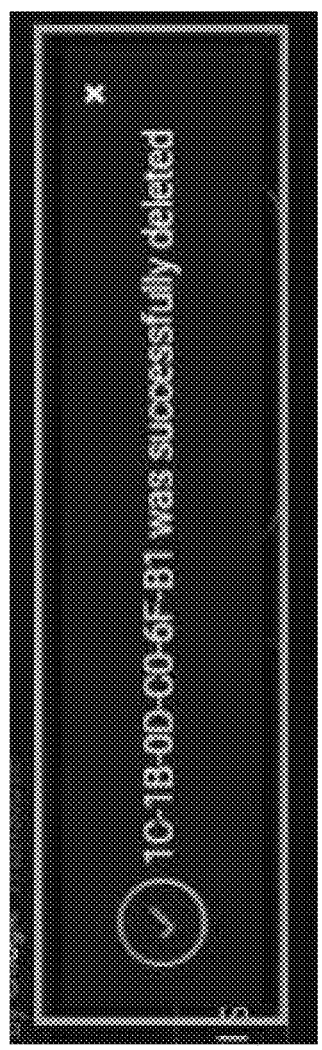
Figure 38:
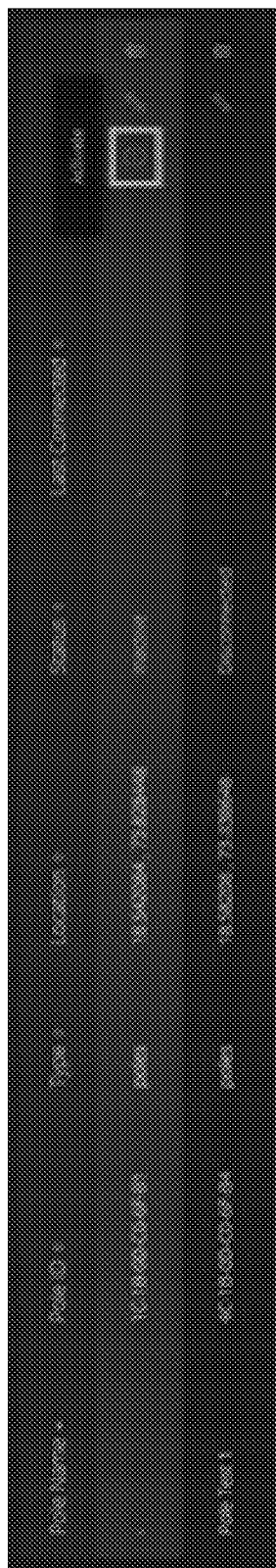
Figure 39:
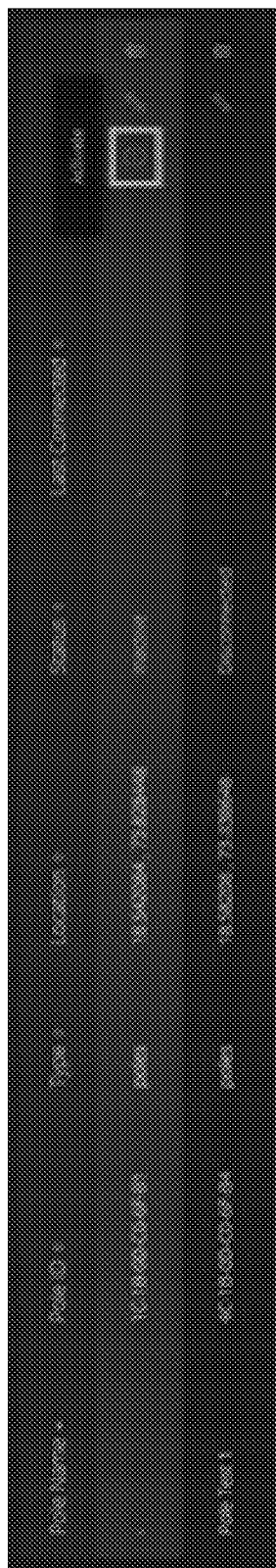
Figure 40:
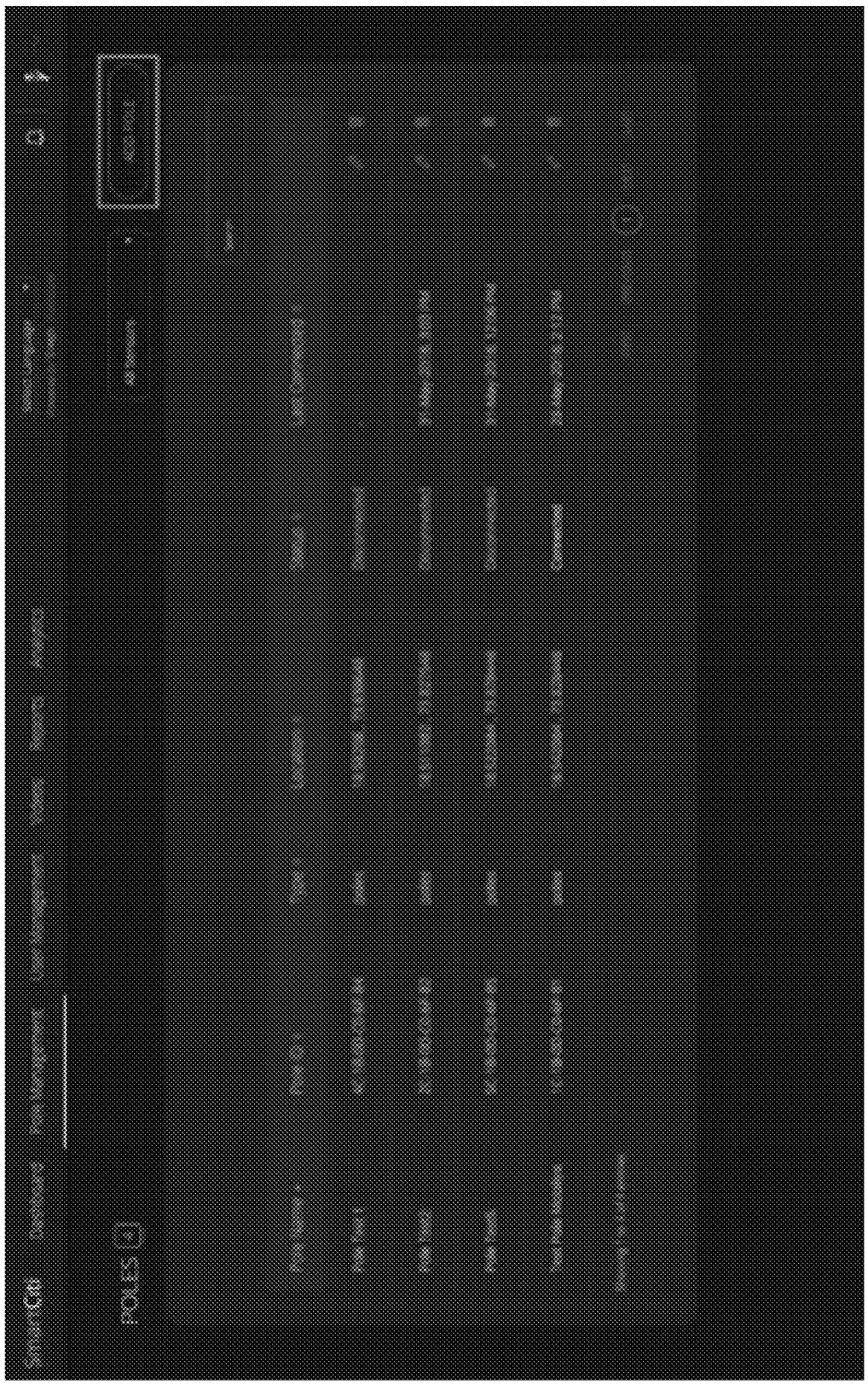
Figure 41:
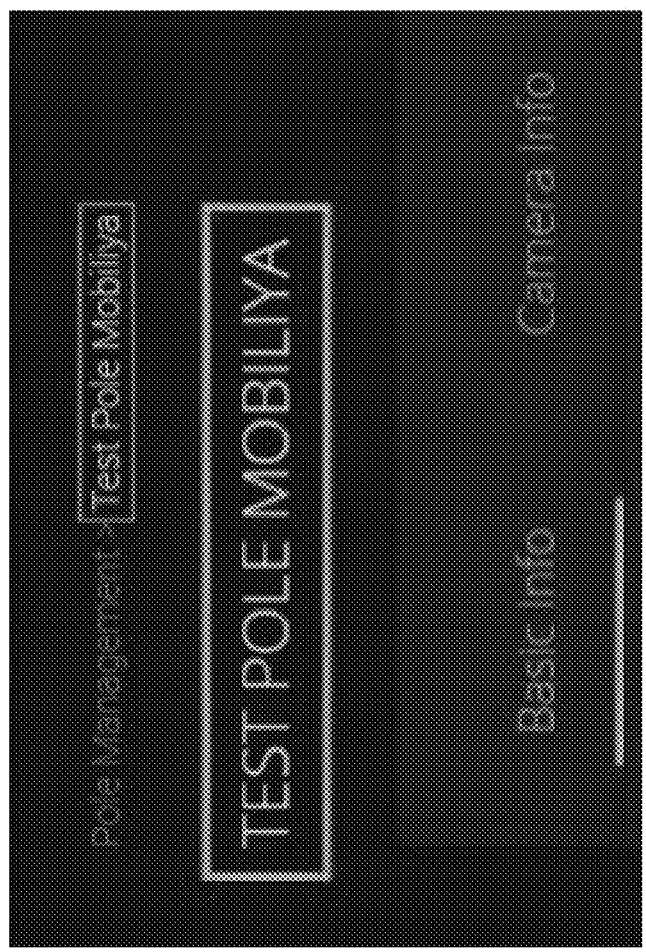
Figure 42:
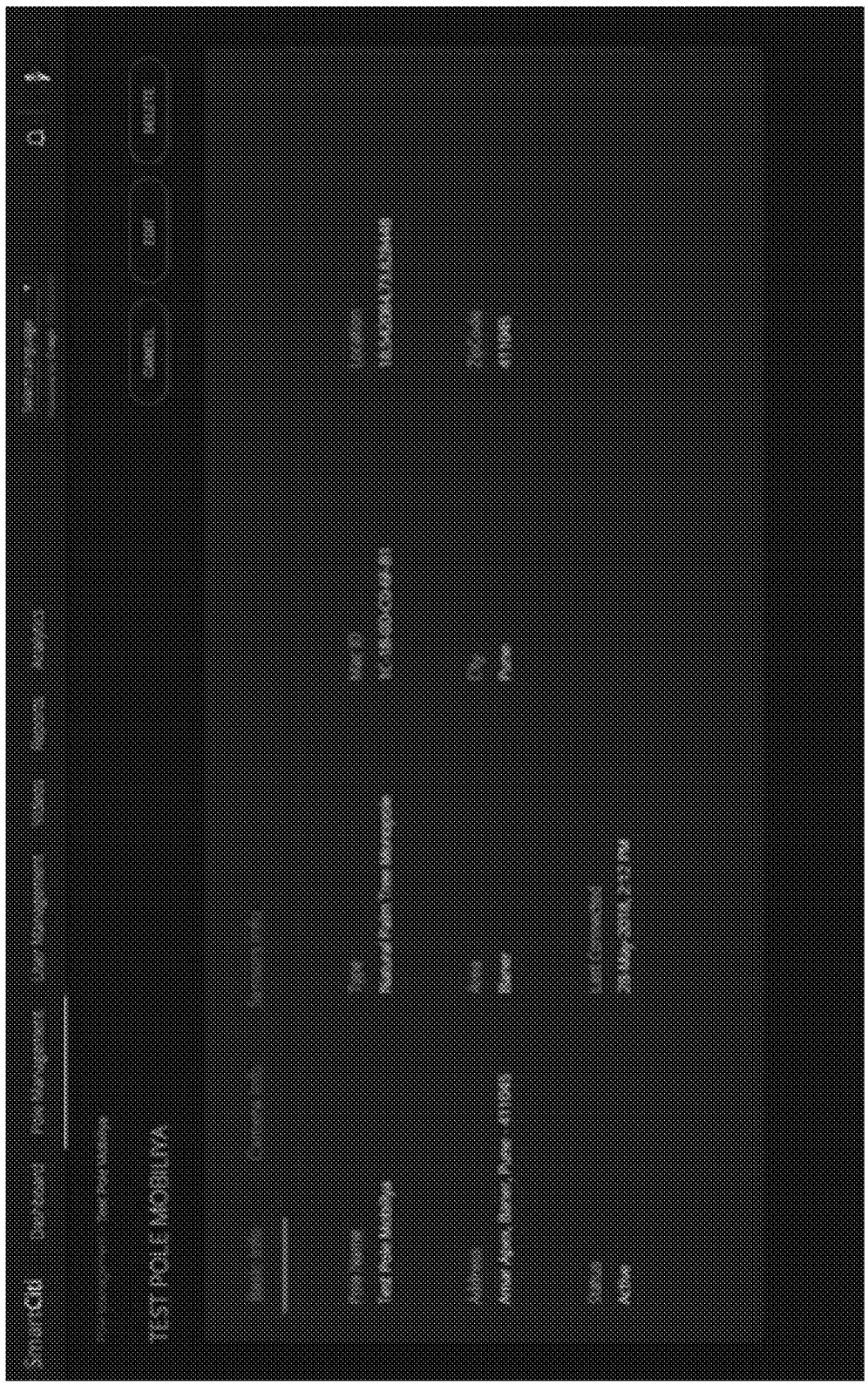
Figure 43:
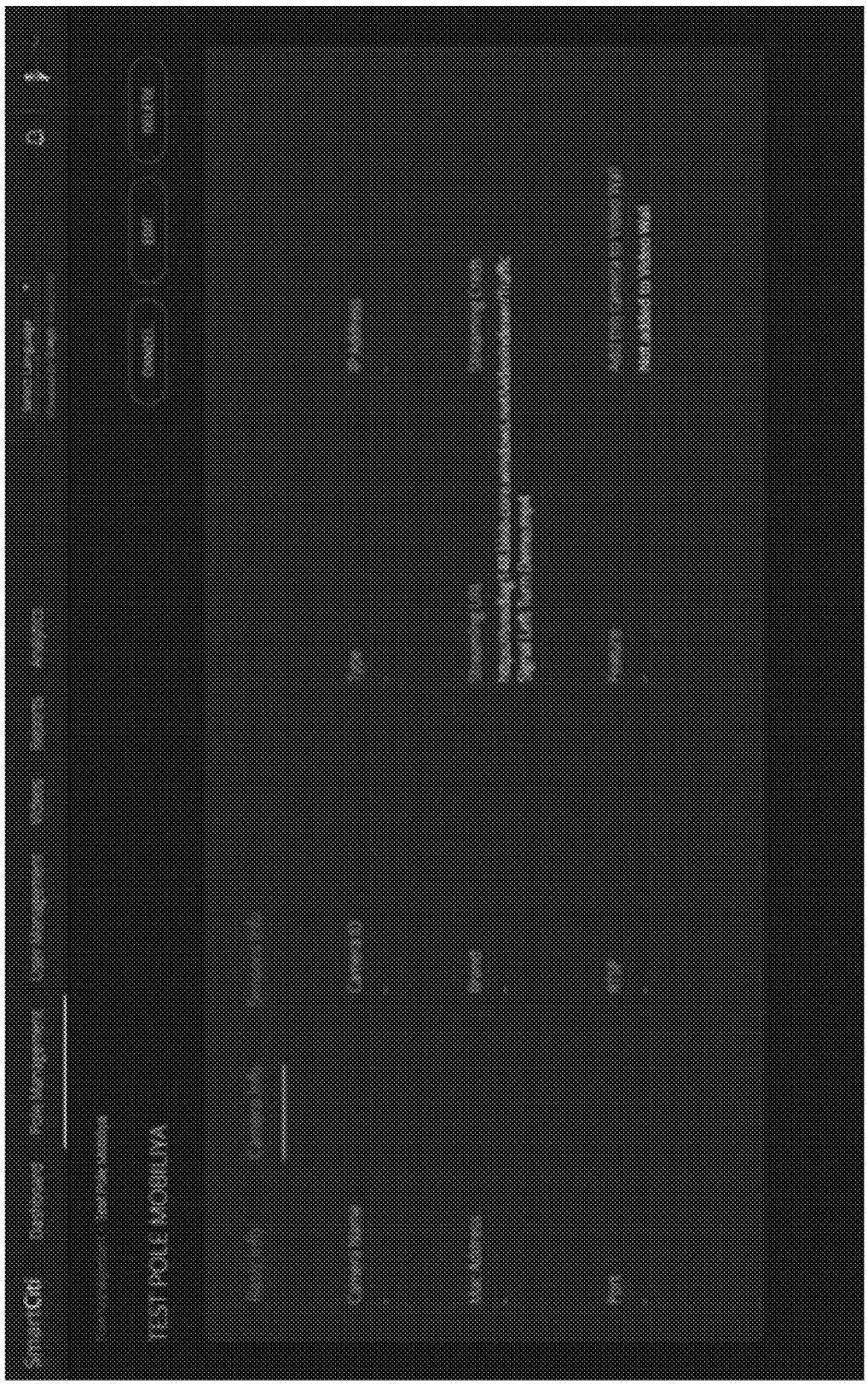
Figure 44:
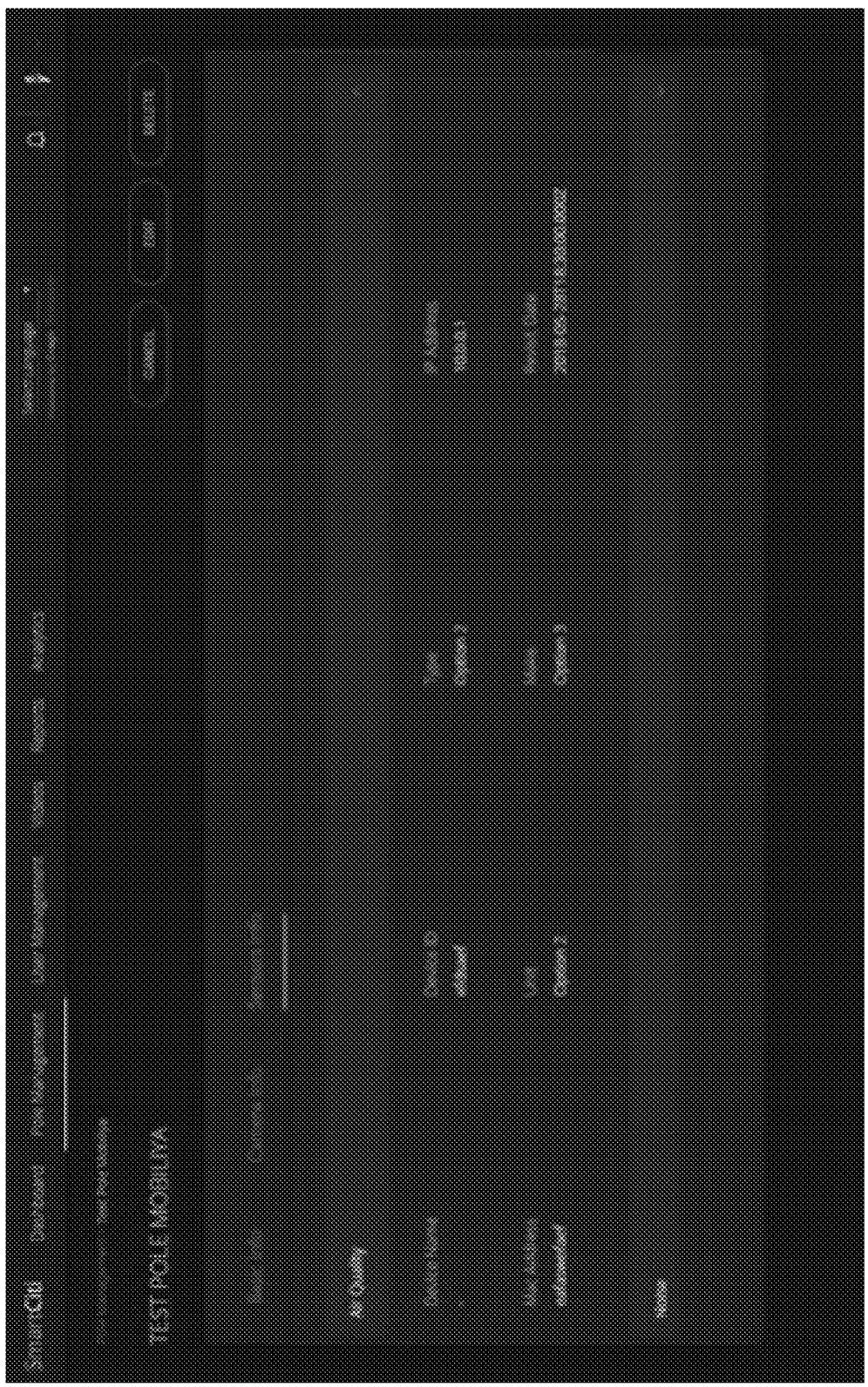
Figure 45:
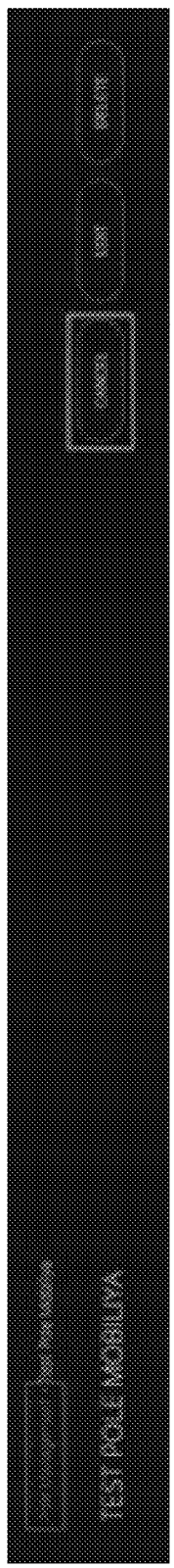
Figure 46:
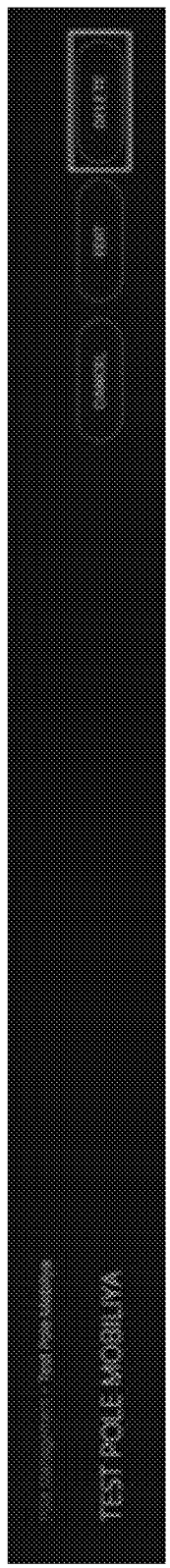
Figure 47:
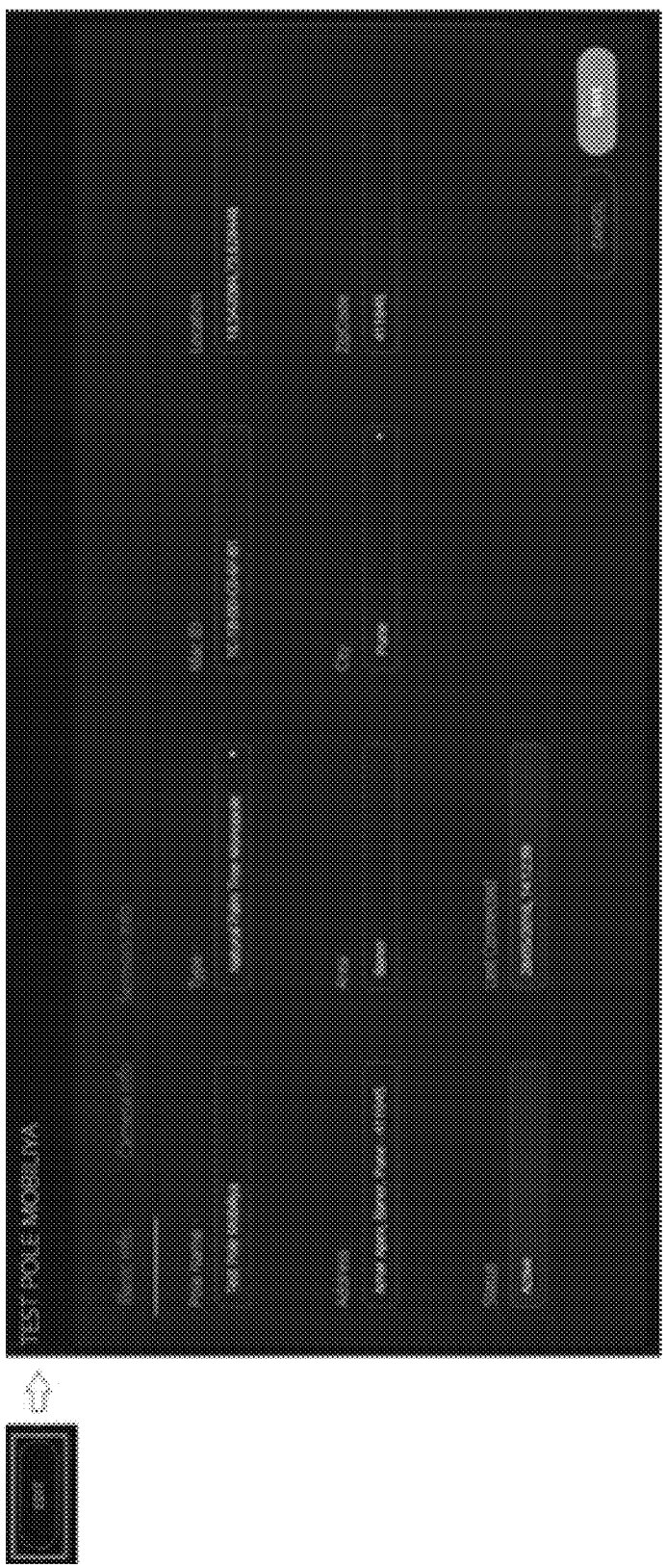
Figure 48:
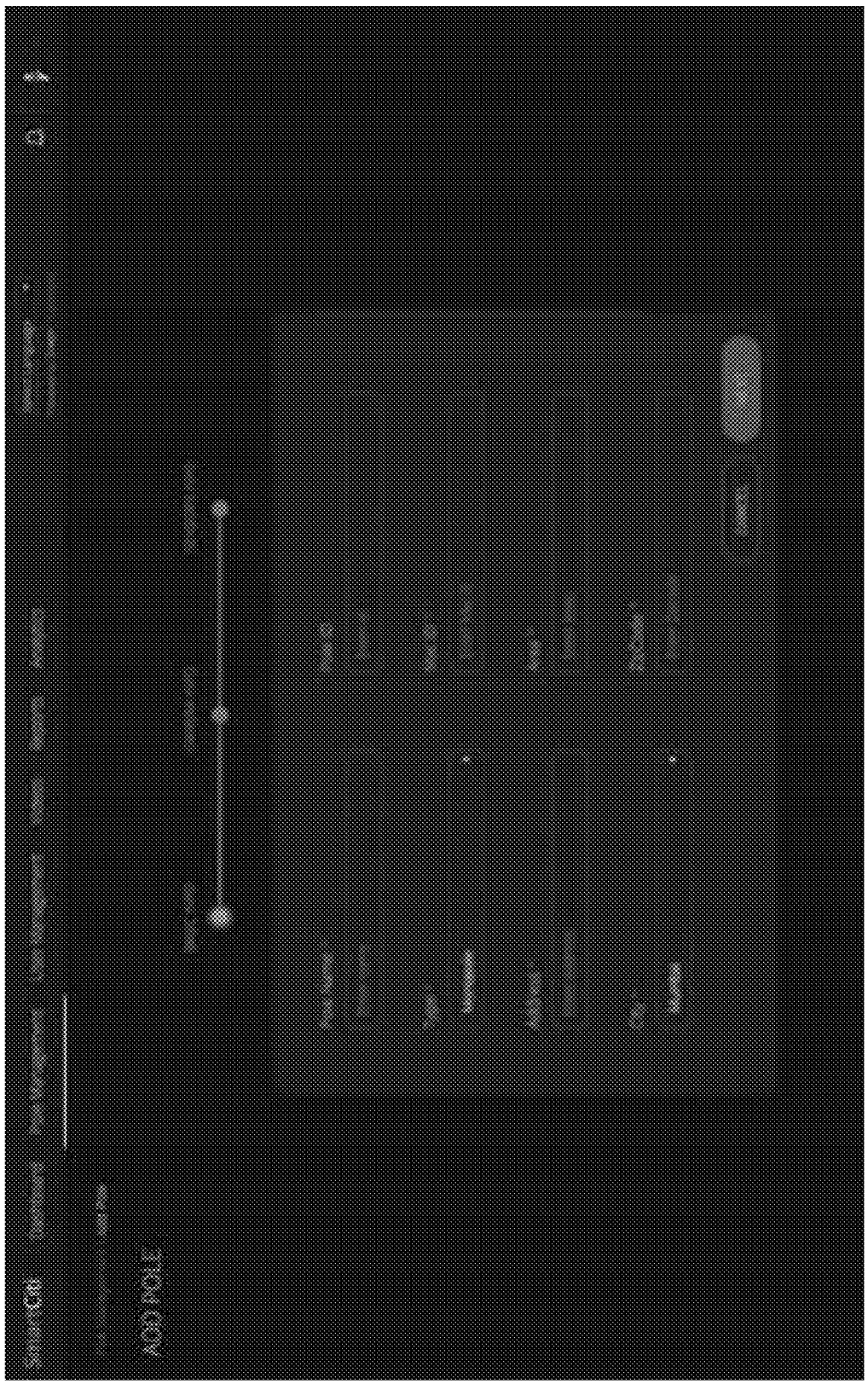
Figure 49B:
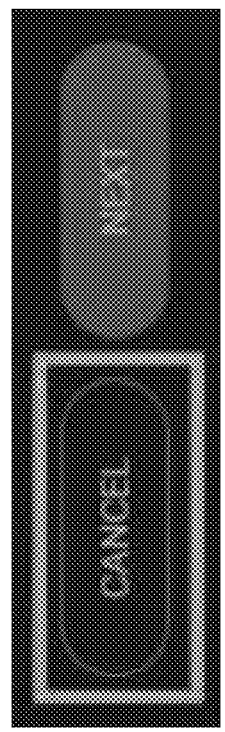
Figure 49A:
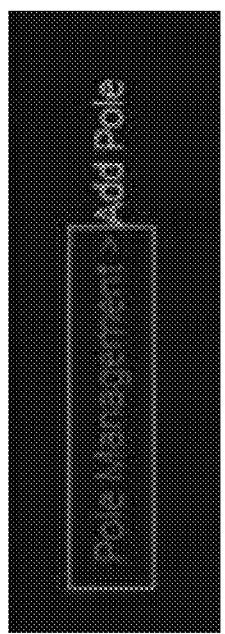
Figure 50:
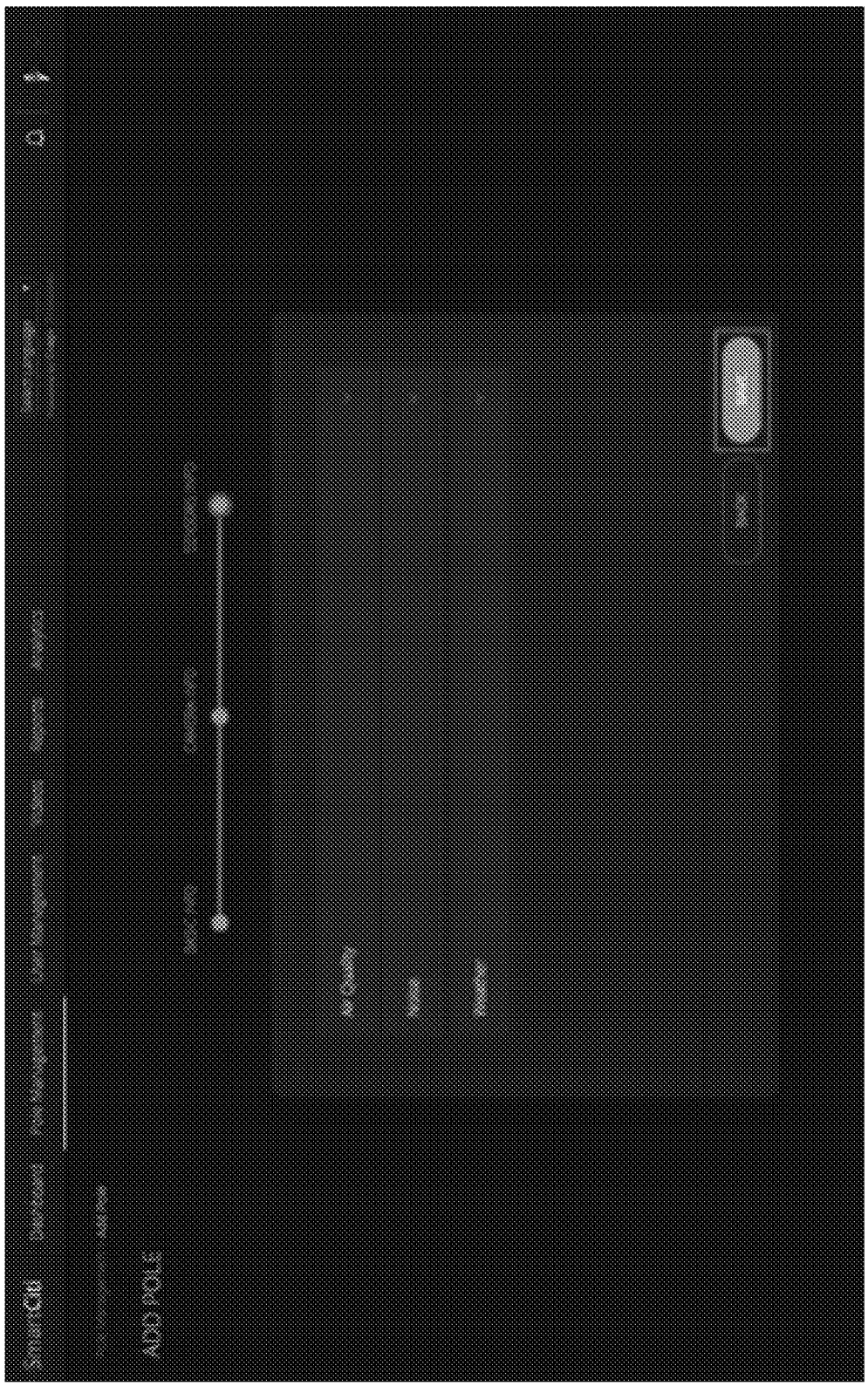
Figure 51:
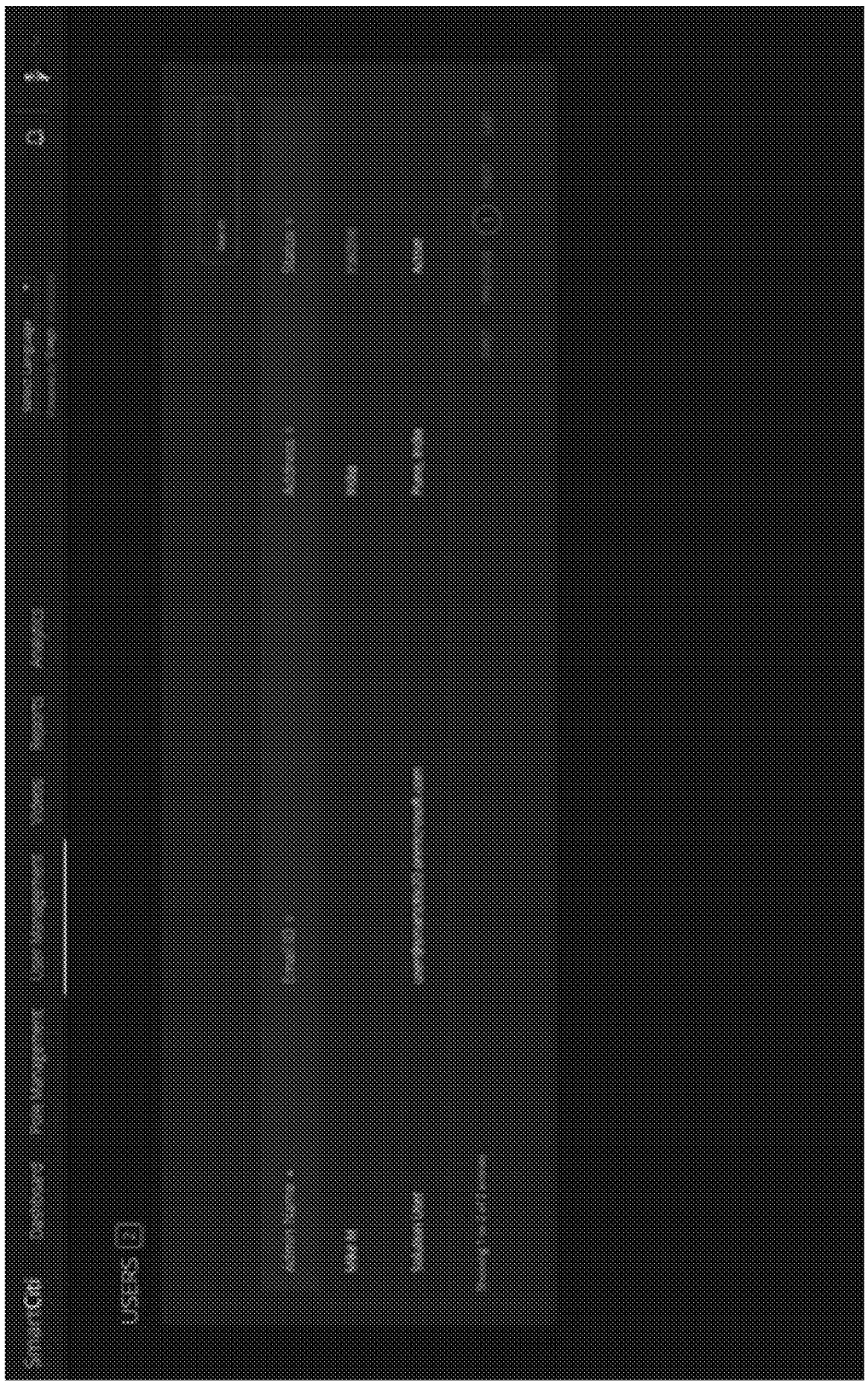
Figure 52:
Figure 53:
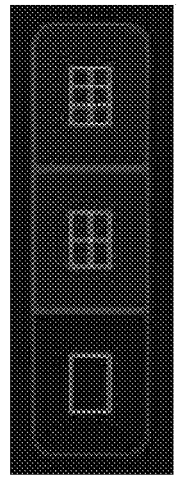
Figure 54:
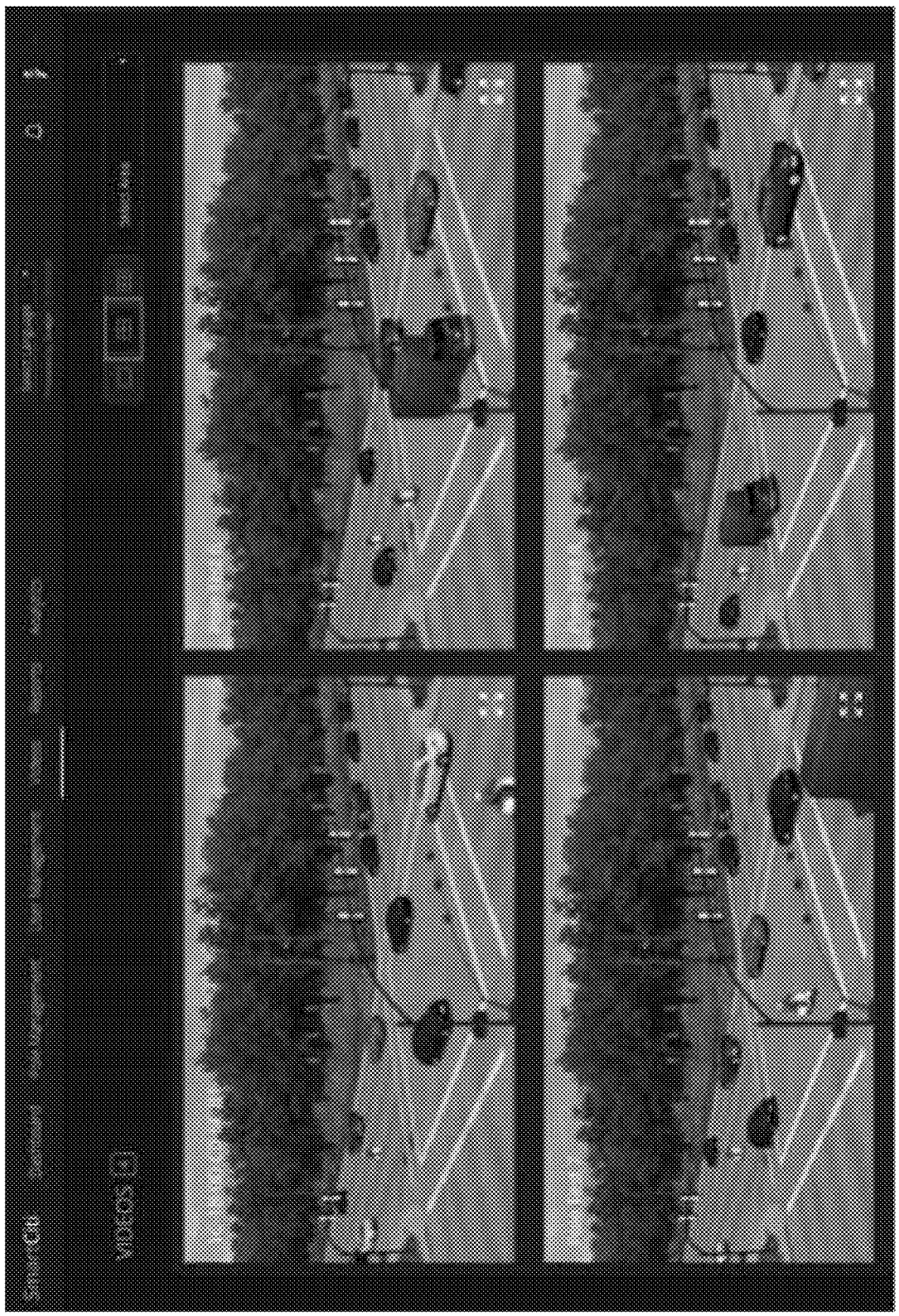
Figure 55:
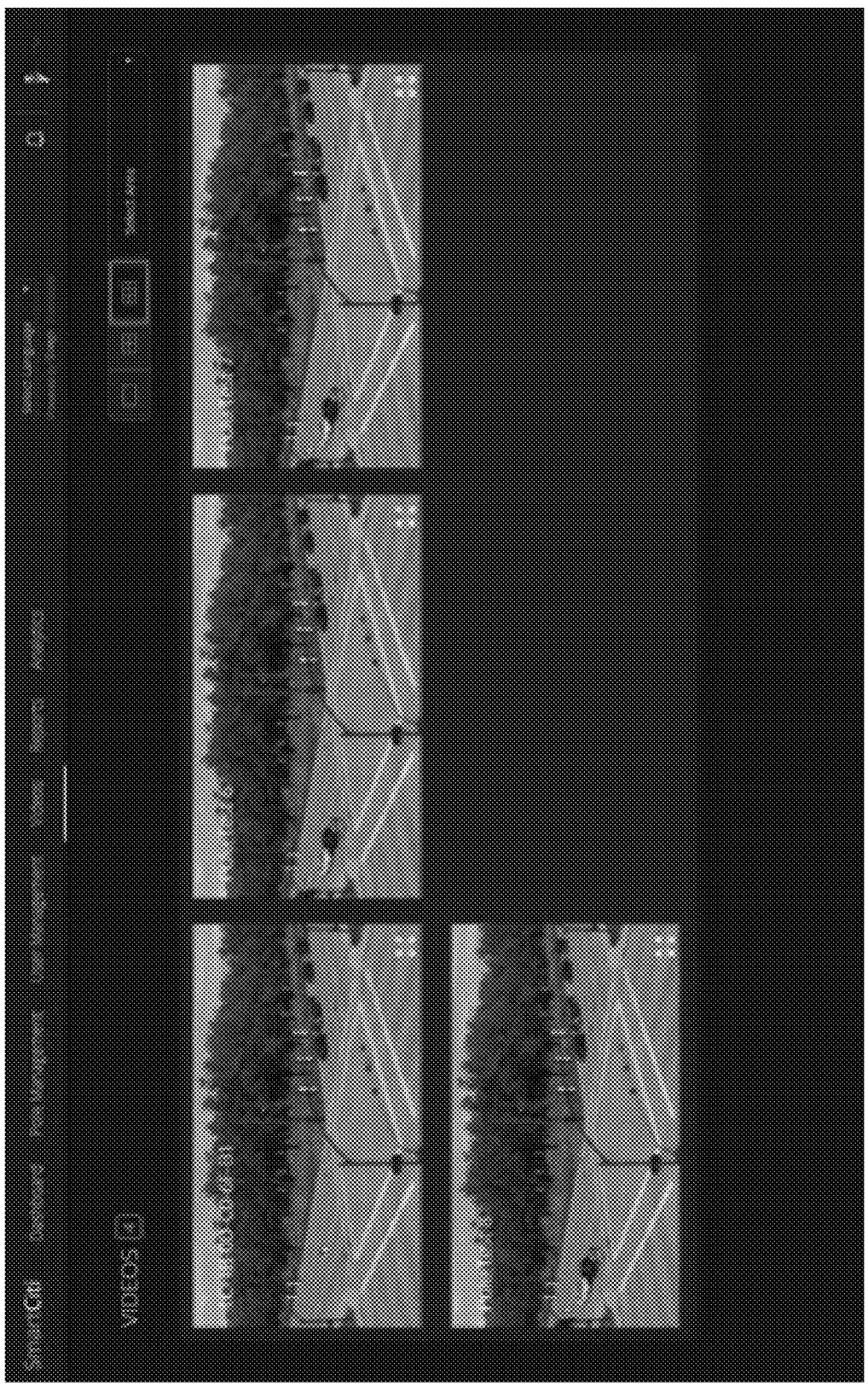
Figure 56:
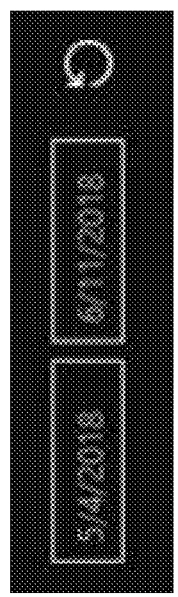
Figure 57:
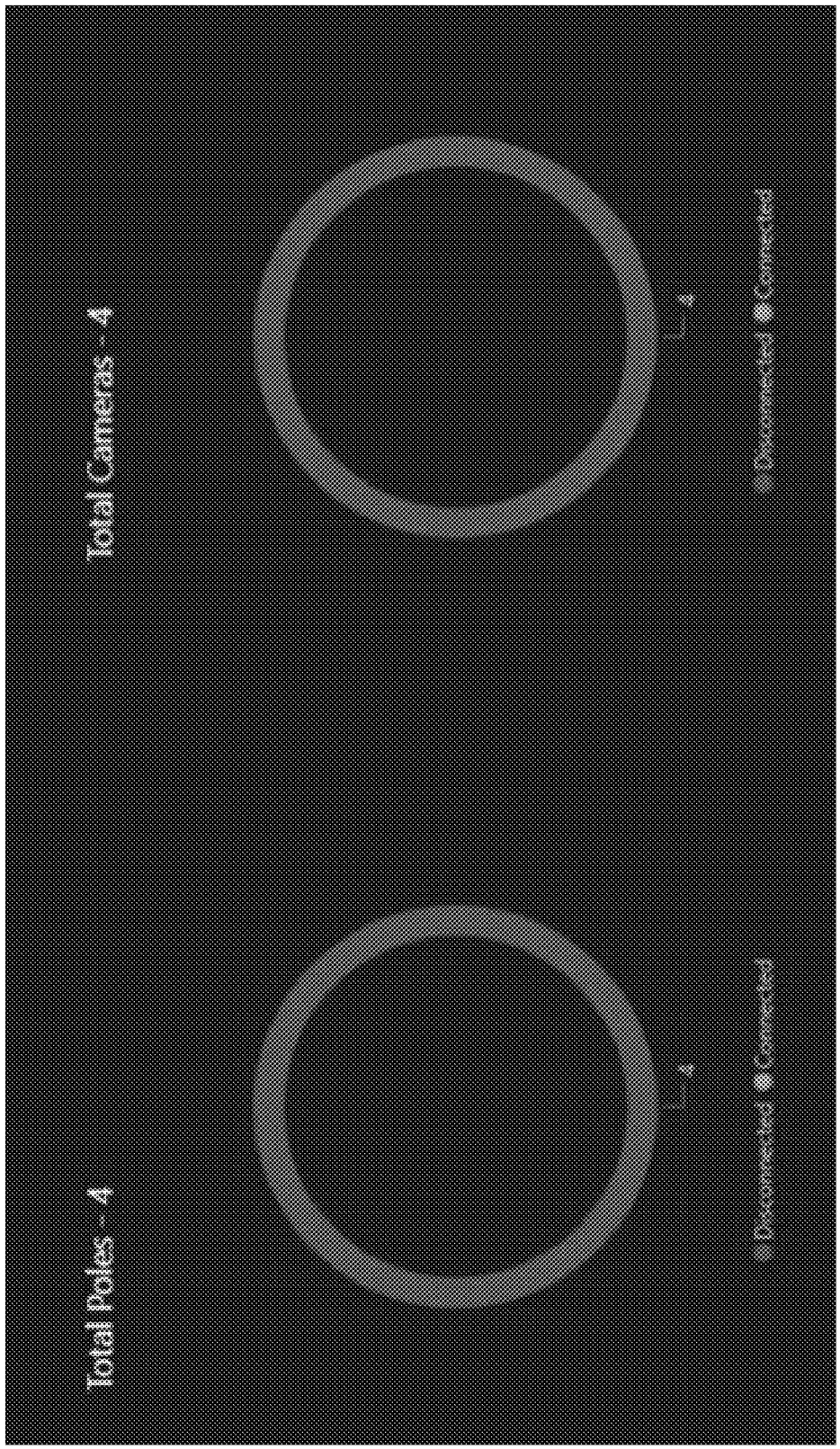
Figure 58:
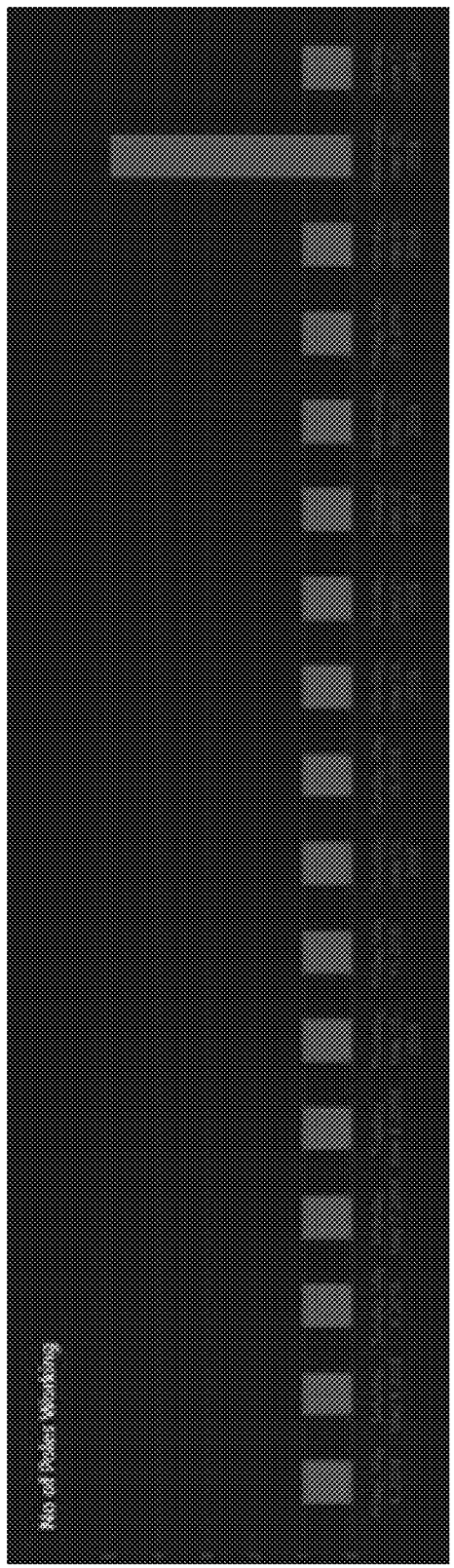
Figure 59:
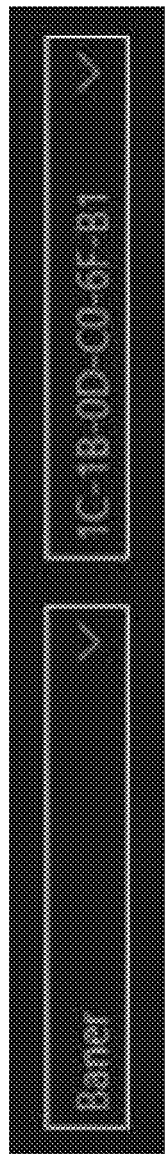
Figure 60:
Figure 61:
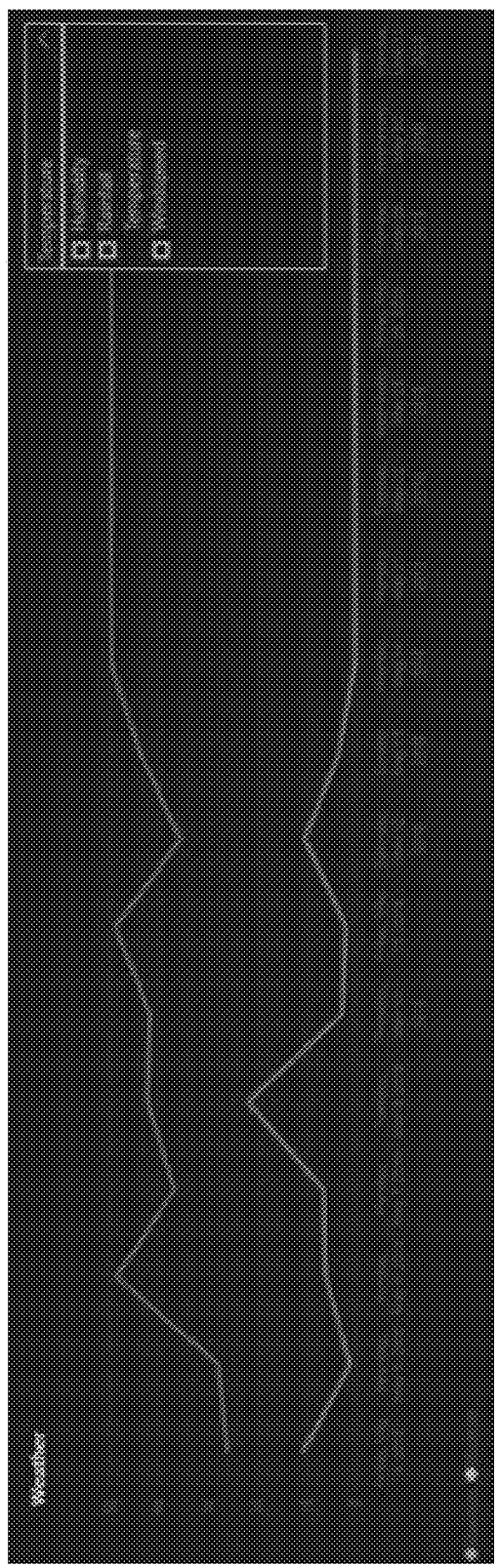
Figure 62:
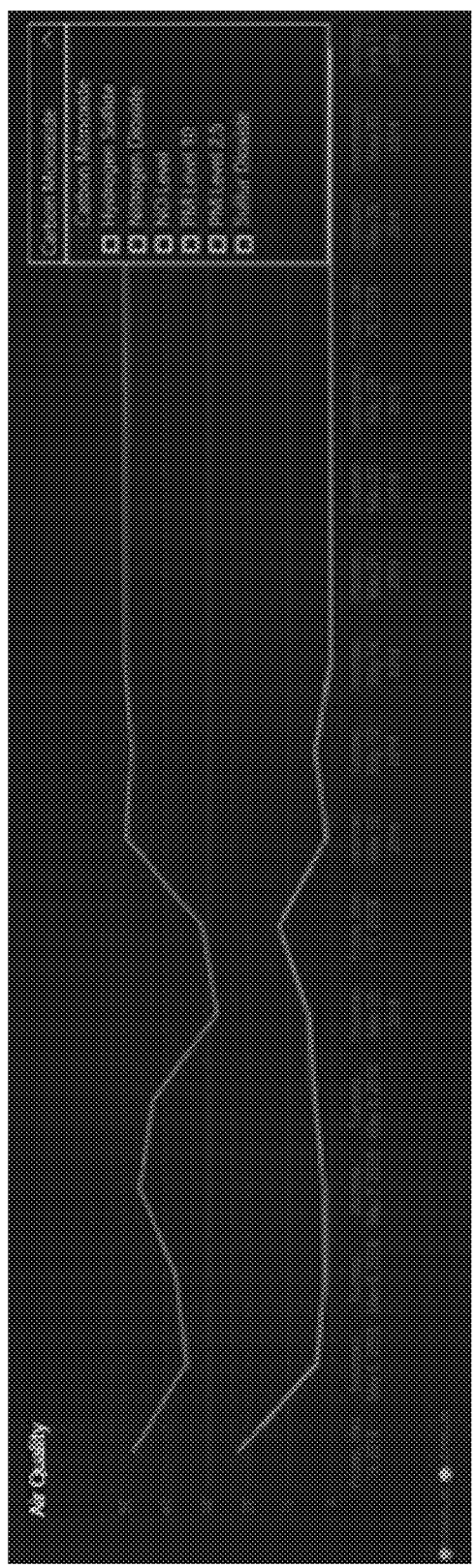
Figure 63:
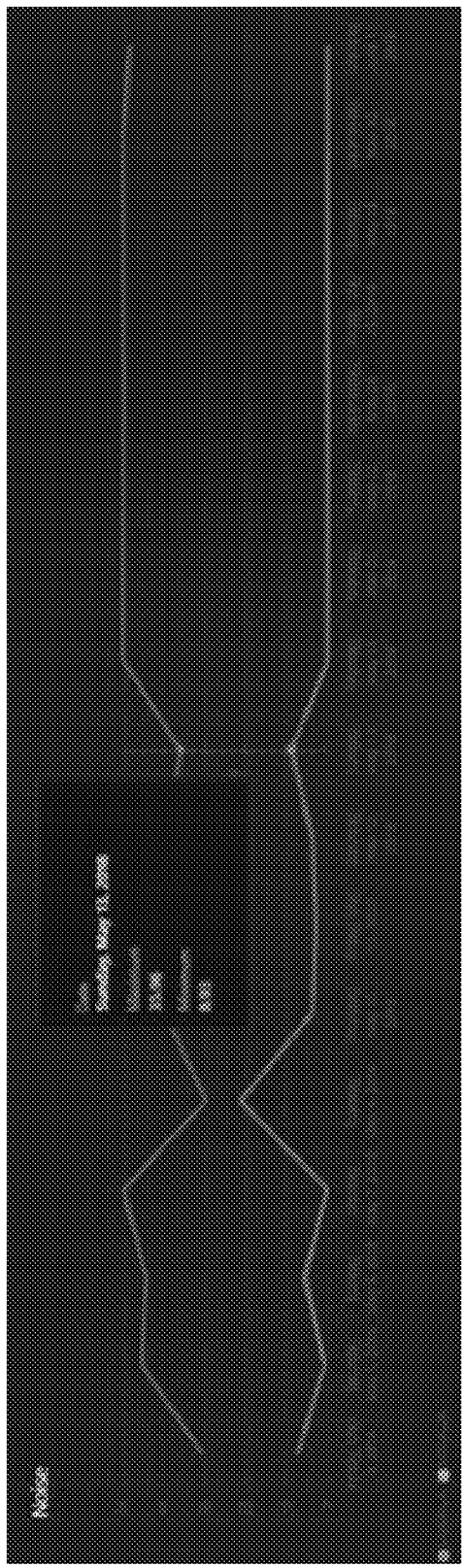
Figure 64:
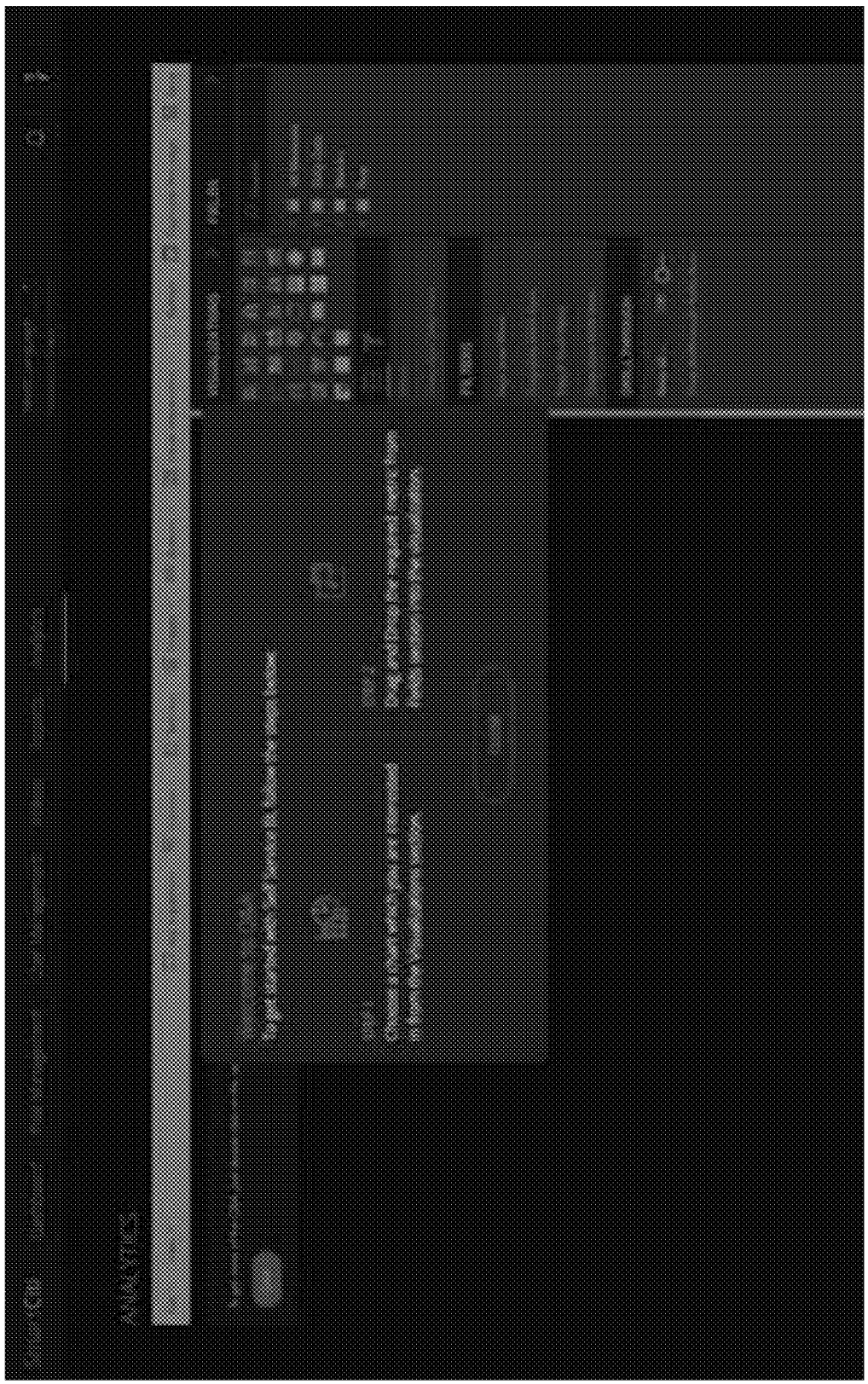
Figure 65:
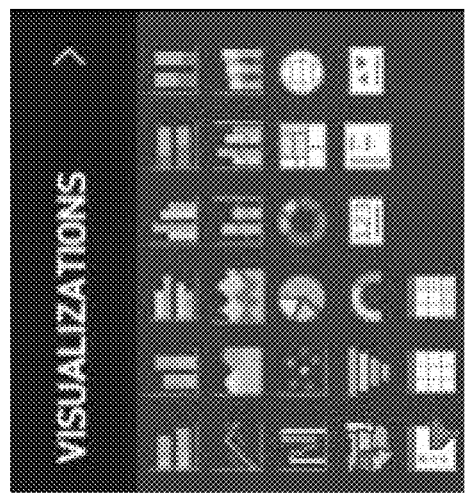
Figure 66:
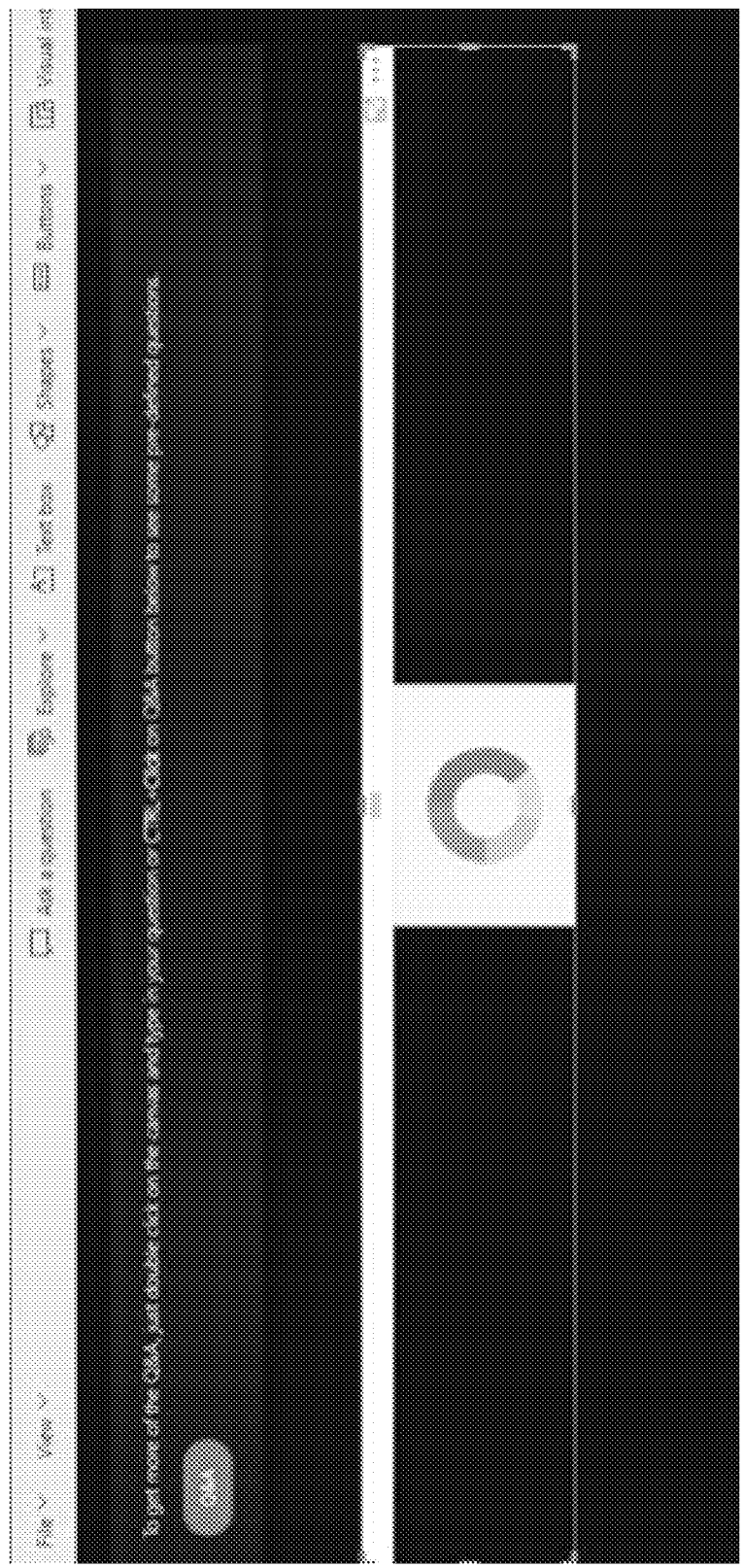
Figure 67:
Figure 68:
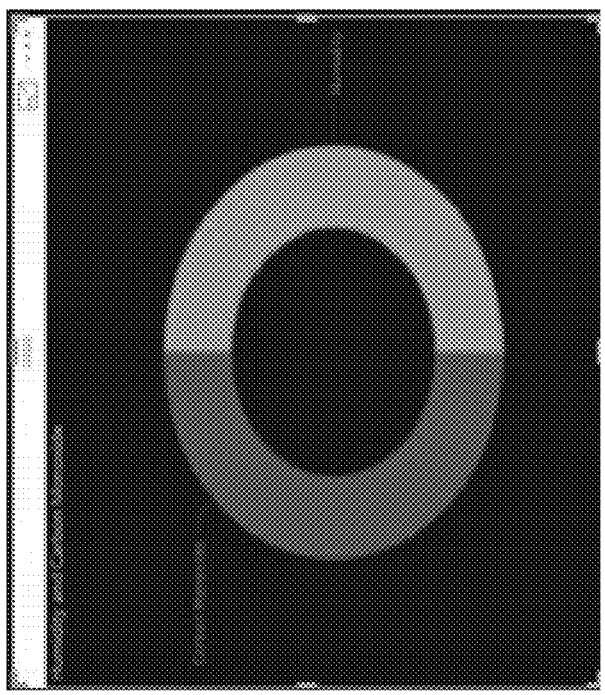
Figure 69:
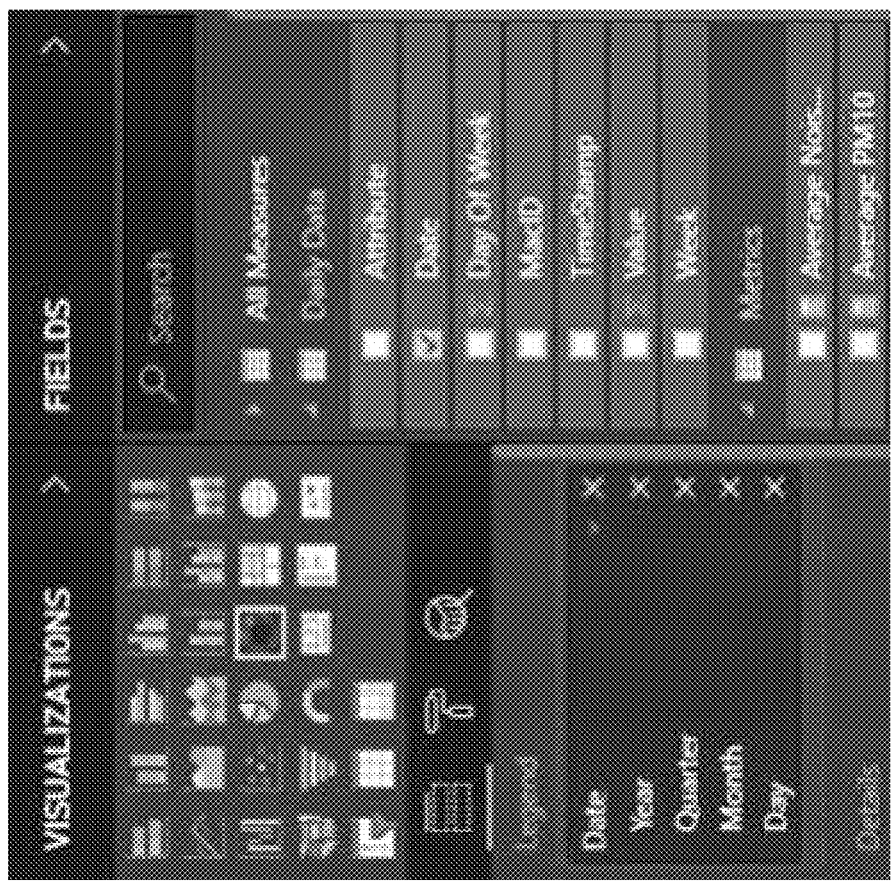
Figure 70:
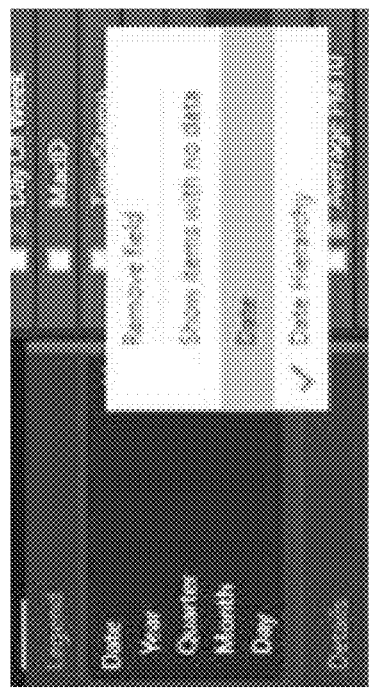
Figure 71:
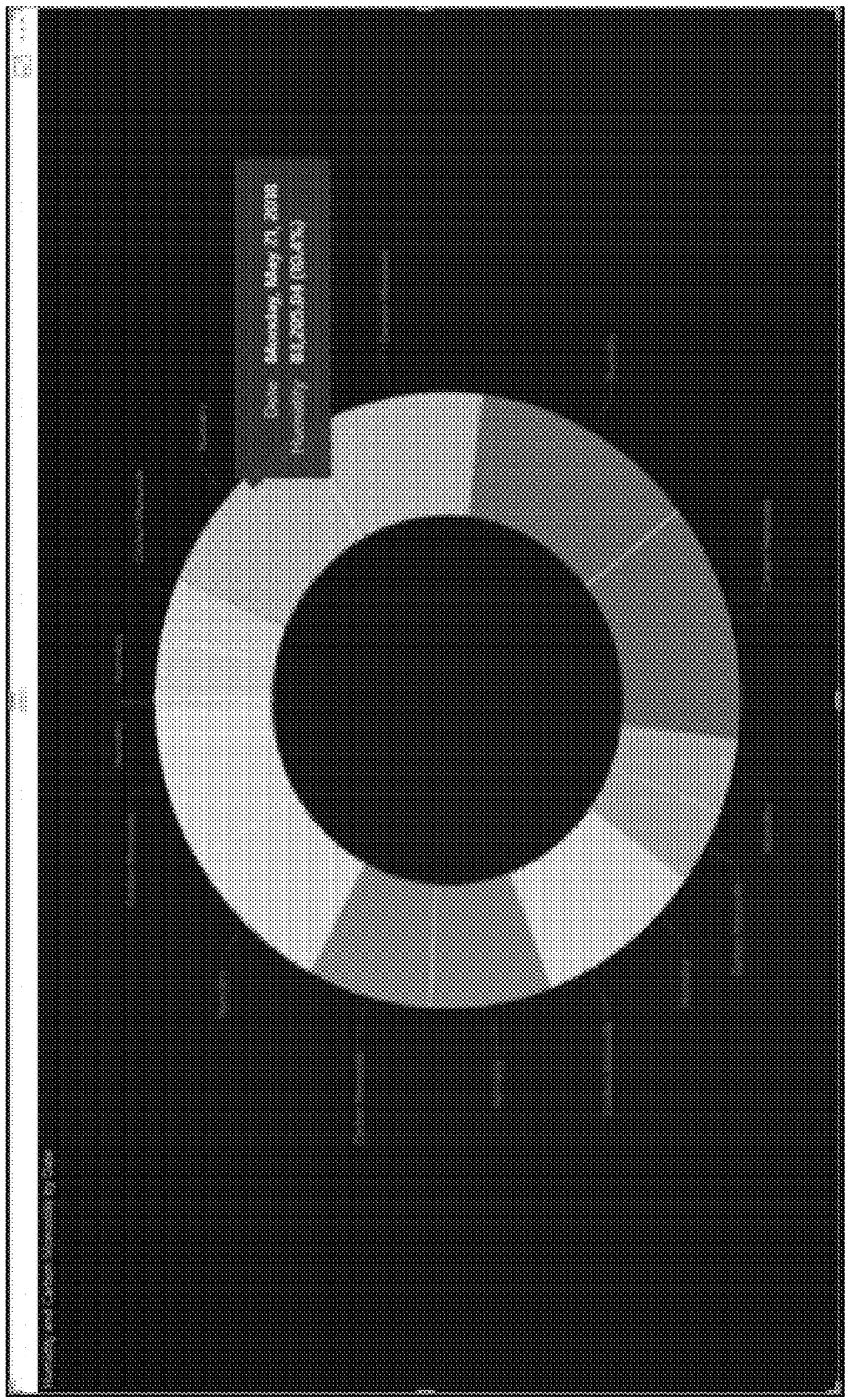
Figure 72:
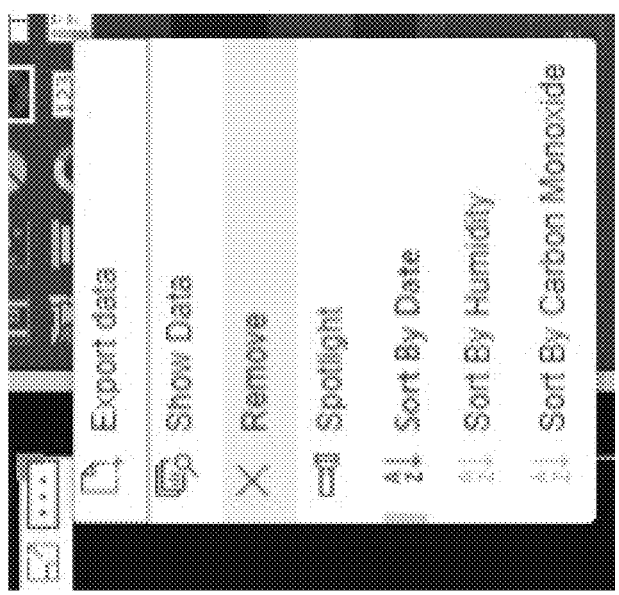
Figure 73:
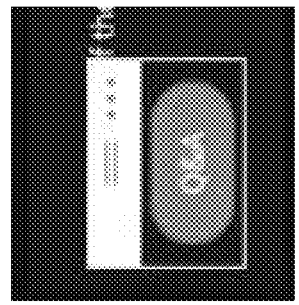
Figure 74:
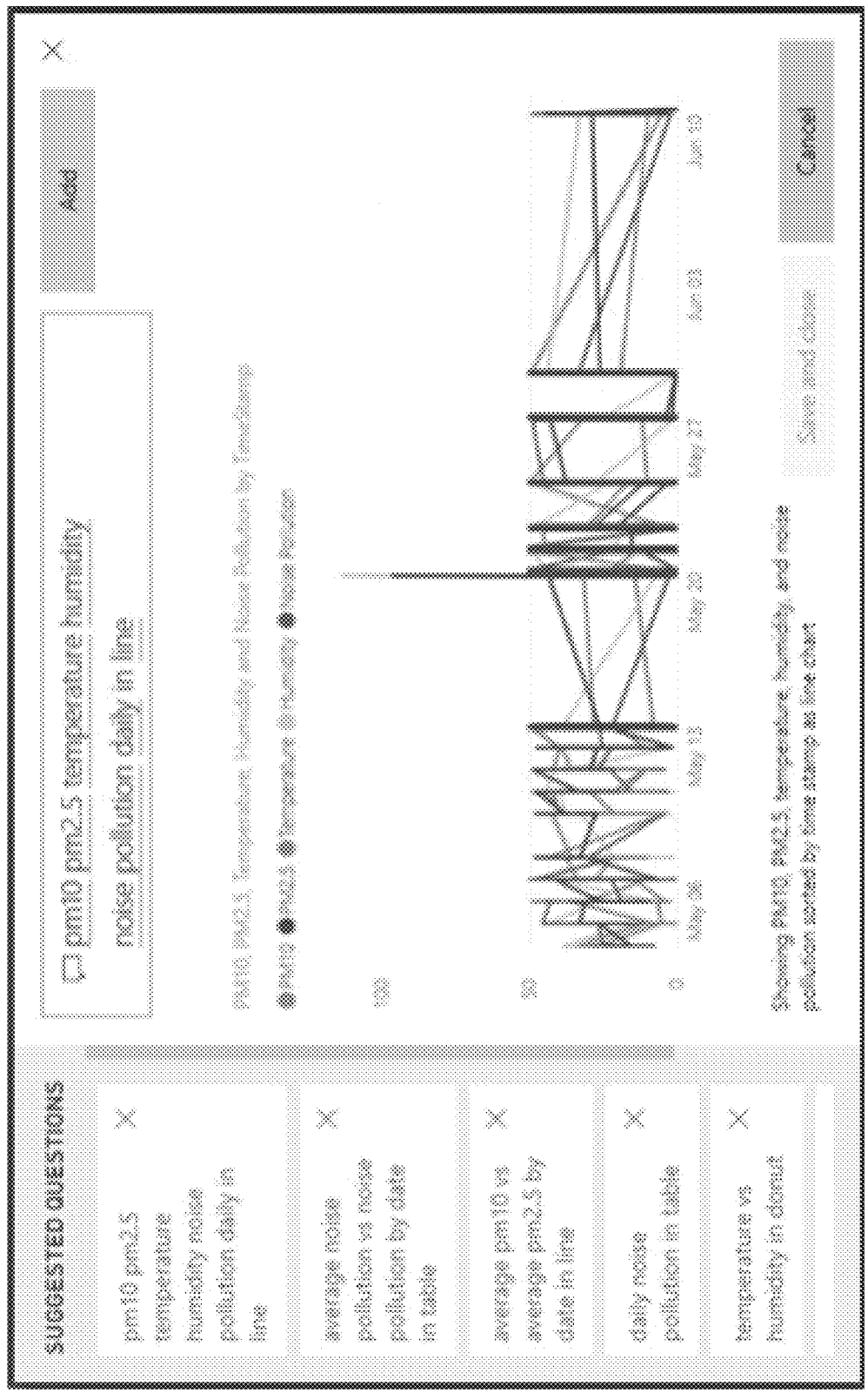
Figure 75:
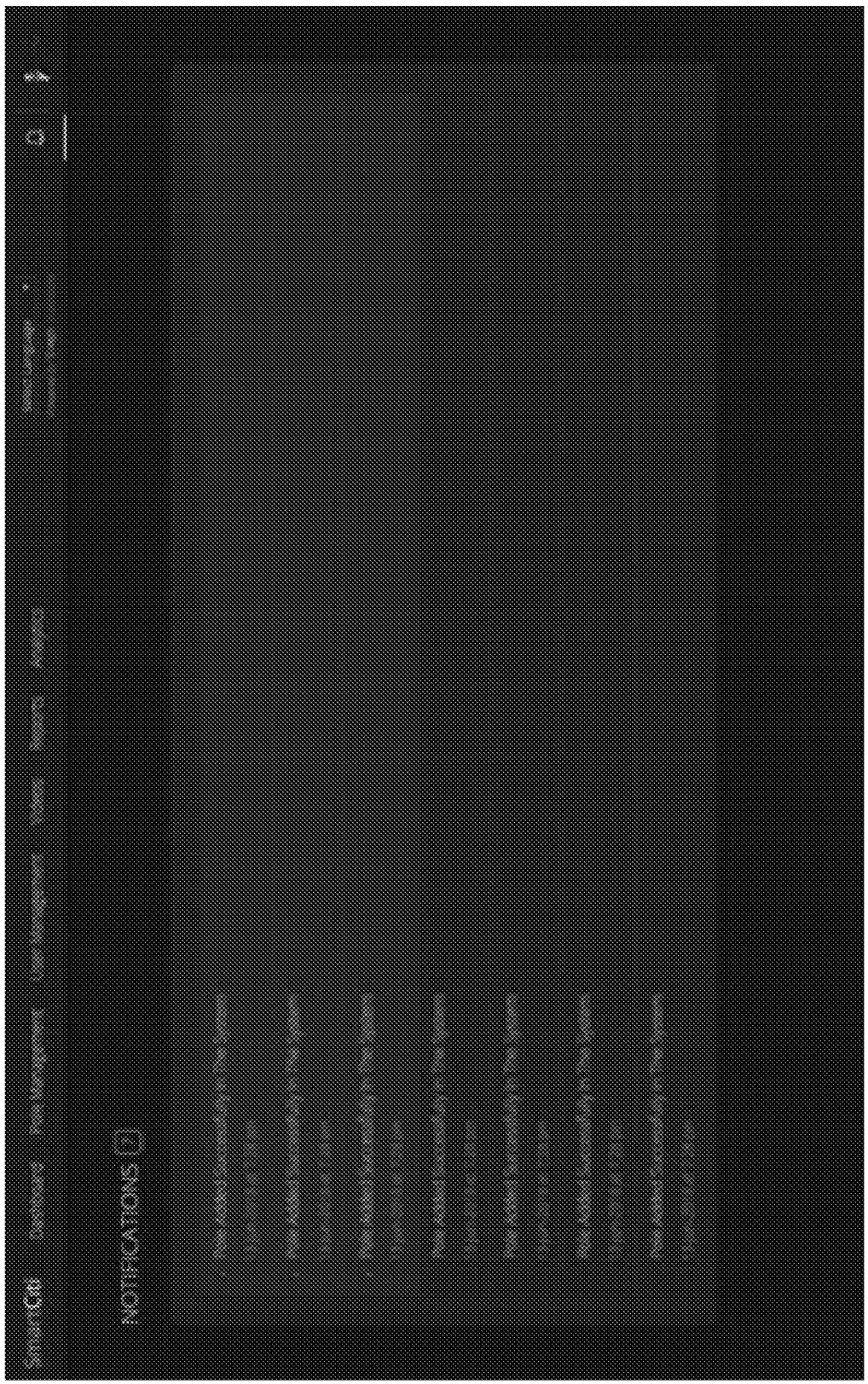
Figure 76:
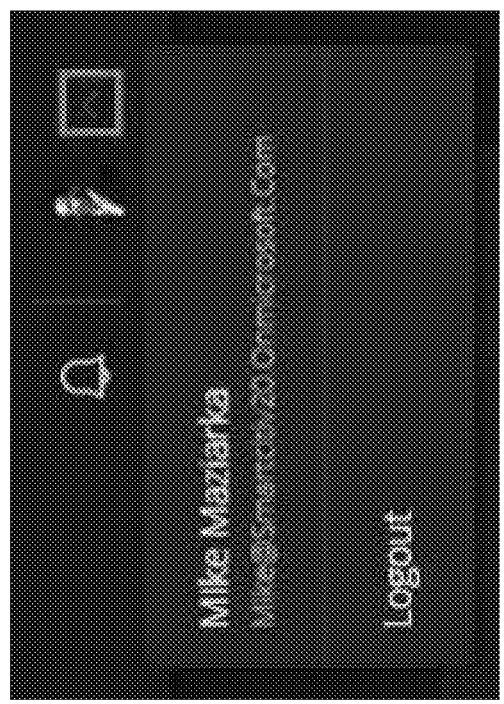

In at least one embodiment, the computing device 1302 may implement a process 1600 shown in FIG. 16. For example, a user may log in/register in step 1602. An example log-in process is shown in FIGS. 17 and 18. Once authenticated, a user may view a dashboard and multiple views, step 1604. In step 1606, a user can perform various operations, such as adding a pole, viewing pole status, viewing videos, or the like. Example views, including pole management and pole status, and other options are shown in FIGS. 19-75. A user may log out of the system, step 1608, in FIG. 76.

In some embodiments, a dashboard may show collective information of all poles within the system. For example, the poles may be mapped on a graphical map with latitude and longitude obtained from GPS sensors. In some embodiments, poles may be distinguished by different colors, such as red or yellow, based on their connection status, such as connected or disconnected, respectively. A side-panel may be provided that may show a tenant's city, country, and some basic information of the overall number of poles, environment, cameras connected to each pole and outside data source. By toggling a traffic button, the button may enable traffic data to be shown on a map. Information of public services, ambulance and police stations, or the like, that are considered available nearby may be fetched. Each pole may contain its own information. By hovering on any pole, such as with a mouse, a Pole's name and its status may be shown, such as connected or disconnected.

In some embodiments, by selecting a pole via the interface, data may be shown pertaining to the pole in a side-panel. Particular data may include basic information, weather, air quality, noise, camera data, or the like. In some embodiments, a Pole ID may be assigned to a pole.

Additional Considerations

As will be appreciated based upon the foregoing specification, the above-described embodiments of the disclosure may be implemented using computer programming or engineering techniques including computer software, firmware, hardware or any combination or subset thereof. Any such resulting program, having computer-readable code means, may be embodied or provided within one or more computer-readable media, thereby making a computer program product, i.e., an article of manufacture, according to the discussed embodiments of the disclosure. The computer-readable media may be, for example, but is not limited to, a fixed (hard) drive, diskette, optical disk, magnetic tape, semiconductor memory such as read-only memory (ROM), and/or any transmitting/receiving medium such as the Internet or other communication network or link. The article of manufacture containing the computer code may be made and/or used by executing the code directly from one medium, by copying the code from one medium to another medium, or by transmitting the code over a network.

These computer programs (also known as programs, software, software applications, "apps," or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The "machine-readable medium" and "computer-readable medium," however, do not include transitory signals. The term "machine-readable signal" refers to any signal used to provide machine instructions and/or data to a programmable processor.

As used herein, a processor may include any programmable system including systems using micro-controllers, reduced instruction set circuits (RISC), application specific integrated circuits (ASICs), logic circuits, and any other circuit or processor capable of executing the functions described herein. The above examples are example only, and are thus not intended to limit in any way the definition and/or meaning of the term "processor."

As used herein, the terms "software" and "firmware" are interchangeable, and include any computer program stored in memory for execution by a processor, including RAM memory, ROM memory, EPROM memory, EEPROM memory, and non-volatile RAM (NVRAM) memory. The above memory types are example only, and are thus not limiting as to the types of memory usable for storage of a computer program.

In one embodiment, a computer program is provided, and the program is embodied on a computer readable medium. In an exemplary embodiment, the system is executed on a single computer system, without requiring a connection to a sever computer. In a further embodiment, the system is being run in a Windows® environment (Windows is a registered trademark of Microsoft Corporation, Redmond, Washington). In yet another embodiment, the system is run on a mainframe environment and a UNIX® server environment (UNIX is a registered trademark of X/Open Company Limited located in Reading, Berkshire, United Kingdom). The application is flexible and designed to run in various different environments without compromising any major functionality.

In some embodiments, the system includes multiple components distributed among a plurality of computing devices. One or more components may be in the form of computer-executable instructions embodied in a computer-readable medium. The systems and processes are not limited to the specific embodiments described herein. In addition, components of each system and each process can be practiced independent and separate from other components and processes described herein. Each component and process can also be used in combination with other assembly packages and processes.

As used herein, an element or step recited in the singular and preceded by the word "a" or "an" should be understood as not excluding plural elements or steps, unless such exclusion is explicitly recited. Furthermore, references to "example embodiment" or "one embodiment" of the present disclosure are not intended to be interpreted as excluding the existence of additional embodiments that also incorporate the recited features.

The patent claims at the end of this document are not intended to be construed under 35 U.S.C. § 112(f) unless traditional means-plus-function language is expressly recited, such as "means for" or "step for" language being expressly recited in the claim(s).

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system for providing an analytics and operations on data collected from a plurality of smart poles, each of the smart poles comprising:
    a support post;
    a tubular housing;
    an upper capsule covering said tubular housing;
    a lower shroud configured on said support post and upholding said tubular housing; and
    wireless communication equipment configured within said tubular housing, such that said wireless communication equipment is concealed within said tubular housing while permitting unfettered transmission of radio signals out of said tubular housing by said wireless communication equipment, the system comprising:

a database configured to collect data;

a computing device comprising a processor and a memory configured with said wireless communication equipment within said tubular housing of at least one of the plurality of the smart poles, the processor of the computing device is configured to run software stored on the memory of the computing device, and to thereby send a series of sensor readings to the database;

a server configured to fetch from the database at least some of the series of the sensor readings sent by the computing device; and a web portal configured to display one or more pieces of analysis performed on the fetched of the sensor readings and video streams from one or more cameras associated with the plurality of the smart poles.

2. The system of claim 1, wherein the at least one of the plurality of the smart poles further comprises:

one or more environment sensors configured to collect the series of sensor readings in a certain area surrounding the at least one of the plurality of the smart poles.

3. The system of claim 1, wherein the web portal is configured to:

receive data associate with one or more pieces of the sensor readings;

generate a plurality of reports or deduced analytics based on the received data; and display one or more of the generated reports or deduced analytics to an administrator via a screen.

4. The system of claim 1, wherein the web portal provides one or more features including adding, editing, or whitelisting the smart pole.

5. The system of claim 1, wherein the web portal is further configured to simultaneously display video streams received from one or more cameras associated with the plurality of the smart poles.

* * * * *